(12) United States Patent
Kuroe et al.

(10) Patent No.: US 7,145,331 B2
(45) Date of Patent: Dec. 5, 2006

(54) MAGNETIC SENSOR HAVING A CLOSED MAGNETIC PATH FORMED BY SOFT MAGNETIC FILMS

(75) Inventors: Akio Kuroe, Katano (JP); Sayuri Muramatsu, Hirakata (JP); Akio Murata, Nara (JP); Ken Takahashi, Osaka (JP); Yoshihiro Tosaki, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 73 days.

(21) Appl. No.: 10/478,136

(22) PCT Filed: Jul. 15, 2002

(86) PCT No.: PCT/JP02/07188

§ 371 (c)(1),
(2), (4) Date: Nov. 20, 2003

(87) PCT Pub. No.: WO03/009403

PCT Pub. Date: Jan. 30, 2003

(65) Prior Publication Data

US 2004/0150397 A1 Aug. 5, 2004

(30) Foreign Application Priority Data

Jul. 19, 2001 (JP) ............................. 2001-220391

(51) Int. Cl.
*G01R 33/02* (2006.01)
(52) U.S. Cl. ..................................... 324/249; 324/244

(58) Field of Classification Search ................ 324/249, 324/260, 244, 252; 360/113, 110
See application file for complete search history.

(56) References Cited

U.S. PATENT DOCUMENTS 4,024,489 A * 5/1977 Bajorek et al. ........... 338/32 R (Continued)

FOREIGN PATENT DOCUMENTS

EP 0-831 335 A2 3/1998

(Continued)

OTHER PUBLICATIONS

Takeshi Morikawa et al., "Enhancement of Giant Magneto-Impedance in Layered Film by Insulator Separation", *IEEE Transactions on Magnetics*, vol. 32, No. 5, pp. 4965-4967, (1996).

*Primary Examiner*—Reena Aurora
(74) *Attorney, Agent, or Firm*—Akin Gump Strauss Hauer & Feld, LLP

(57) ABSTRACT

In order to obtain a magneto-impedance type magnetic sensor having a soft magnetic film facing to a conductive nonmagnetic film, and available a large impedance change with a carrier signal at a relatively low frequency, the magnetic sensor comprises a meander type conductive nonmagnetic thin film of zigzag shape formed with at least one pair of electrode terminals at both ends and a soft magnetic film which is strip-shaped so as to face thereto at a plurality of regions and has an easy axis of magnetization in a width direction of the strip shape, a high frequency carrier signal is applied to the above-mentioned electrode terminals and further a direct current bias magnetic field is applied. By performing AM detection of an AM modulation signal output from the above-mentioned electrode terminals, an impedance change of the conductive nonmagnetic film which is changed by external magnetic field is detected as a change of the high frequency carrier signal, thereby the external magnetic field can be detected.

6 Claims, 43 Drawing Sheets

U.S. PATENT DOCUMENTS

| | | | |
|---|---|---|---|
| 4,751,598 A * | 6/1988 | Hamilton | 360/110 |
| 5,889,403 A | 3/1999 | Kawase | 324/249 |
| 6,462,541 B1 * | 10/2002 | Wang et al. | 324/252 |
| 6,538,843 B1 * | 3/2003 | Kuroe et al. | 360/110 |

FOREIGN PATENT DOCUMENTS

| | | |
|---|---|---|
| JP | 8-285930 A | 11/1996 |
| JP | 08285930 A | 11/1996 |
| JP | 08330644 A | 12/1996 |
| JP | 9-320020 A | 12/1997 |
| JP | 10-90382 A | 4/1998 |
| JP | 2000-19034 A | 1/2000 |
| JP | 2000-193728 A | 7/2000 |
| JP | 2001-155310 A | 6/2001 |
| JP | 2001-332779 A | 11/2001 |
| JP | 2002-57379 A | 2/2002 |

* cited by examiner

FIG. 3
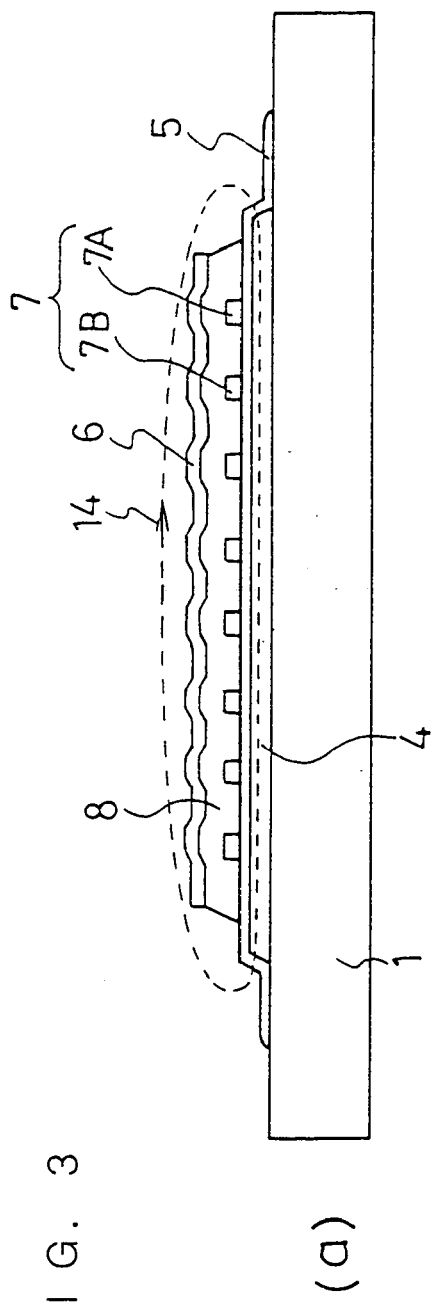
(a)
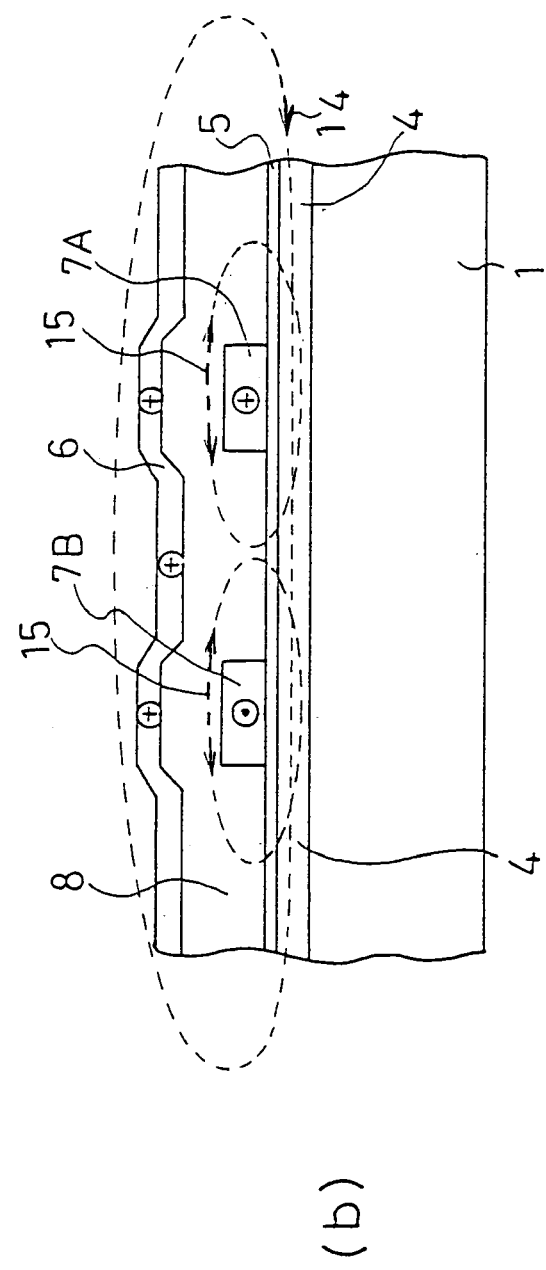
(b)

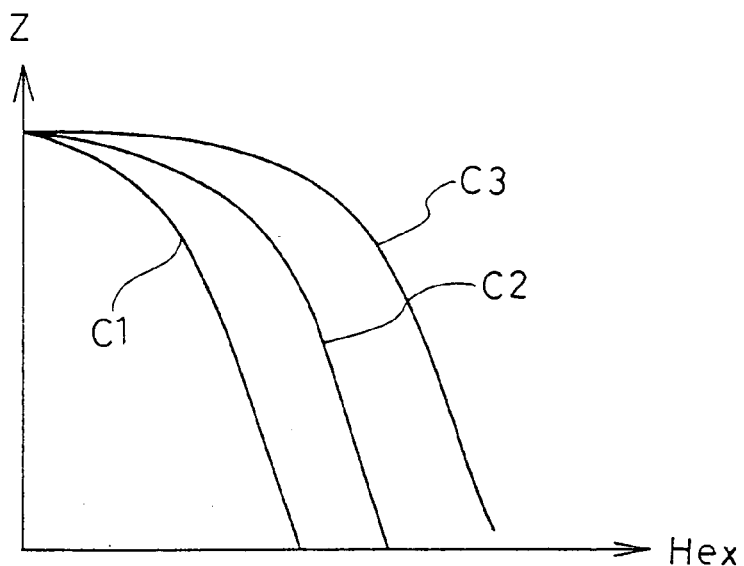
F I G. 1 2

FIG. 14
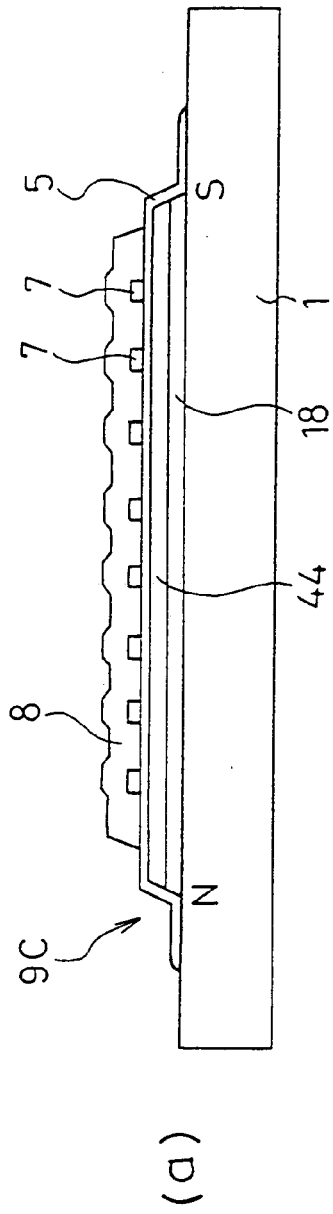
(a)
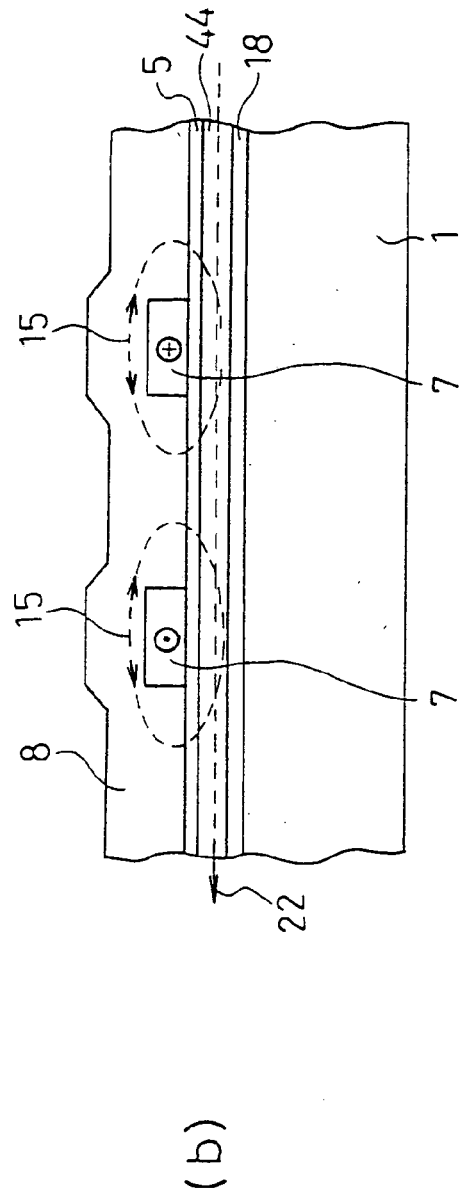
(b)

FIG. 15
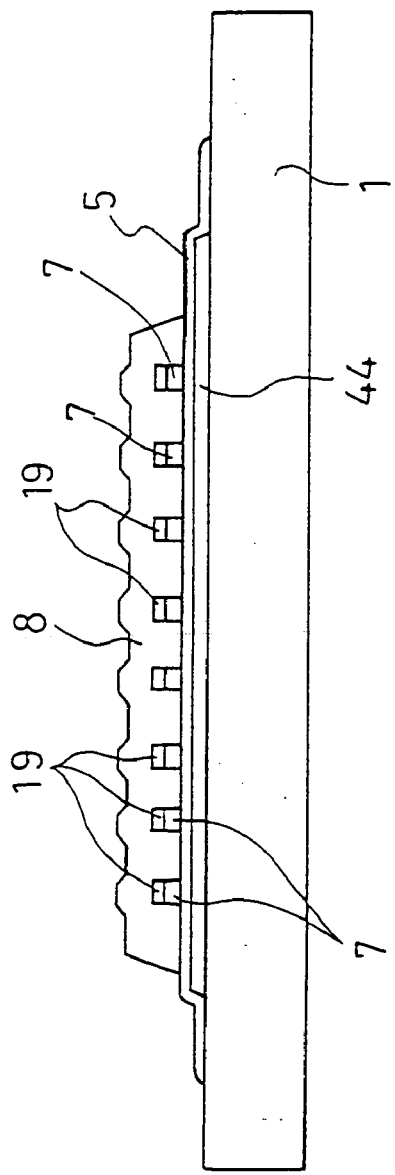
(a)
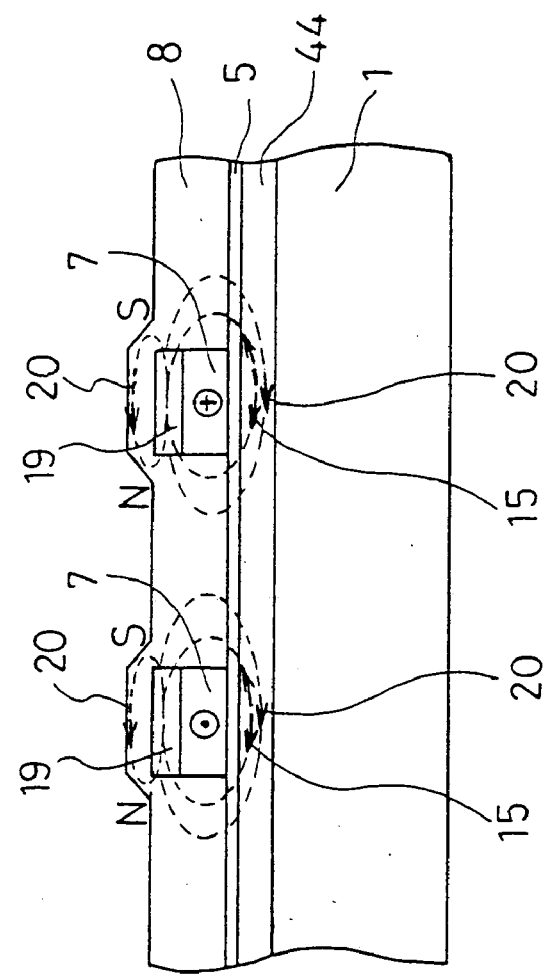
(b)

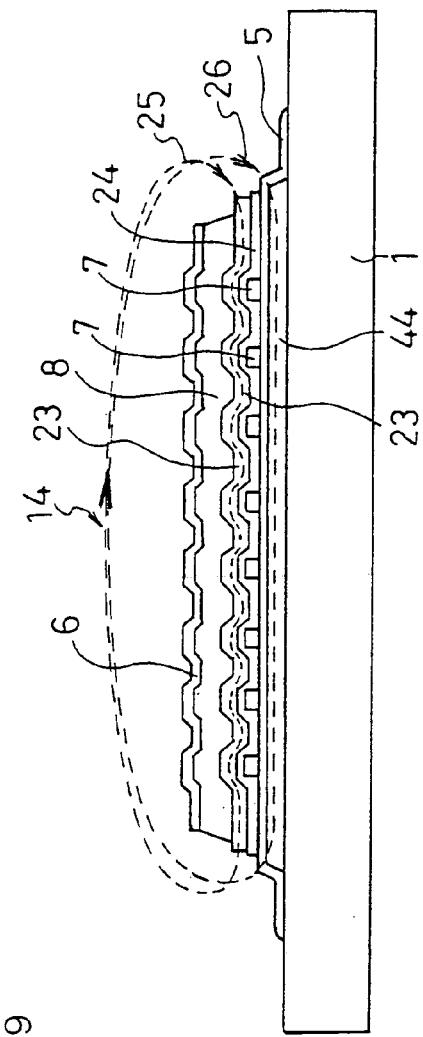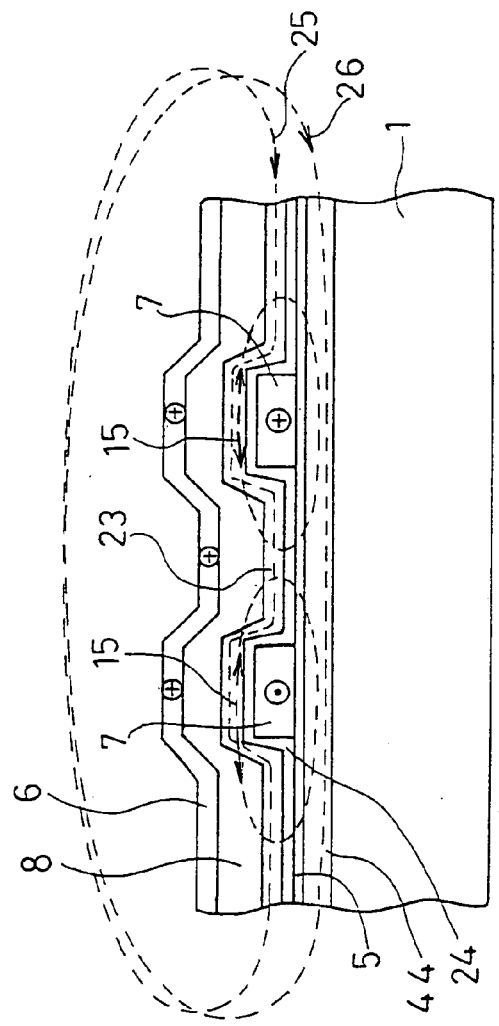
FIG. 19
(a)
(b)

FIG. 35
(a)
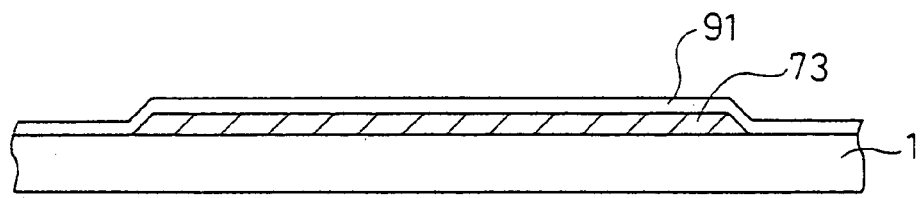
(b)
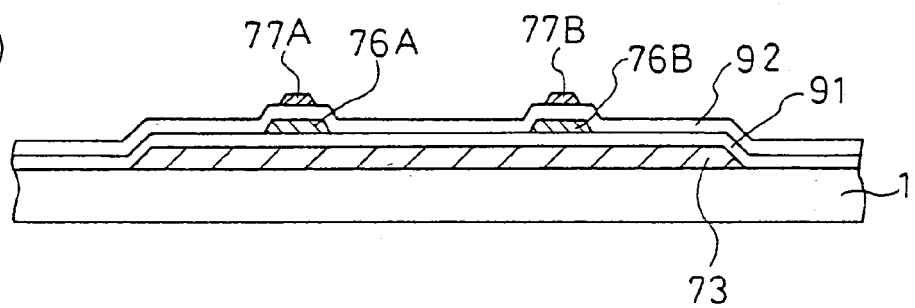
(c)
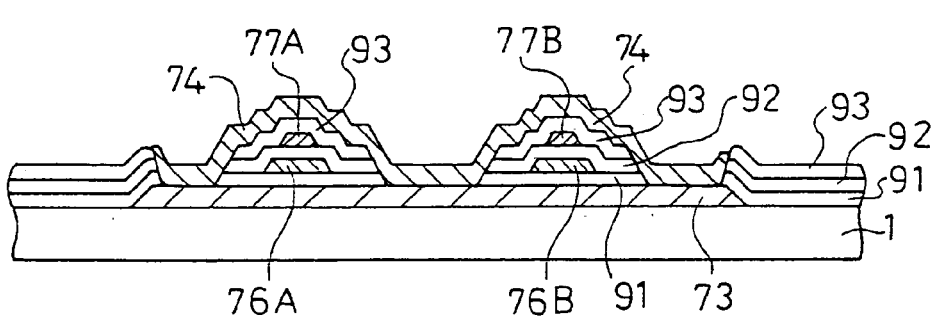
(d)
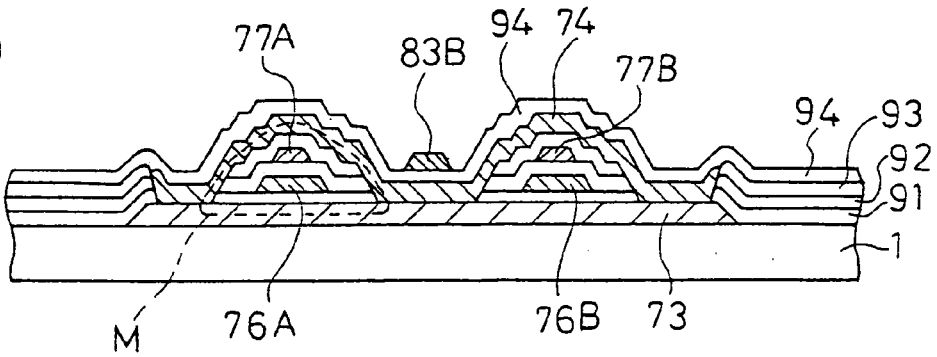

FIG. 36
(a)
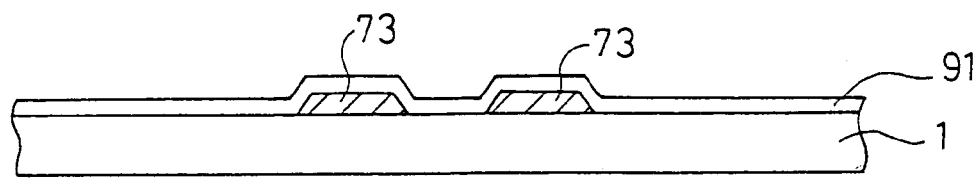
(b)
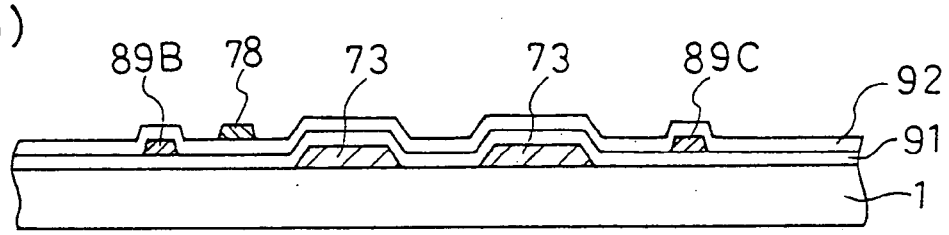
(c)
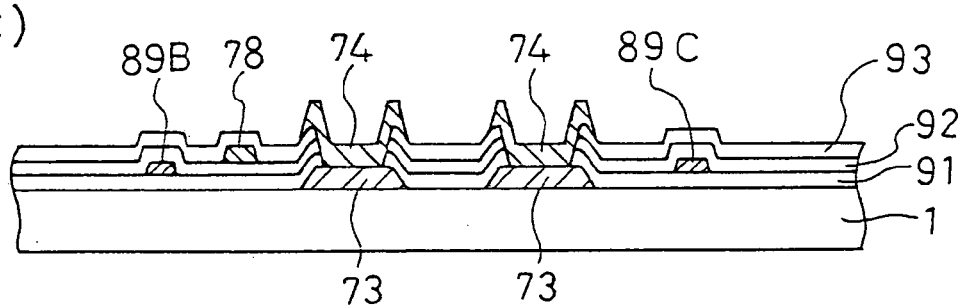
(d)
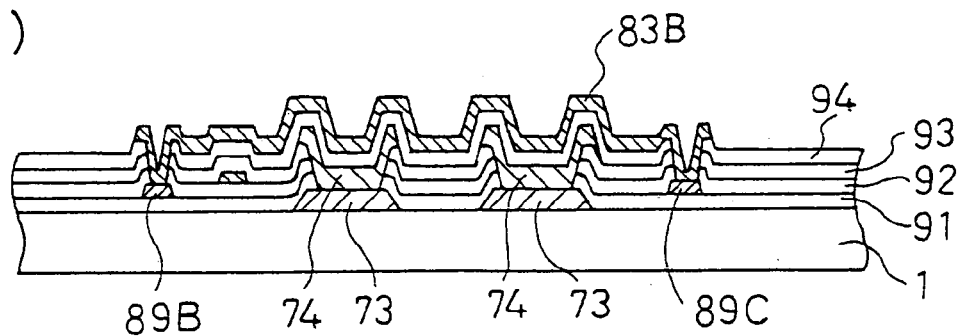

FIG. 39
(a) 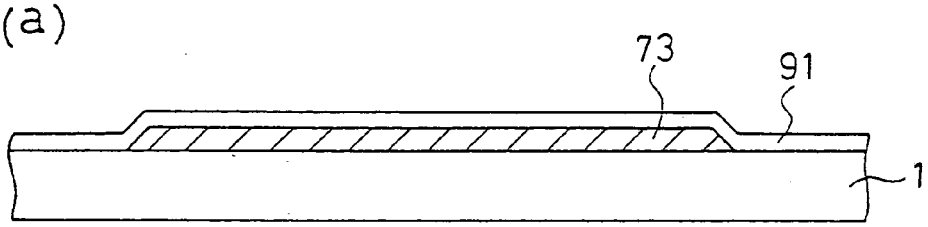
(b) 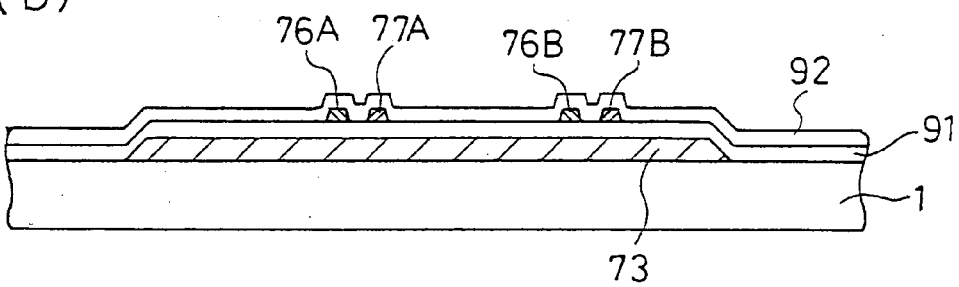
(c) 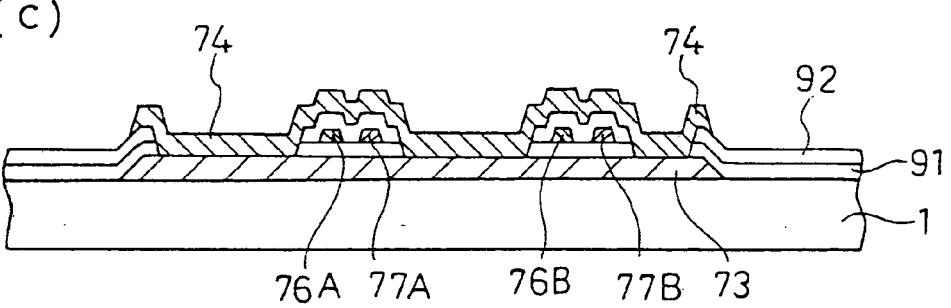
(d) 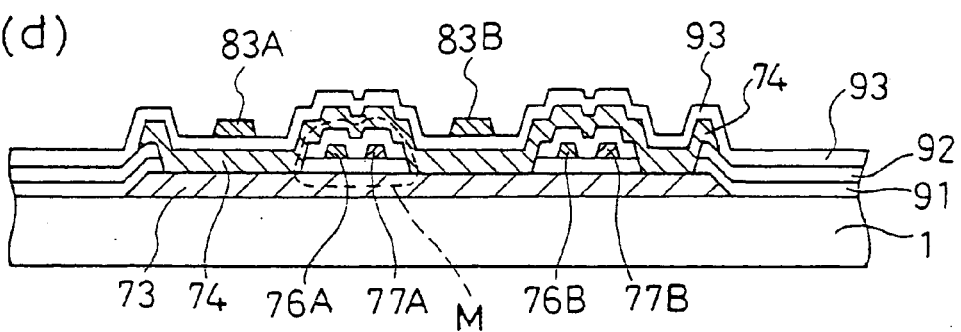

FIG. 40
(a) 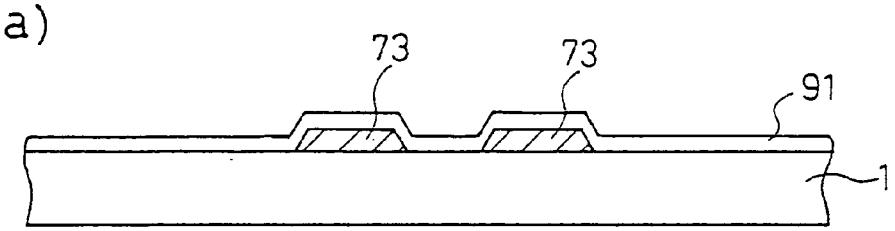
(b) 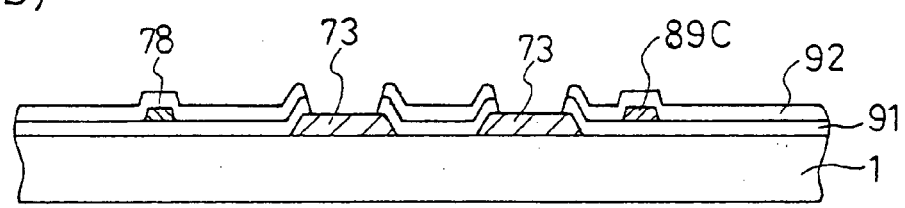
(c) 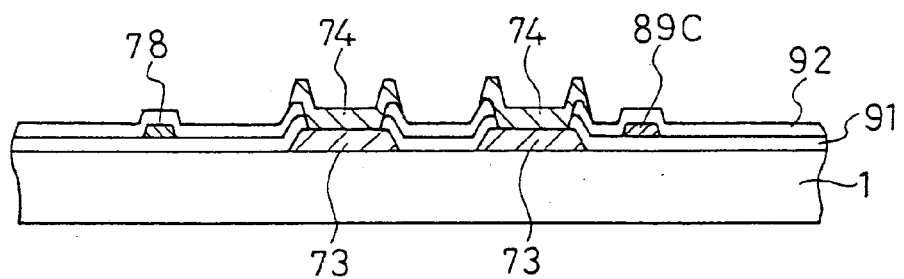
(d) 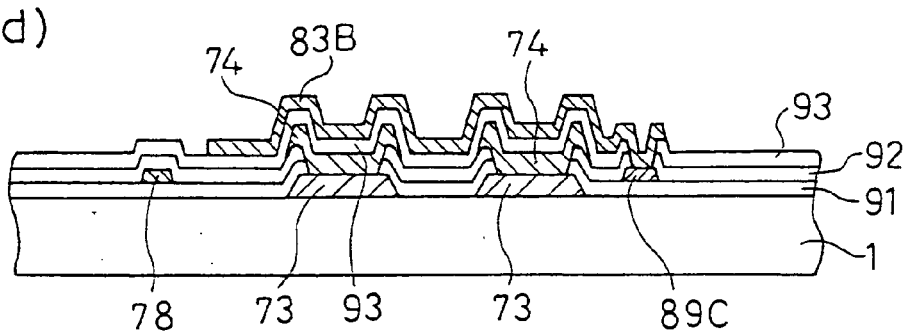

FIG. 41
(a)
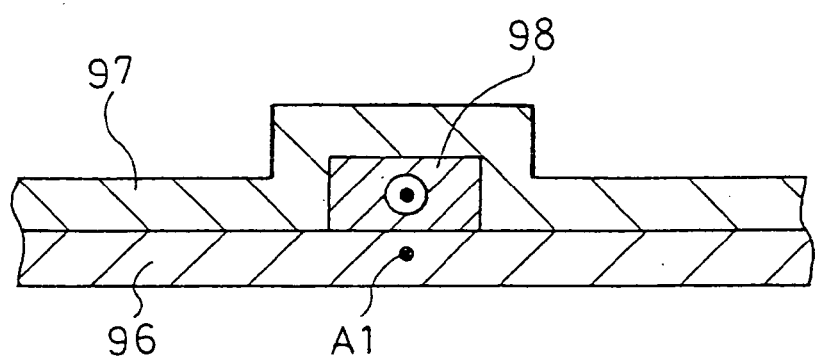
(b)
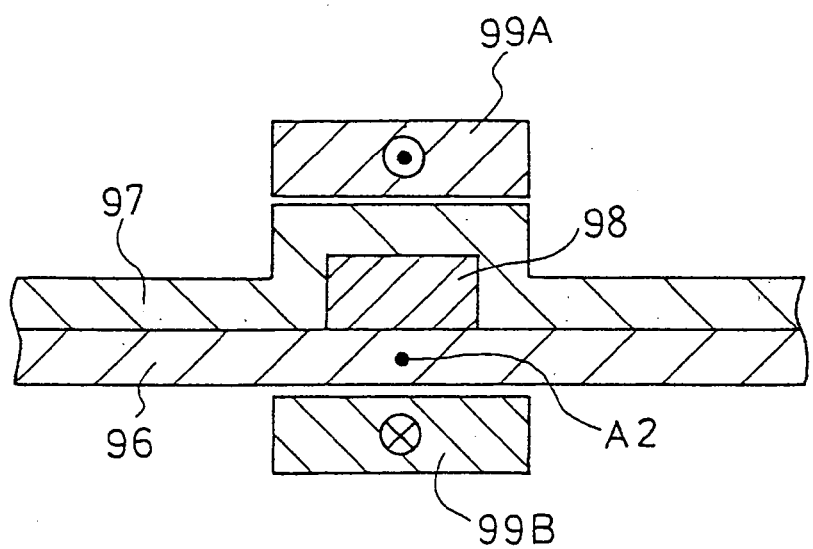

FIG. 42
(a)
PRIOR ART
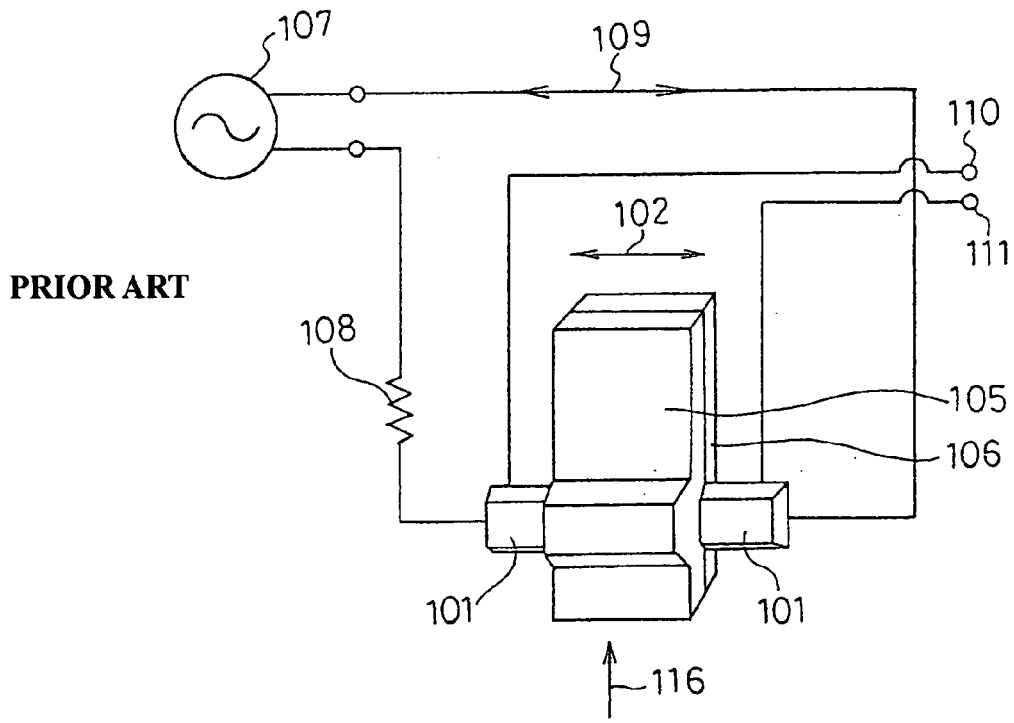
(b)
PRIOR ART
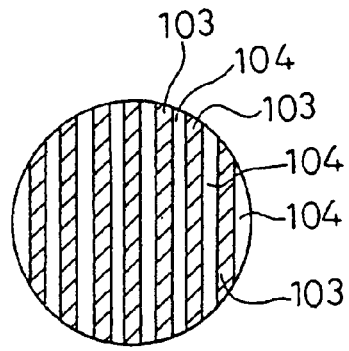

MAGNETIC SENSOR HAVING A CLOSED MAGNETIC PATH FORMED BY SOFT MAGNETIC FILMS

CROSS-REFERENCE TO RELATED APPLICATION

This application is a Section 371 of International Application No. PCT/JP02/07188, filed Jul. 15, 2002, the disclosure of which is incorporated herein by reference.

TECHNICAL FIELD

The present invention relates to a high sensitivity magnetic sensor for detecting an external magnetic field by impedance change of a conductor due to a magnetism.

BACKGROUND ART

As a magnetic sensor for detecting a magnetism or a magnetic field with a high sensitivity, a magneto-impedance element which utilizes magneto-impedance effect is known. In the magneto-impedance element, a constant current of a high frequency is passed through a conductor provided adjacent to the magnetic poles of a soft magnetic body. When the magneto-impedance element is placed in a magnetic field, the impedance of the conductor is changed by the magnetic field. A magnetism is detected on the basis of the change of a high frequency voltage due to this change of the impedance of the conductor.

Part (a) of FIG. 42 is a perspective view of a conventional magneto-impedance element which is reported in the Electronics Information Society Technical Report MR 95-80. Referring to the figure, a detection conductor film 101 formed of a conductive metal thin film is interposed between soft magnetic cores 105 and 106. Each of the magnetic cores 105 and 106 is, as shown by a cross-sectional view of part (b) of FIG. 42, a layered product of a permalloy film 103 and a $SiO_2$ film 104. A high frequency current 109, which is a constant current of a UHF carrier signal, is caused to flow through the detection conductor film 101 from a high frequency generator 107 of UHF band via a resistor 108. A voltage change based on the change of impedance due to the external magnetic field shown by arrow 116 is detected across terminals 110 and 111 of conductive wires which are connected to respective ends of the detection conductor film 101. A carrier signal voltage corresponding to the product of a high frequency current 109 and the impedance across the terminals 110 and 111 of the detection conductor film 101 is generated across the terminals 110 and 111. When an external magnetic field 116 exists, an orientation direction of easy axis of magnetization of the soft magnetic cores 105, 106 oriented in the direction shown by an arrow 102 deviates from the orientation direction due to the external magnetic field 116. As a result, the impedance of the detection conductor film 101 decreases in comparison with the case that no external magnetic field exists. The decrease of the impedance is detected in the form of an amplitude modulation signal of the carrier signal due to the external magnetic field 116. The external magnetic field 116 can be detected by carrying out AM detection to the amplitude modulation signal. The magnetic sensor which utilizes the above-mentioned magneto-impedance effect has a possibility of obtaining a detection output as about ten times high as that of a giant magneto-resistance element which is now in the process of developing at present.

FIG. 43 shows a characteristic curve showing operation of the magneto-impedance element shown in part (a) of FIG. 42, and shows a relation of a magnetic field magnitude DC to a carrier signal level. The frequency of the carrier signal is 1.0 GHz, and the magneto-impedance element is placed in the central portion of Helmholtz coils, and thereto a direct current (DC) magnetic field is applied, and then the magnetic field magnitudes and a carrier signal level are measured. In order to obtain a detection output including a smaller amount of distortion with a high sensitivity, as shown in FIG. 43, it is necessary to give a direct current bias magnetic field of a magnetic field magnitude as shown by a straight line 112.

The impedance of the magneto-impedance element is proportional to the product of the frequency of the carrier signal and a permeability. Therefore, in the case that the frequency is high as mentioned above, a sufficient impedance change is available. However, in the use for the magnetic sensor, there is a case requiring use of a carrier signal of a relatively low frequency. For example, in the case of detecting an external magnetic field of a low level such as geomagnetism, it is required to use a carrier signal of 10 MHz–20 MHz which is far lower than 1 GHz. Accordingly, a magneto-impedance element is demanded whereby a sufficient impedance change is obtainable with a carrier signal of such a relatively low frequency.

DISCLOSURE OF THE INVENTION

The present invention purposes to obtain a magnetic sensor of a high sensitivity by realizing a magneto-impedance element in which a high impedance change is attainable with a carrier signal of a relatively low frequency.

The magnetic sensor of the present invention comprises a soft magnetic film having an easy axis of magnetization in a predetermined direction along with a film face, and a strip-shaped conductive nonmagnetic film which is separated from the above-mentioned soft magnetic film with an electric insulator and is provided in zigzags thereon, wherein the length of a portion parallel to the easy axis of magnetization of the above-mentioned soft magnetic film is made longer than the length of a portion orthogonal to the above-mentioned easy axis of magnetization. The magnetic sensor further comprises a high frequency power source for causing a high frequency current to flow through the above-mentioned conductive nonmagnetic film, and a detection circuit for detecting the above-mentioned external magnetic field on the basis of an impedance change due to the external magnetic field in the above-mentioned conductive nonmagnetic film through which the above-mentioned high frequency current flows.

This magnetic sensor has an action and an effect as follows: when a magnetic flux caused by the external magnetic field passes the soft magnetic film in the direction perpendicular to the easy axis of the magnetization (hard axis of magnetization), a permeability of the soft magnetic film decreases at a portion facing to the conductive nonmagnetic film. As a result, the impedance of the conductive nonmagnetic film varies due to the magneto-impedance effect. Since the variation of the impedance corresponds to the magnitude of the external magnetic field, the magnitude of the external magnetic field can be detected on the basis of the variation of the impedance. The length of the part parallel to the easy axis of magnetization of the soft magnetic film of the zigzag conductive nonmagnetic film is made longer than the length of the part orthogonal thereto. Therefore, there are many regions on which the direction of the hard axis of magnetization which is high in the permeability of the soft magnetic-film is parallel to the direction of the magnetic flux produced by the high frequency current flowing through the conductive nonmagnetic film. For this reason, even in the case that a high frequency carrier signal of a relatively low frequency is used, the impedance value of the conductive nonmagnetic film can be set to a large value, and hence the impedance change is large and the external magnetic field is detected with a high sensitivity.

A magnetic sensor in other aspect of the present invention comprises a strip-shaped soft magnetic films having the easy axis of magnetization in the direction perpendicular to the longitudinal direction of the strip-shaped film and put along the film face, and a strip-shaped conductive nonmagnetic film is formed zigzag on the above-mentioned soft magnetic film with an electrical insulator disposed therebetween, wherein the length of the part parallel to the easy axis of magnetization of the film in the plane of the above-mentioned soft magnetic film is made longer than the length of the part orthogonal to the above-mentioned easy axis of magnetization. The magnetic sensor further comprises a high frequency power source for causing a high frequency current to flow through the above-mentioned conductive nonmagnetic film, and a detection circuit for detecting the above-mentioned external magnetic field on the basis of the impedance change due to the external magnetic field in the above-mentioned conductive nonmagnetic film through which the above-mentioned high frequency current flows.

According to the magnetic sensor of the other aspect, by forming the soft magnetic film into the strip-shape, in addition to the above-mentioned action and effect, when the external magnetic field is applied, demagnetization field produced in the soft magnetic film can be reduced. As a result, even in the case that a high frequency carrier signal of a relatively low frequency is used, the impedance value and the impedance change of the conductive nonmagnetic film are large, and a magnetic sensor having a high detection sensitivity is obtained.

The magnetic sensor of further aspect of the present invention comprises a soft magnetic film formed on a principal plane of a nonmagnetic substrate and having an easy axis of magnetization in a predetermined direction conforming to the film face, and a strip-shaped conductive nonmagnetic film formed zigzag on the above-mentioned soft magnetic film with an intervenient electrical insulation film, wherein the length of a portion parallel to the easy axis of magnetization of the film in the plane of the above-mentioned soft magnetic film is made longer than the length of the portion orthogonal to the above-mentioned easy axis of magnetization. The magnetic sensor further has a conductive film for giving a direct current bias magnetic field to the above-mentioned soft magnetic film by causing a direct current to flow, which is formed on the above-mentioned conductive nonmagnetic film with an intervenient insulative protection film. The magnetic sensor further has a high frequency power source for causing a high frequency current to flow through the above-mentioned conductive nonmagnetic film, and a detection circuit for detecting the above-mentioned external magnetic field on the basis of the impedance change due to the external magnetic field in the above-mentioned conductive nonmagnetic film through which the above-mentioned high frequency current flows.

According to the magnetic sensor of the further aspect, in addition to the above-mentioned actions and effects, the soft magnetic film, the conductive nonmagnetic film and the conductive film for giving the direct current bias magnetic field to the soft magnetic film are held by a nonmagnetic substrate. The magnetic sensor includes an effect which can detect the external magnetic field with a high sensitivity by causing a direct current to flow through the conductive film for applying a direct current bias magnetic field.

A magnetic sensor of a further aspect of the present invention comprises a strip-shaped first soft magnetic film formed on a principal plane of a nonmagnetic substrate and having an easy axis of magnetization in the direction perpendicular to the longitudinal direction of the strip-shaped film and conforming to a film face, and a strip-shaped conductive nonmagnetic film formed zigzag on the above-mentioned soft magnetic film with an intervenient first insulation film, wherein the length of a portion parallel to the easy axis of magnetization of the film in the plane of the above-mentioned soft magnetic film is made longer than the length of a portion orthogonal to the above-mentioned easy axis of magnetization. The magnetic sensor further comprises a second soft magnetic film formed on the above-mentioned conductive nonmagnetic film with an intervenient second insulation film, and having an easy axis of magnetization in the direction perpendicular to the longitudinal direction of the strip shape and conforming to the film face, and a conductive film for giving a direct current bias magnetic field to the above-mentioned soft magnetic film by causing a direct current to flow, formed on the above-mentioned second soft magnetic film with an intervenient insulation protection film. The magnetic sensor further comprises a high frequency power source for causing a high frequency current to flow through the above-mentioned conductive nonmagnetic film, and a detection circuit for detecting the above-mentioned external magnetic field on the basis of the impedance change due to the external magnetic field in the above-mentioned conductive nonmagnetic film through which the above-mentioned high frequency current flows.

According to the magnetic sensor of the above-mentioned further aspect, in addition to the above-mentioned respective actions and effects, the following action and effect are included. Since the strip-shaped conductive nonmagnetic film is interposed between the first and the second soft magnetic films, an overall thickness of the soft magnetic film substantially doubles. Consequently, although demagnetization field increases when an external magnetic field is applied to the magnetic sensor, the absolute value of the impedance of the conductive nonmagnetic film doubles. Since a detection output level of the detection circuit is proportional to the value of the impedance, the level of the detection output becomes high and the SN ratio of the detection output becomes high.

The magnetic sensor of other aspect of the present invention is characterized by comprising of at least one soft magnetic film having a closed magnetic path formed by a soft magnetic film, a conductive film for causing a direct current to flow, provided so as to penetrate through the closed magnetic path of the above-mentioned soft magnetic film, and a conductive nonmagnetic film for causing a high frequency current to flow, provided so as to penetrate through the closed magnetic path of the above-mentioned soft magnetic film with keeping insulation to the above-mentioned conductive film.

According to the present invention, since the conductive film through which the direct current flows penetrates the closed magnetic path, a large direct current bias magnetic field is obtainable with a small direct current.

A fabrication method of the magnetic sensor in the present invention comprises the step of forming at least one strip-shaped first soft magnetic film being made to a lower soft magnetic film on an upper face of a nonmagnetic substrate, the step of forming a first conductive film on the above-mentioned first soft magnetic film with an intervenient first insulation film, and a conductive first connection part and a second connection part, the step of forming a conductive nonmagnetic film on the above-mentioned first conductive film with an intervenient second insulation film, the step of forming a third insulation film on the above-mentioned conductive nonmagnetic film, the step of removing the above-mentioned first, second and third insulation films on the above-mentioned first soft magnetic film so as to leave the above-mentioned first, second and third insulation films in the vicinity including the above-mentioned first conductive film and the conductive nonmagnetic film, the step of forming a closed magnetic path by providing a second soft magnetic film on the above-mentioned first soft magnetic film and the above-mentioned left first, second and third insulation films, the step of forming a fourth insulation film on entire face including the above-mentioned second soft magnetic film, the step of exposing the above-mentioned first and second connection parts by removing the second, the third and the fourth insulation films placed on the above-mentioned first and second connection parts and forming through holes, the step of forming connection lines of electric conductors which are electrically connected to the above-mentioned first and second connection parts at both ends, respectively, on the above-mentioned fourth insulation film 94, and carrying out connections with the first conductive film passing through adjacent other closed magnetic path.

Figure 1:
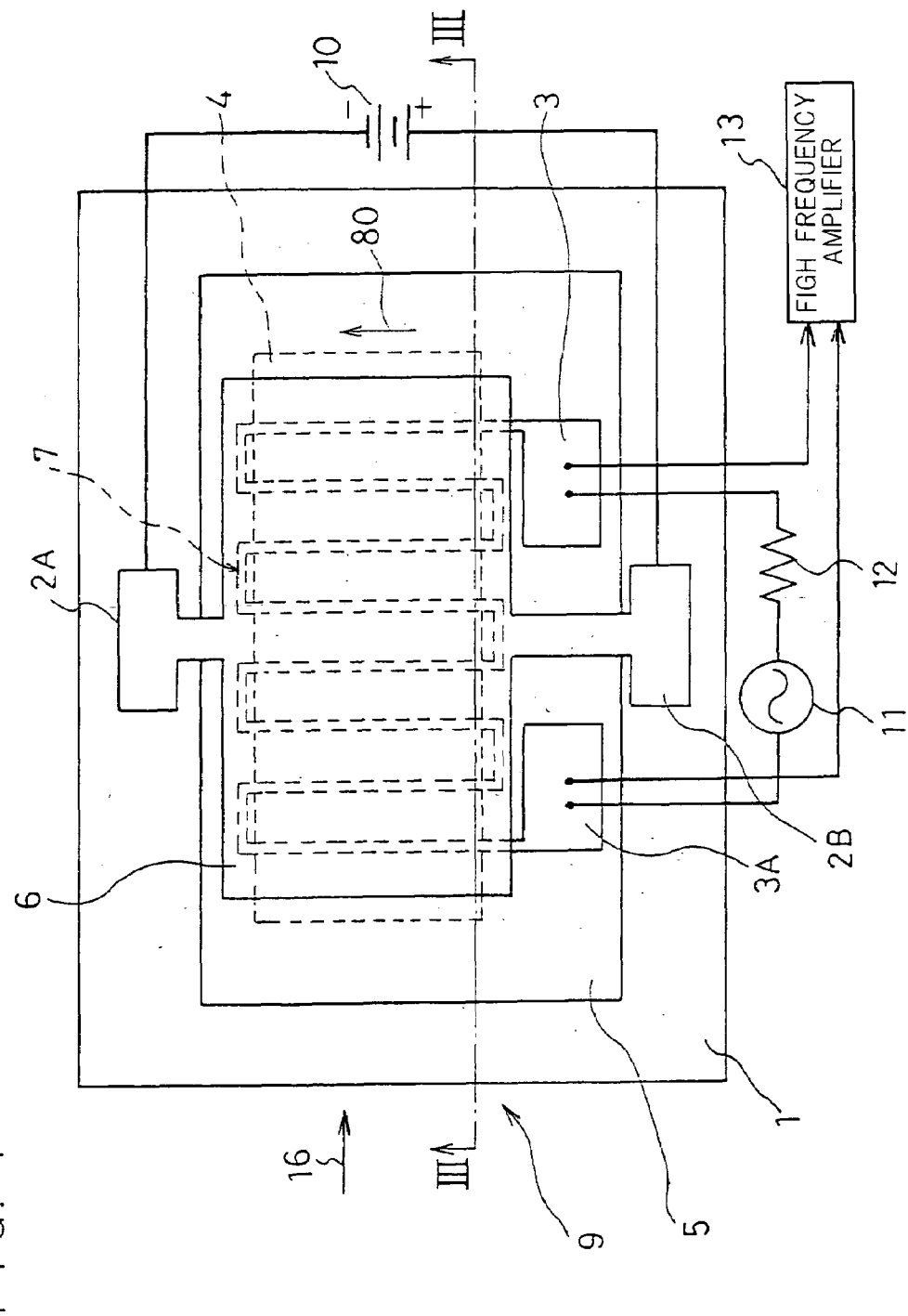
FIG. 1 is a plane view of a magnetic sensor of a first embodiment of the present invention.

Part (a) of FIG. 3 is a cross-sectional view taken along the line III—III in FIG. 1.

Part (b) of FIG. 3 is an enlarged fragmentary view of a right end portion of part (a) of FIG. 3.

Figure 4:
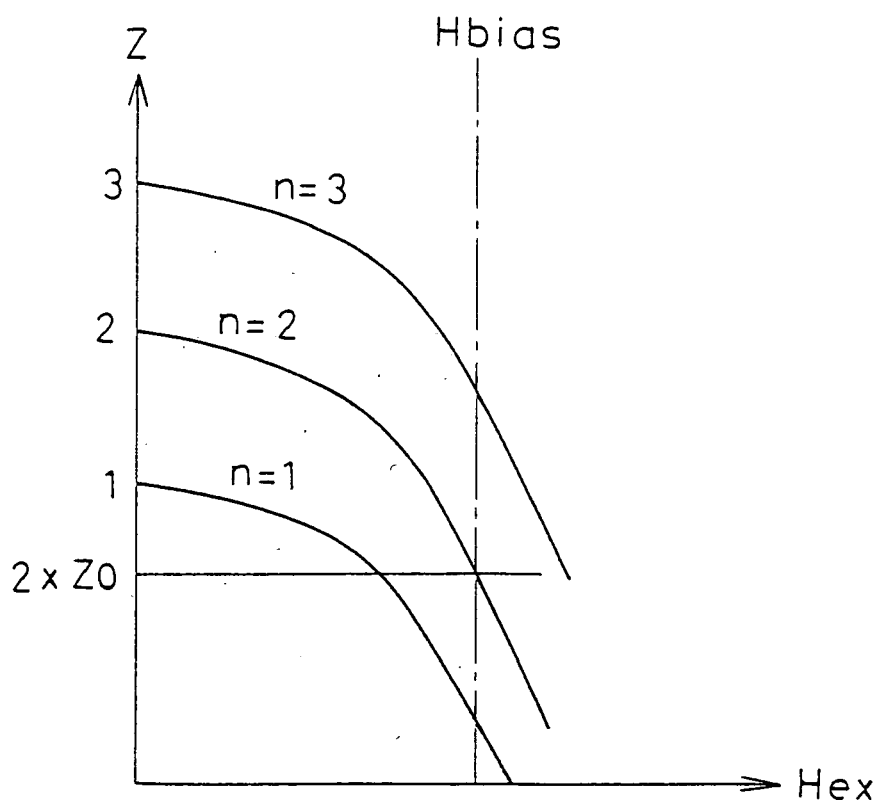

FIG. 4 is a graph showing a relation of an external magnetism Hex and an impedance Z of the magnetic sensor of the first embodiment in the present invention.

Figure 5:
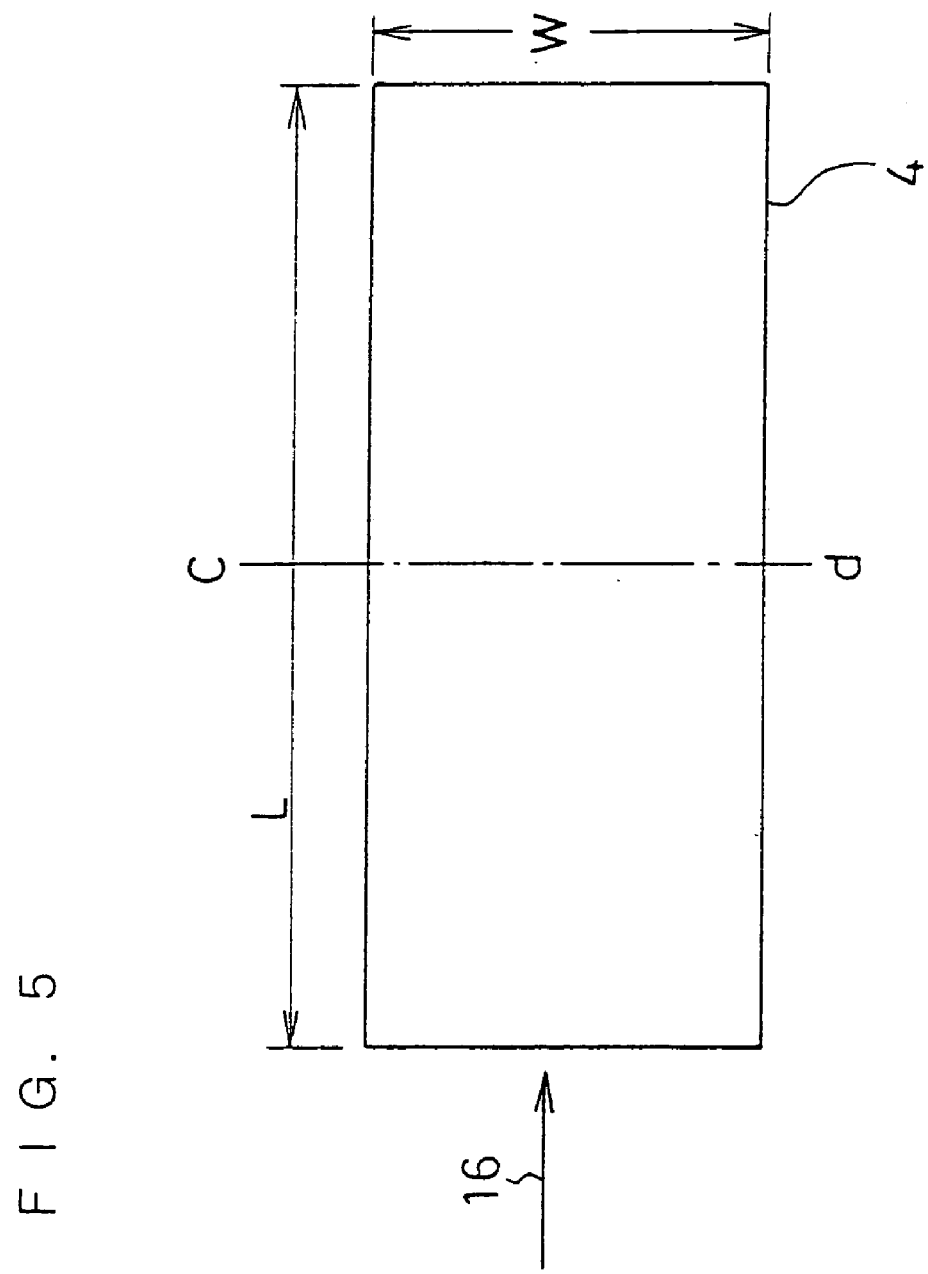

FIG. 5 is a plane view showing the shape of a soft magnetic film of the magnetic sensor of the first embodiment in the present invention.

Figure 6:
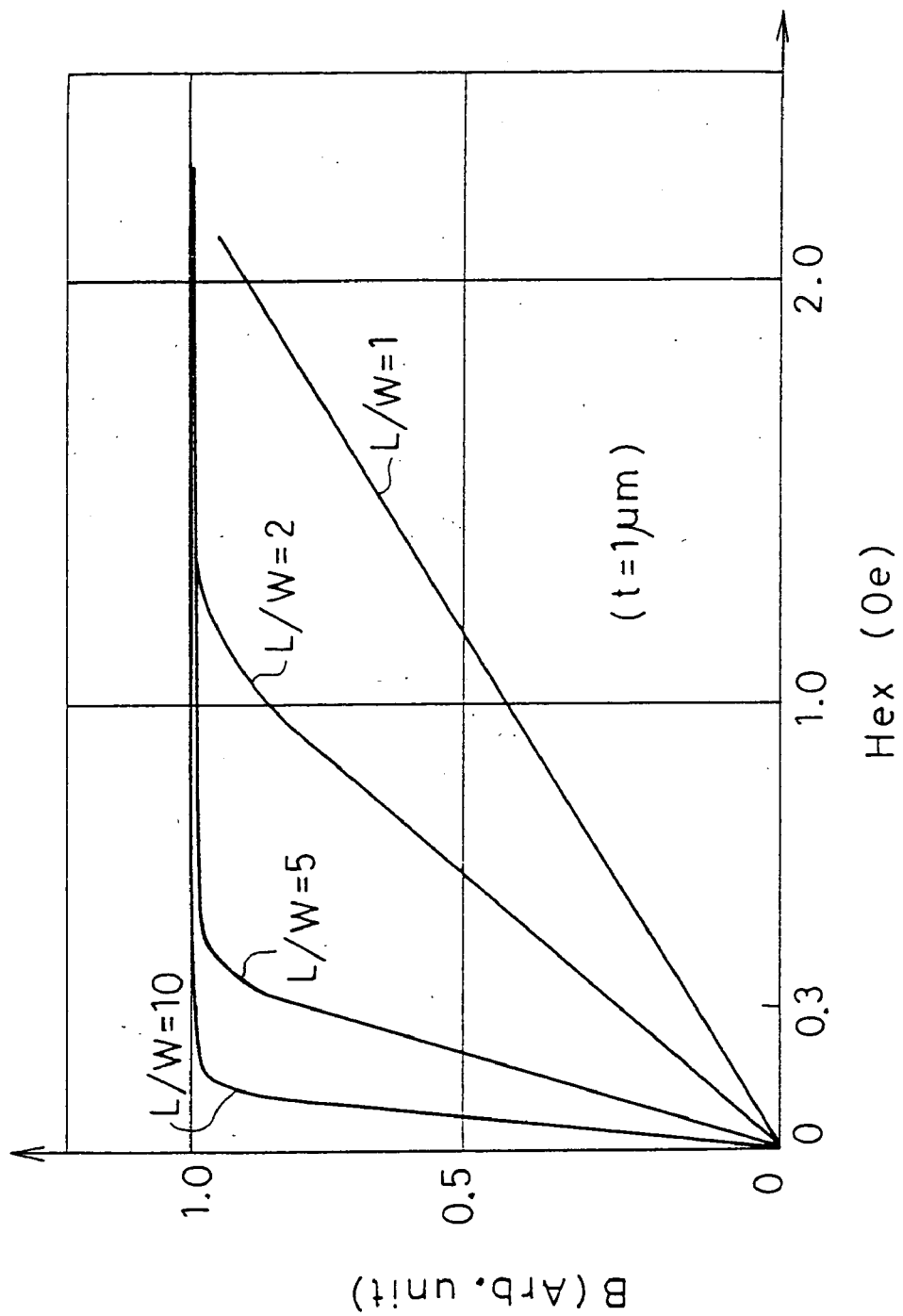

FIG. 6 is a graph showing a relation of the external magnetism Hex and a magnetic flux density B in which a ratio L/W is made to a parameter in the magnetic sensor of the first embodiment in the present invention.

Figure 7:
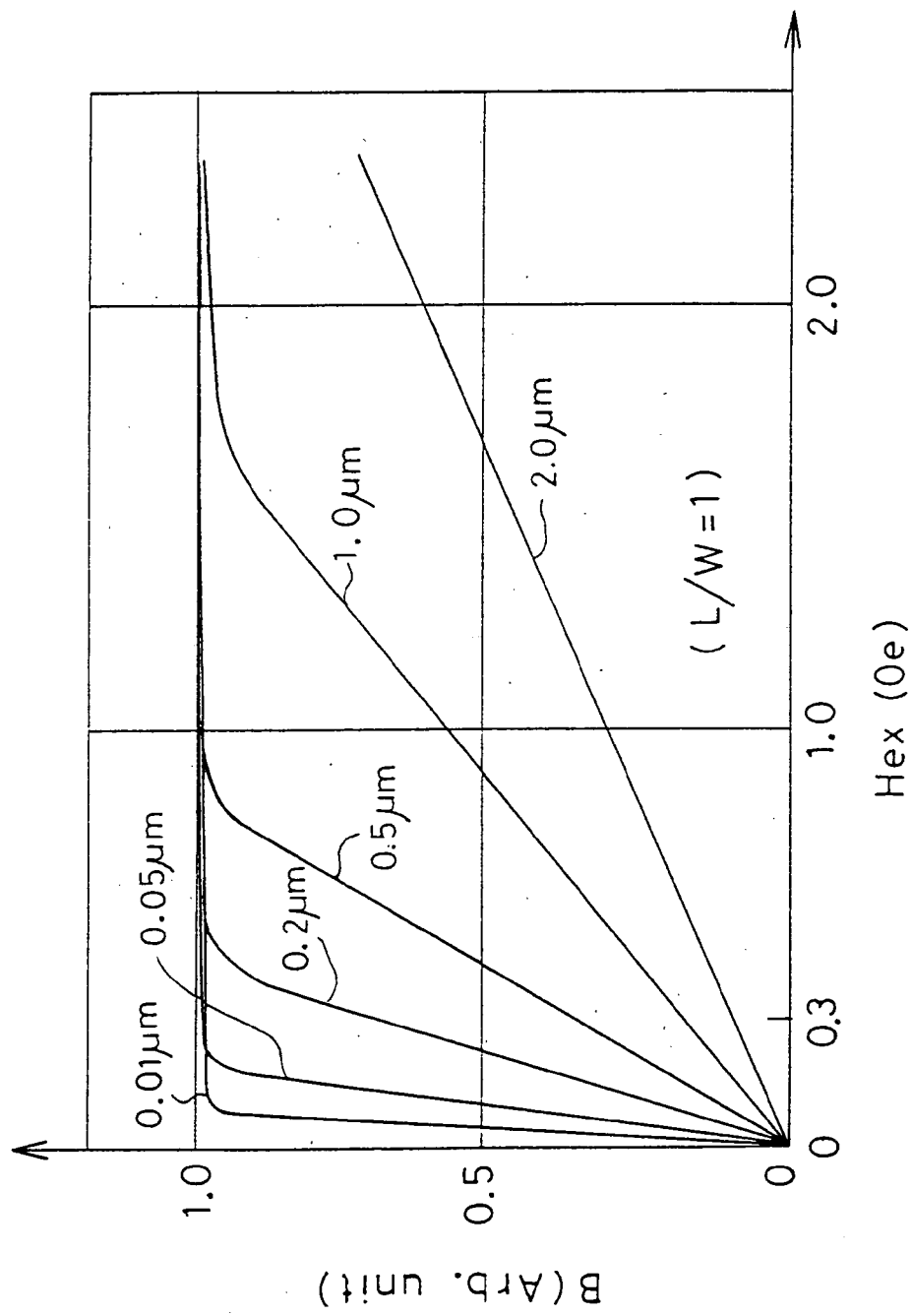

FIG. 7 is a graph showing a relation of the external magnetism and the magnetic flux density B in which the thickness t of the soft magnetic film is made to a parameter in the magnetic sensor of the first embodiment in the present invention.

Figure 8:
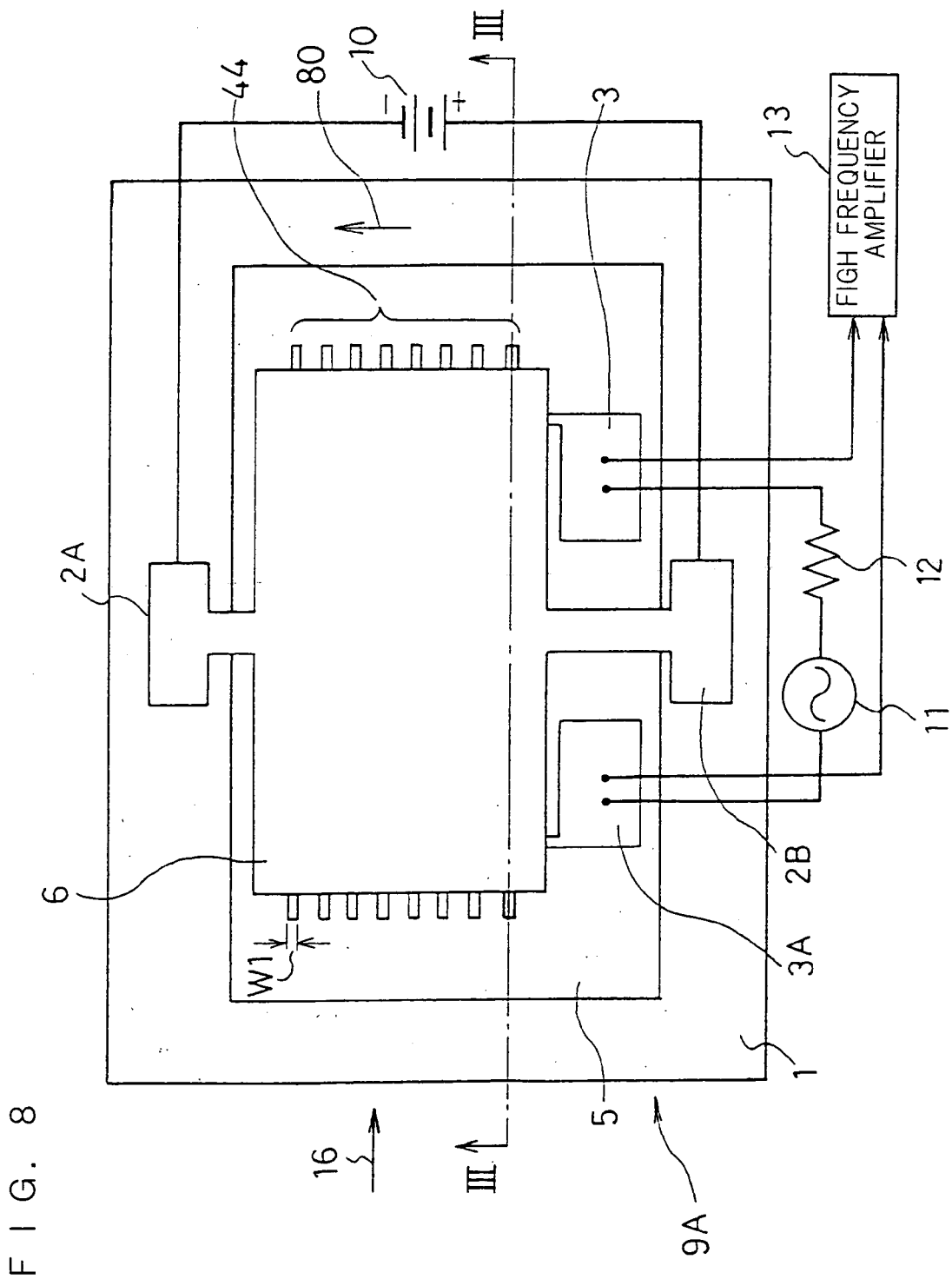

FIG. 8 is a plane view of the magnetic sensor of a second embodiment in the present invention.

Figure 9:
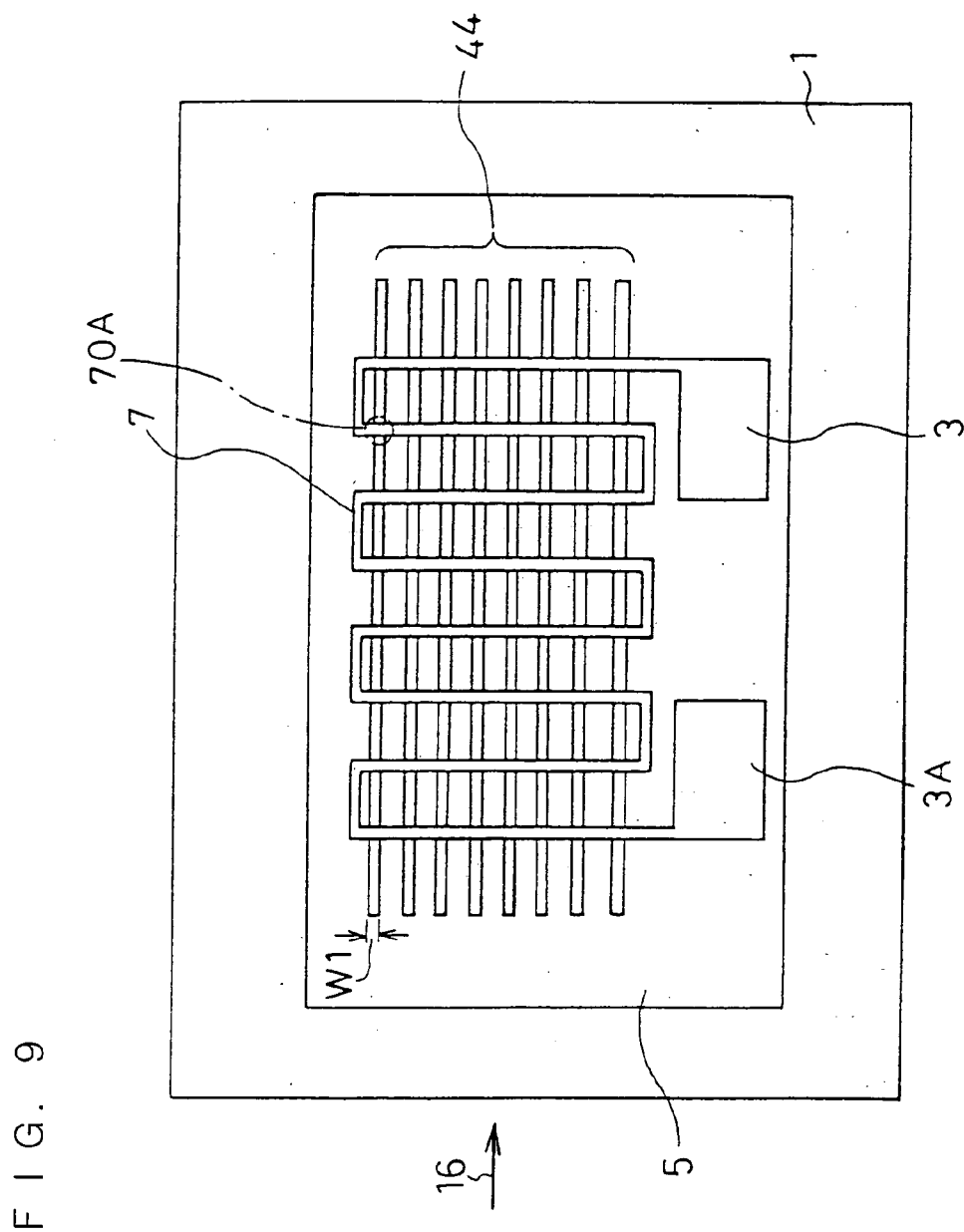

FIG. 9 is plane view showing a state in which the conductive film 6 is removed from the magnetic sensor in FIG. 8.

Figure 10:
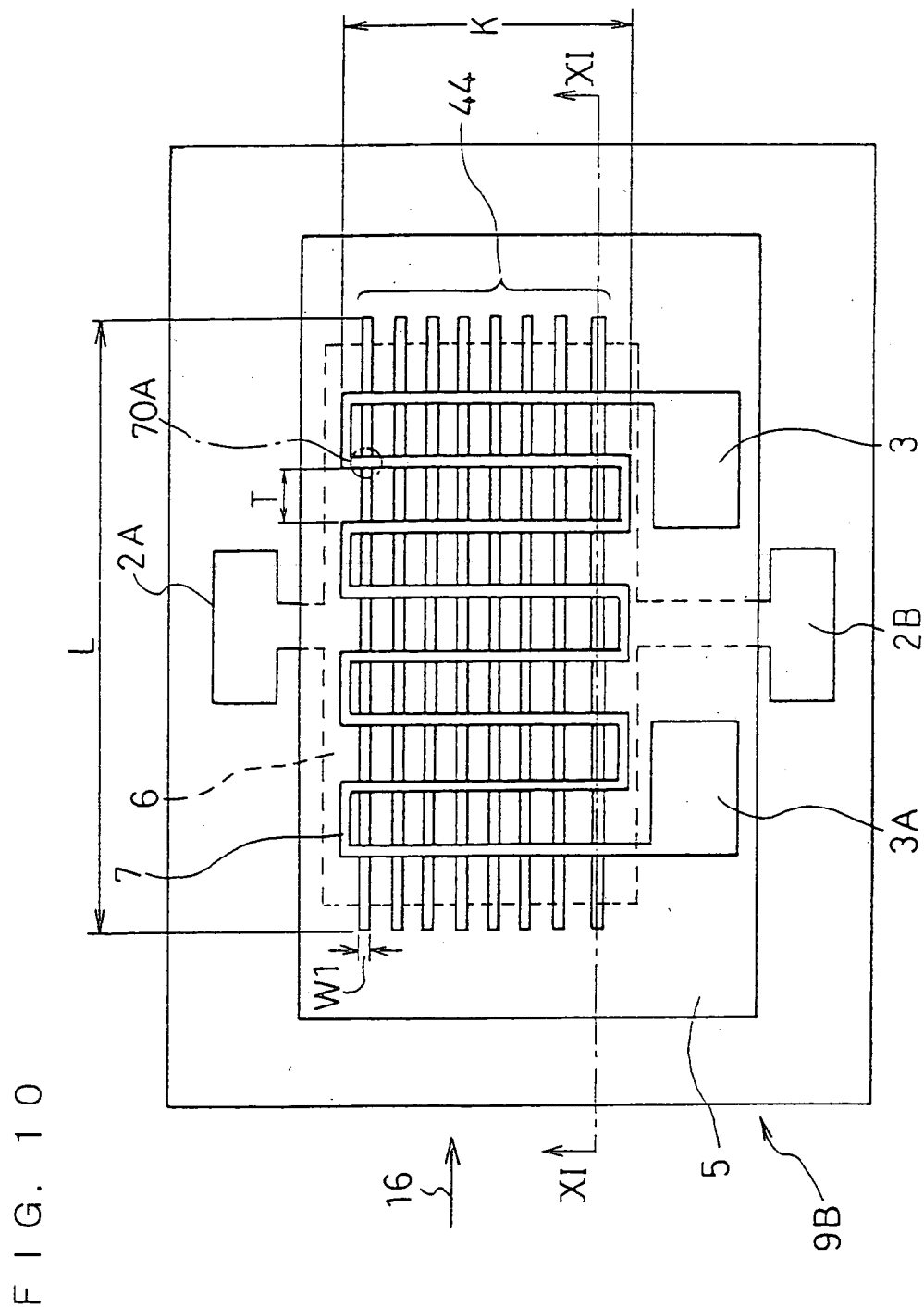

FIG. 10 is a plane view of the magnetic sensor of other example of the second embodiment in the present invention.

Figure 11:
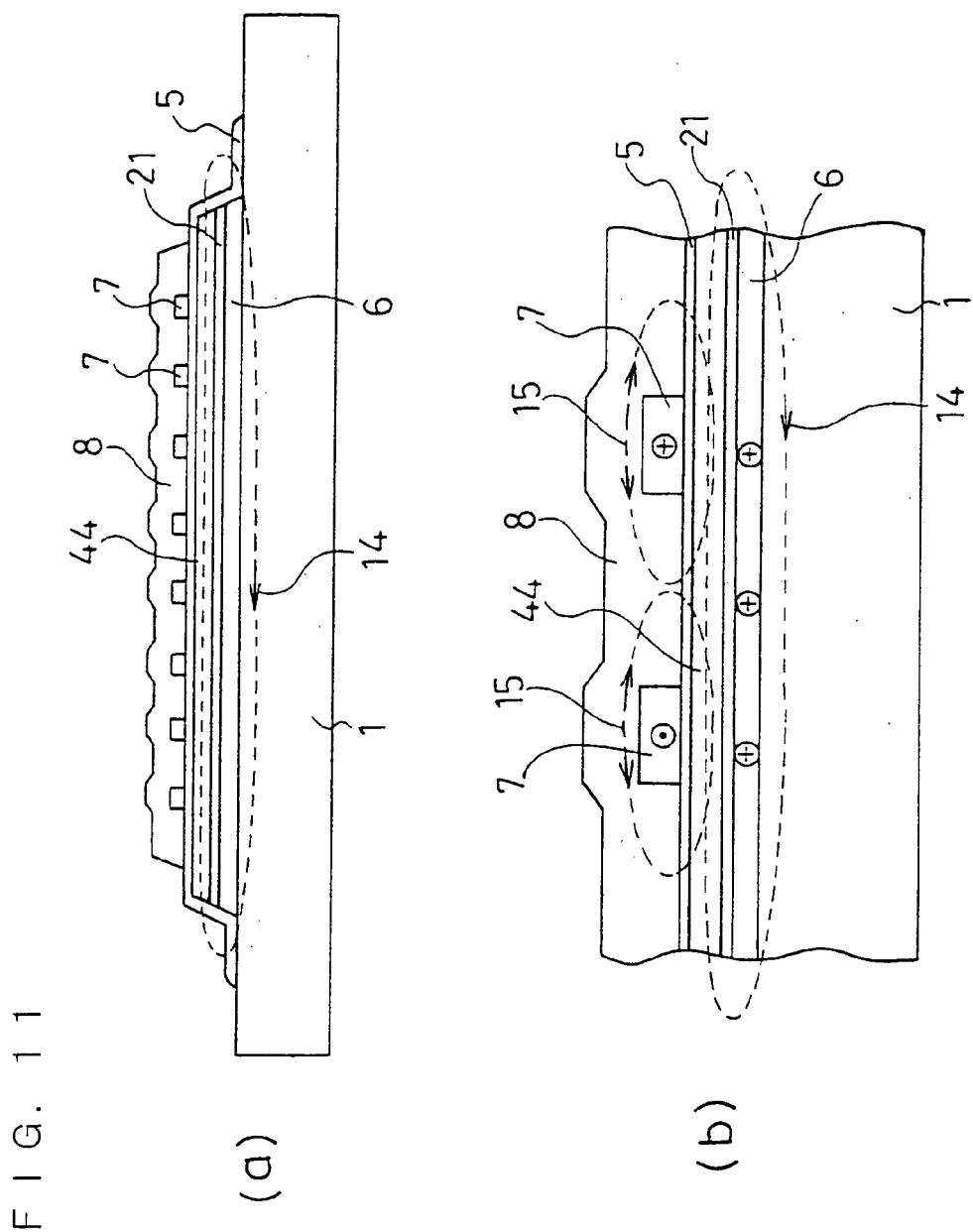

Part (a) of FIG. 11 is a cross-sectional view taken along the line XI—XI in FIG. 10.

Part (b) of FIG. 11 is an enlarged fragmentary view of the right end portion of part (a) of FIG. 11.

FIG. 12 is a graph showing a relation of the external magnetism Hex and the impedance Z in the magnetic sensor of the second embodiment in the present invention.

Figure 13:
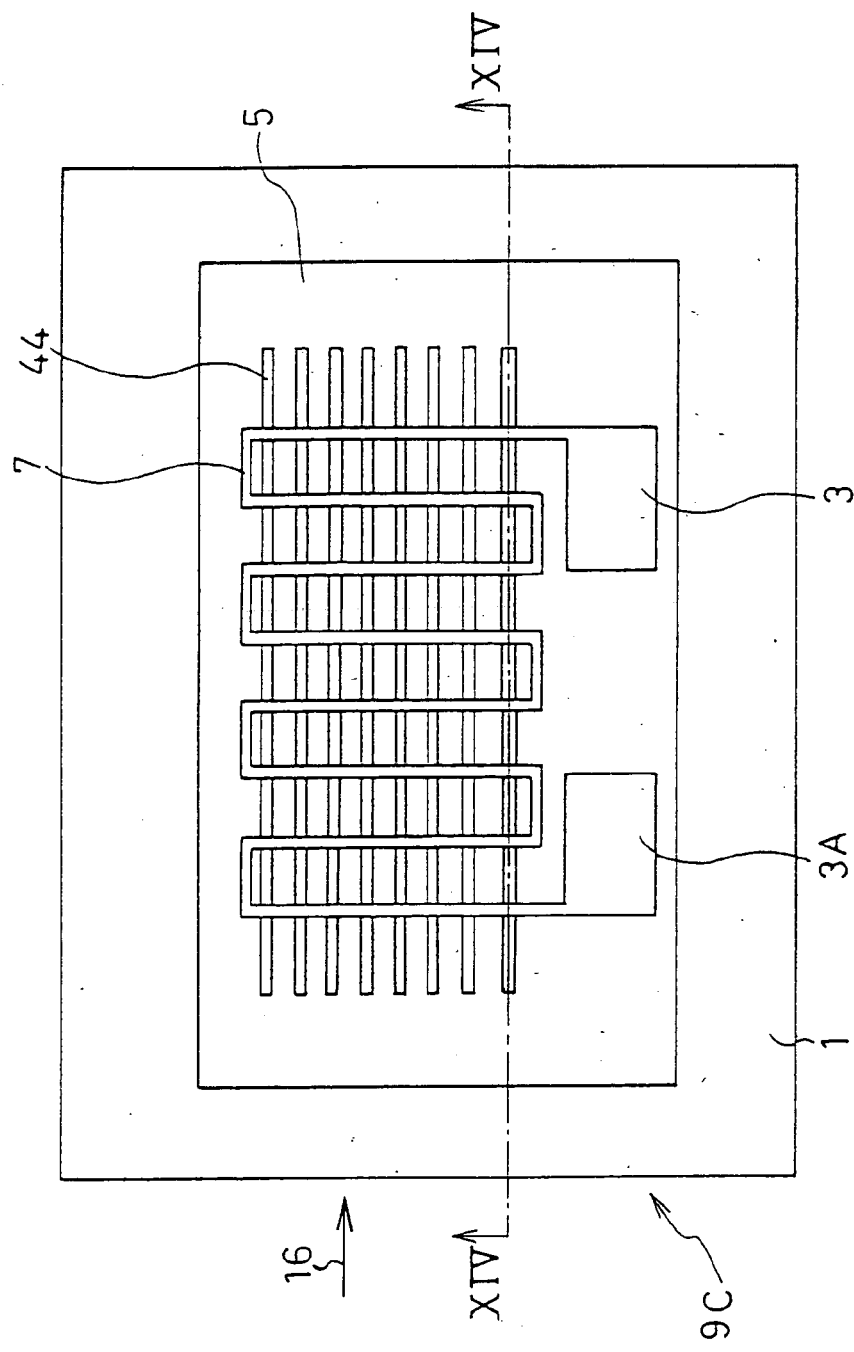

FIG. 13 is a plane view of the magnetic sensor of a third embodiment in the present invention.

Part (a) of FIG. 14 is a cross-sectional view taken along the line XIV—XIV in FIG. 13.

Part (b) of FIG. 14 is an enlarged fragmentary view of the right end portion of Part (a) of FIG. 14.

Part (a) of FIG. 15 is a cross-sectional view of the magnetic sensor of the third embodiment in the present invention.

Part (b) of FIG. 15 is an enlarged fragmentary view of the right end portion of Part (a) of FIG. 15.

Figure 16:
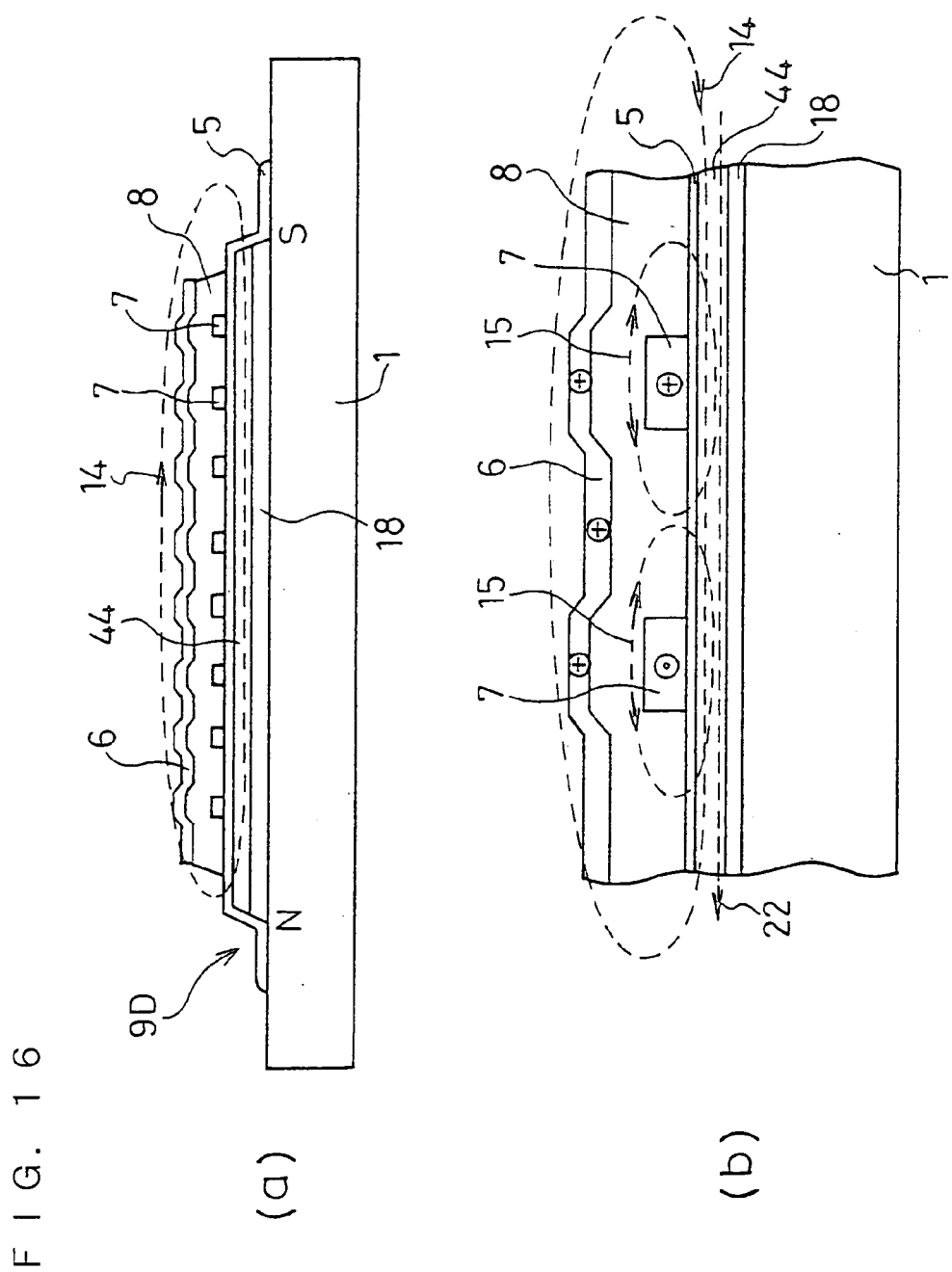

Part (a) of FIG. 16 is a cross-sectional view of the magnetic sensor of a fourth embodiment in the present invention.

Part (b) of FIG. 16 is an enlarged fragmentary view of the right end portion of part (a) of FIG. 16.

Figure 17:
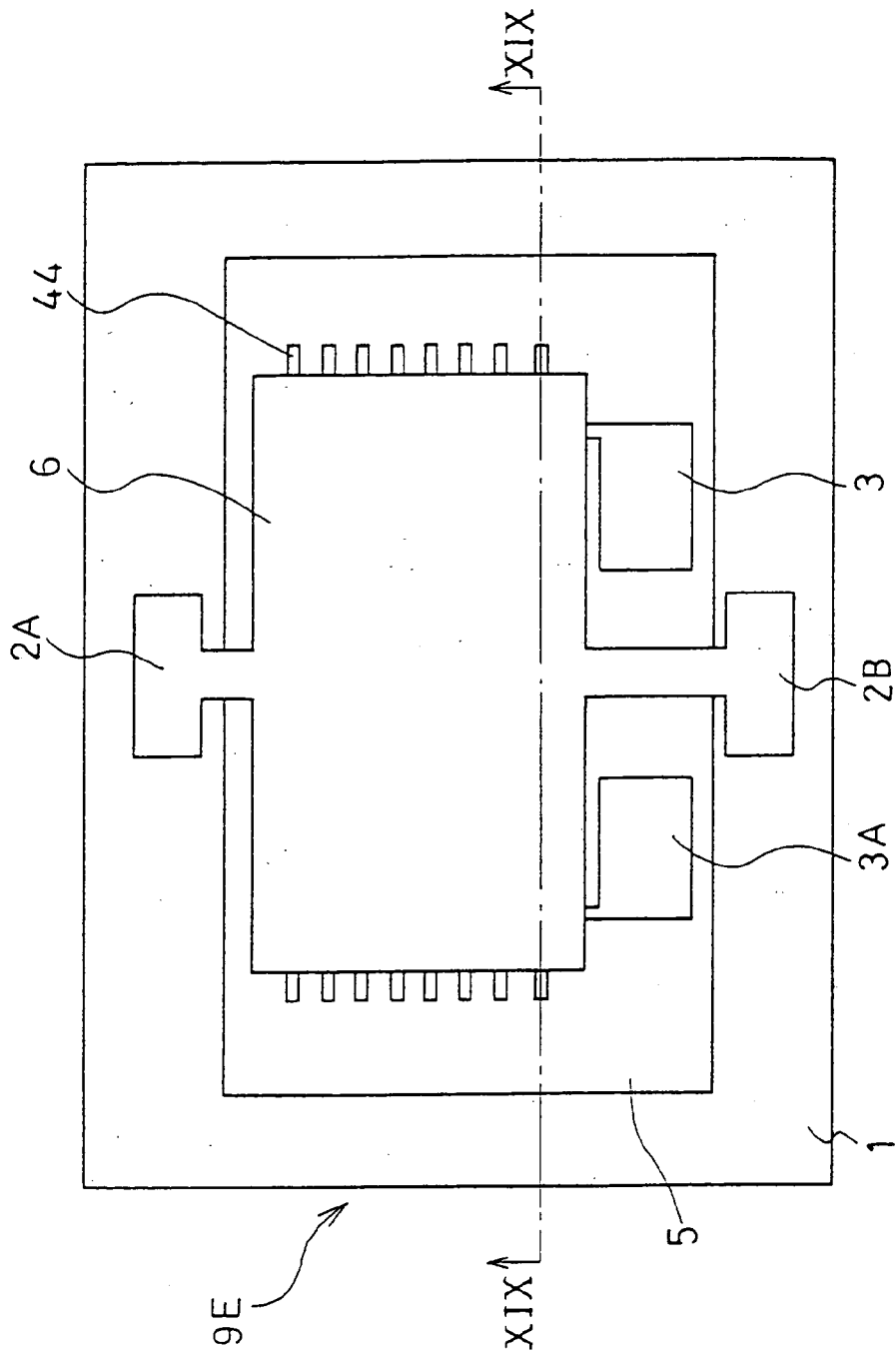

FIG. 17 is a plane view of the magnetic sensor of a fifth embodiment in the present invention.

Figure 18:
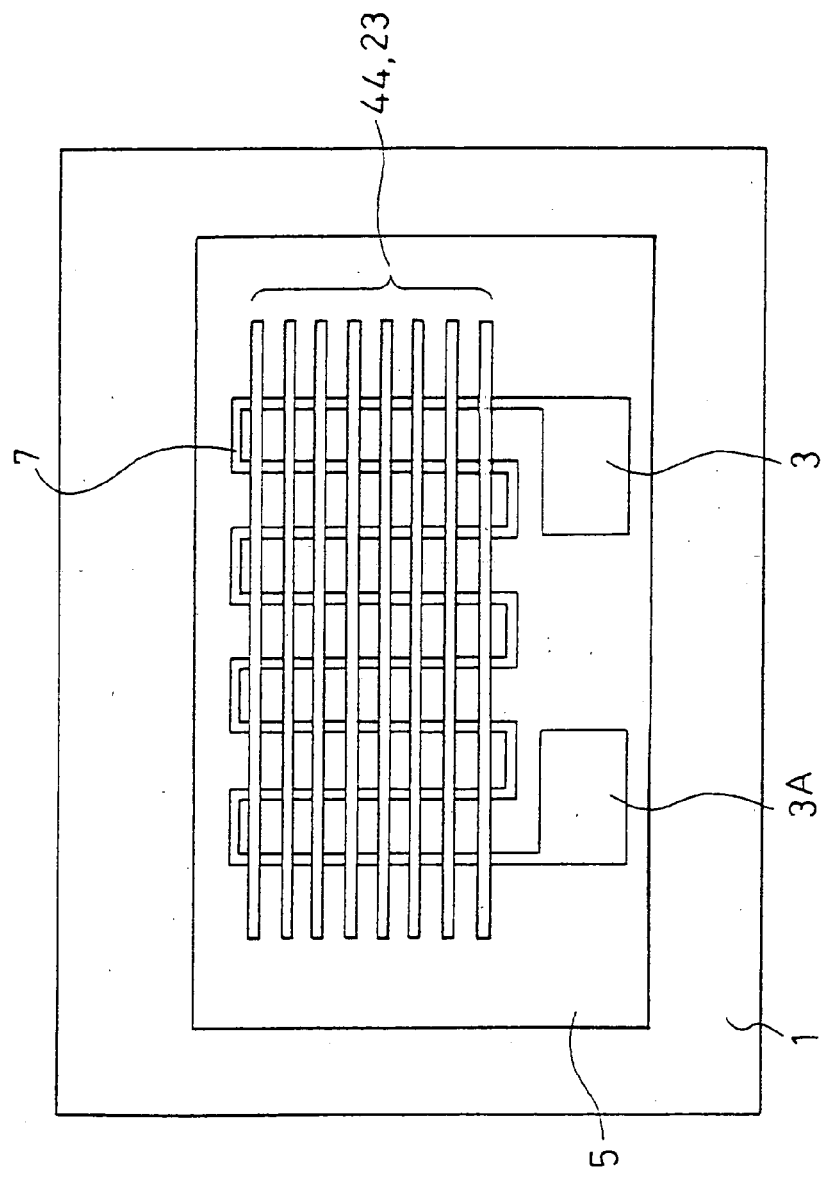

FIG. 18 is a plane view showing a state in which the conductive film 6 is removed from the magnetic sensor in FIG. 17.

Part (a) of FIG. 19 is a cross-sectional view taken along the line XIX—XIX in FIG. 18.

Part (b) of FIG. 19 is an enlarged fragmentary view of the right end portion of Part (a) of FIG. 19.

Figure 20:
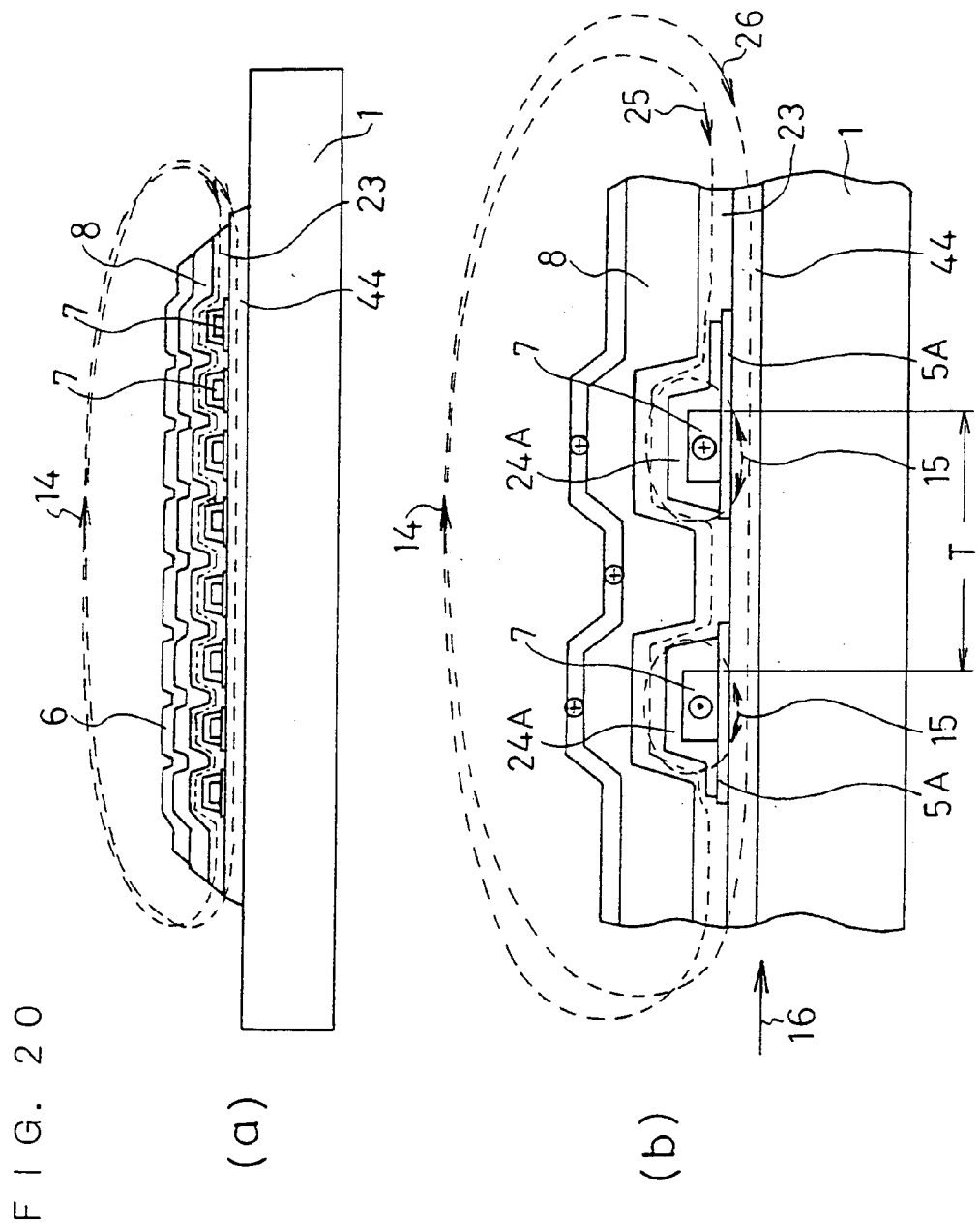

Part (a) of FIG. 20 is a cross-sectional view of the magnetic sensor of the fifth embodiment in the present invention.

Part (b) of FIG. 20 is an enlarged fragmentary view of the right end portion of part (a) of FIG. 20.

Figure 21:
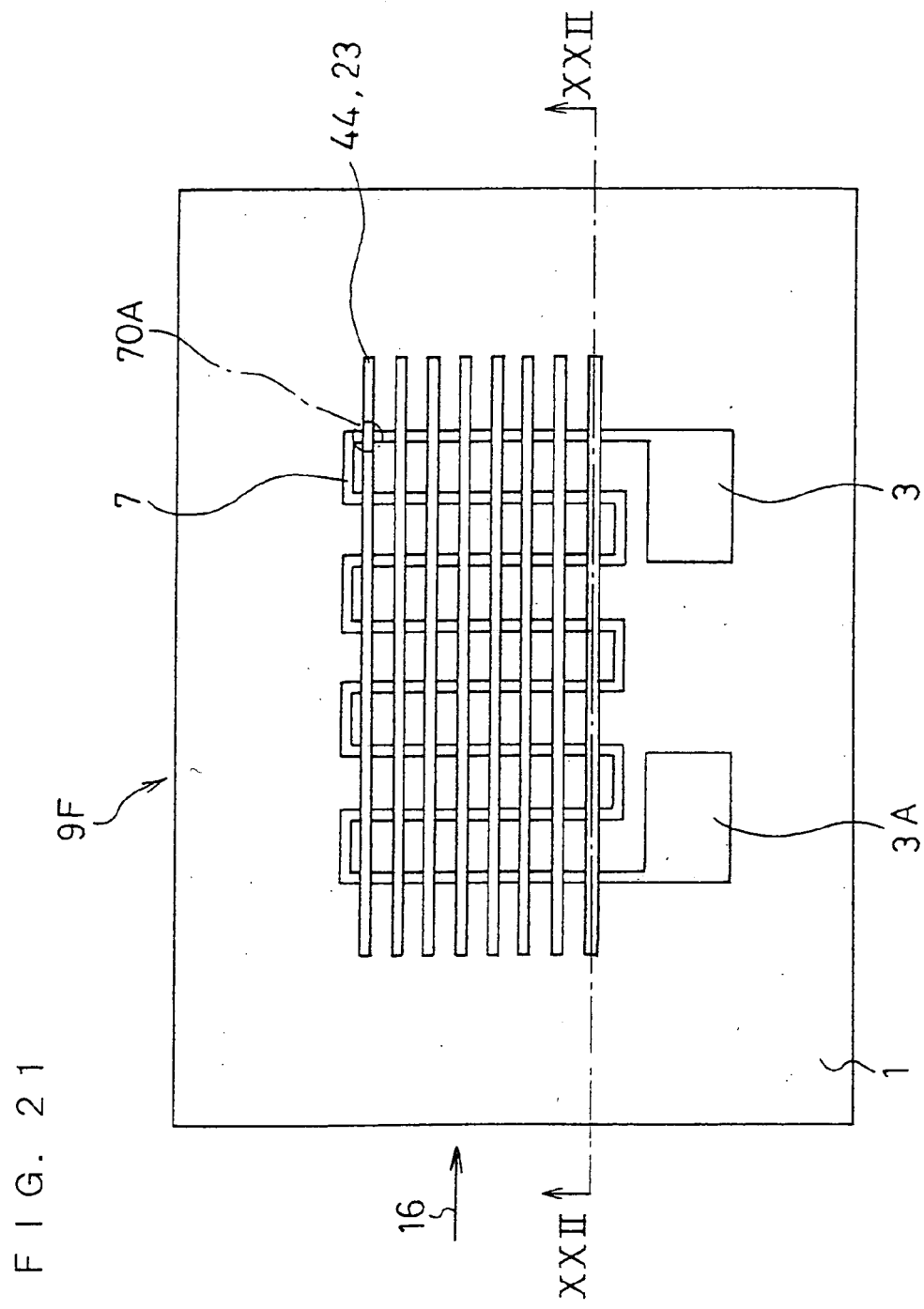

FIG. 21 is a plane view of a magnetic sensor of a sixth embodiment in the present invention.

Figure 22:
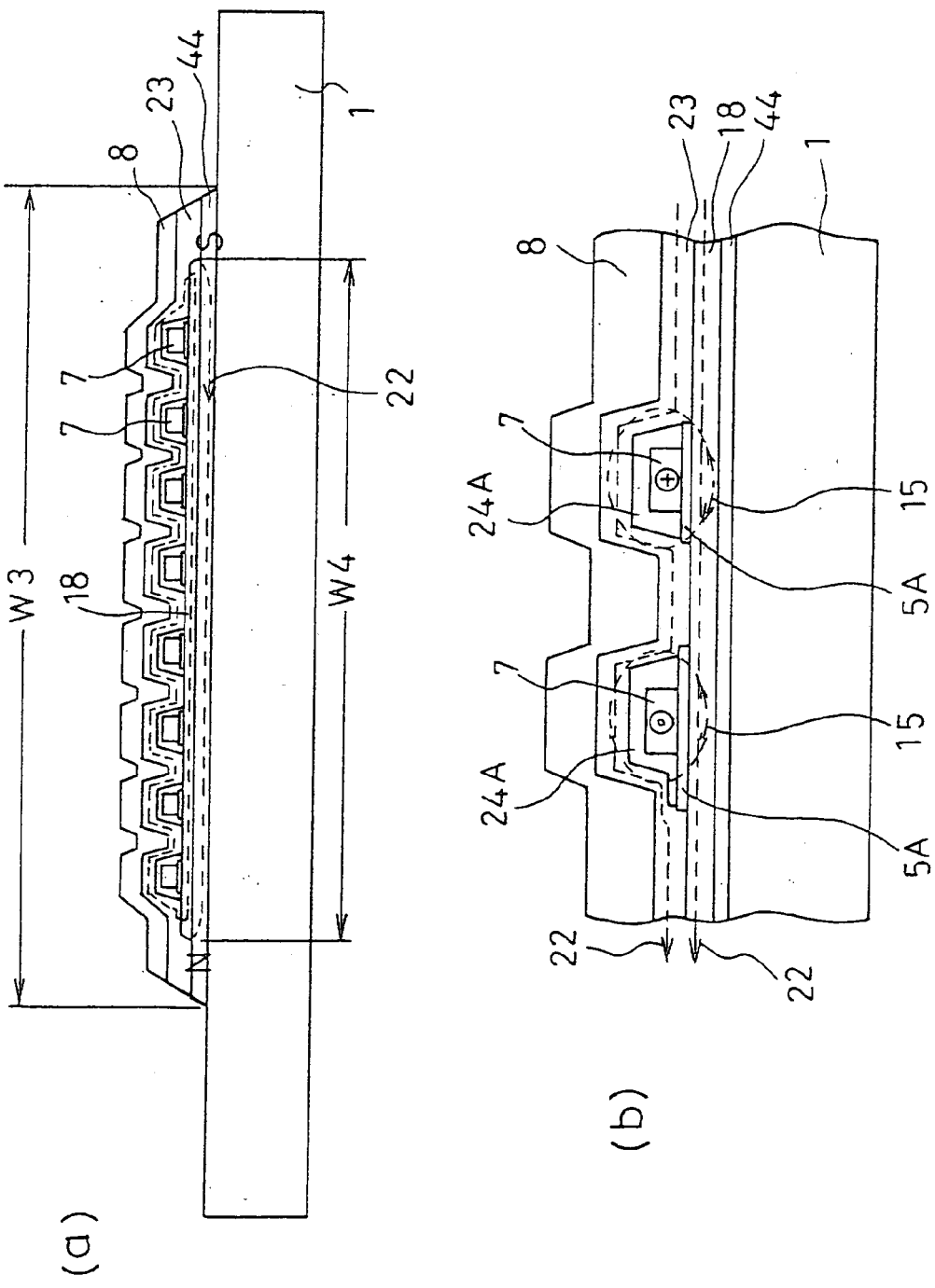

Part (a) of FIG. 22 is a cross-sectional view taken along the line XXII—XXII in FIG. 21.

Part (b) of FIG. 22 is an enlarged fragmentary view of the right end portion of Part (a) of FIG. 22.

Figure 23:
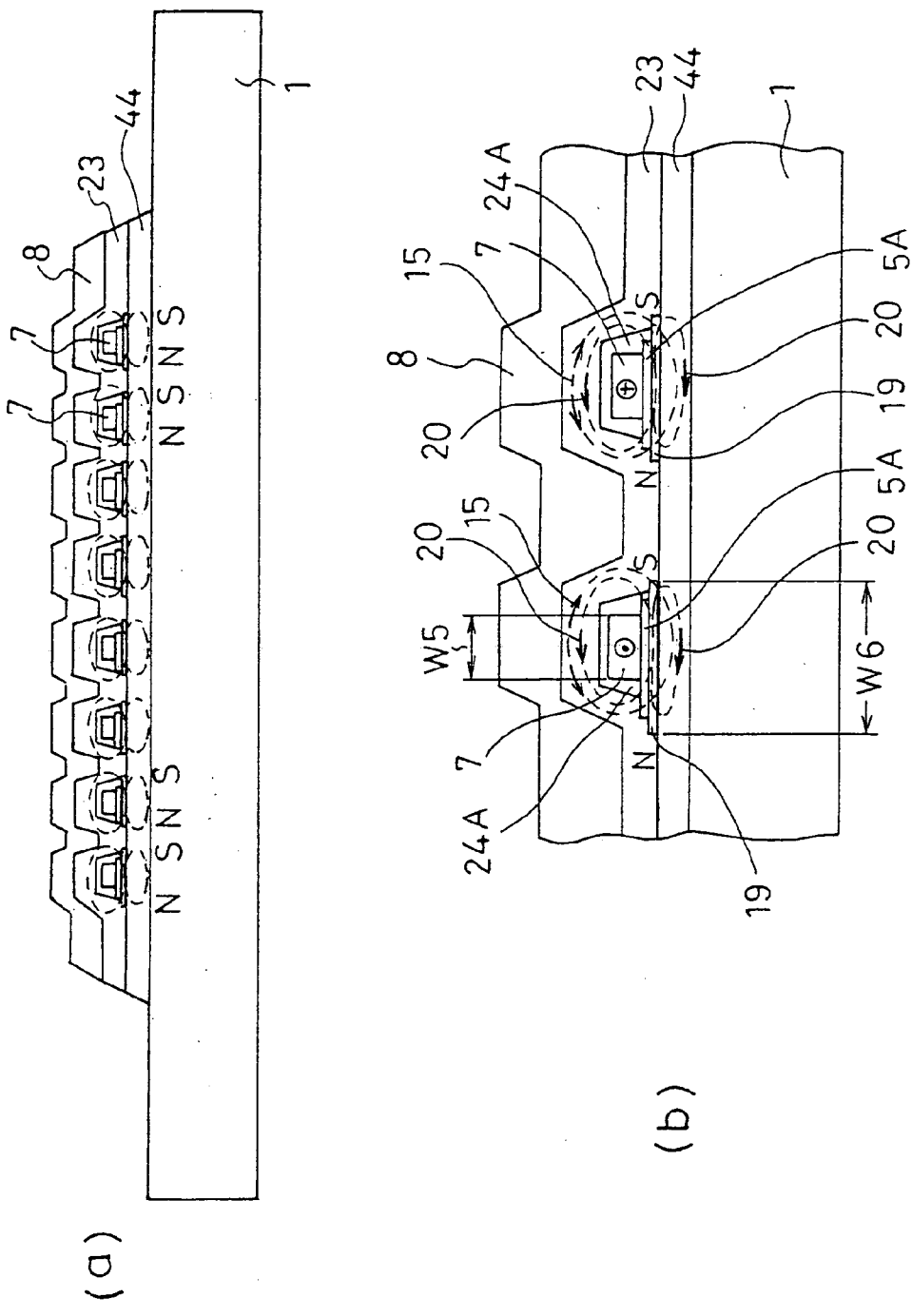

Part (a) of FIG. 23 is a cross-sectional view of the magnetic sensor in other example of the sixth embodiment in the present invention.

Part (b) of FIG. 23 is an enlarged fragmentary view of the right end portion of part (a) of FIG. 23.

Figure 24:
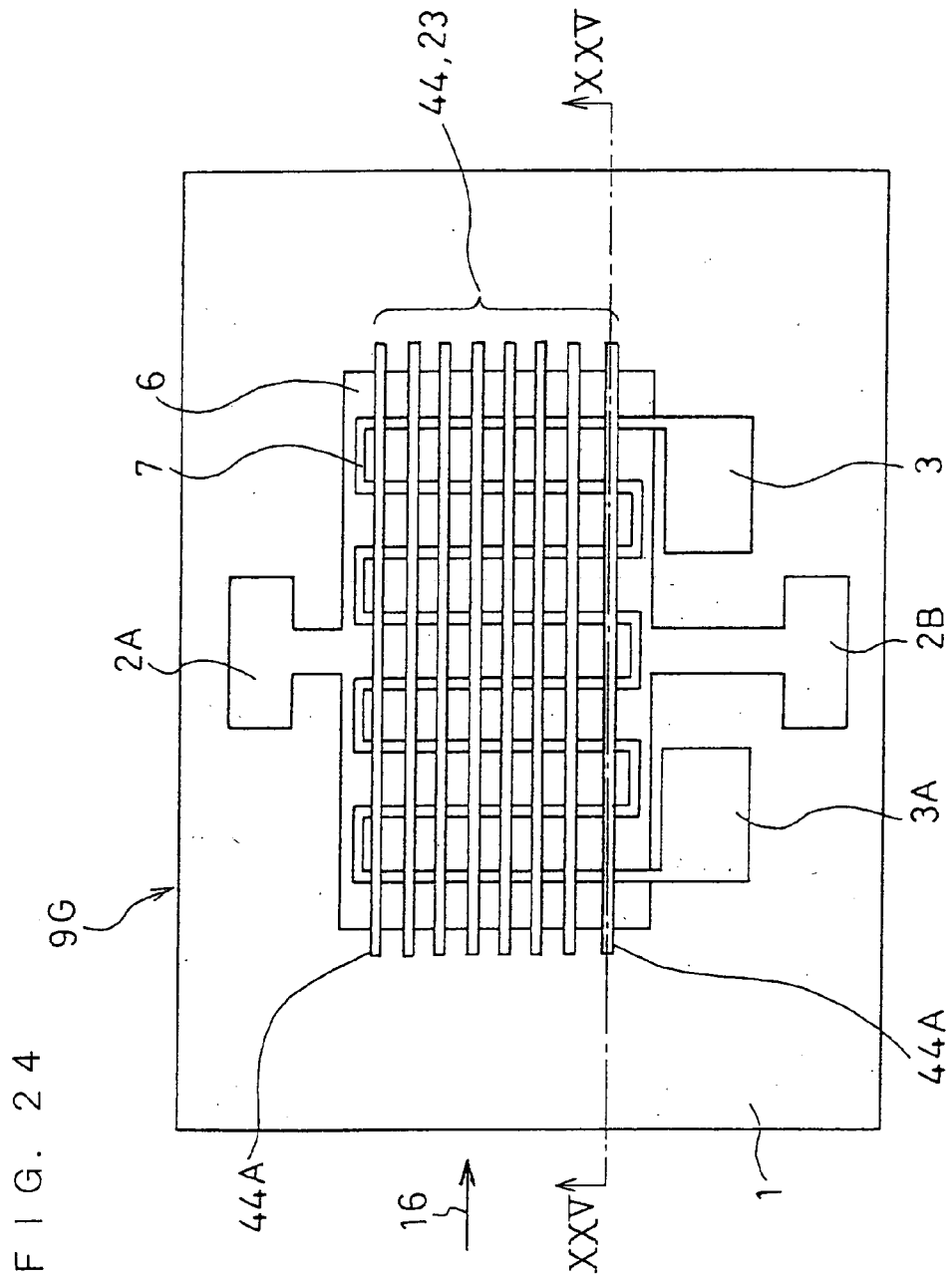

FIG. 24 is a plane view of the magnetic sensor of a seventh embodiment in the present invention.

Figure 25:
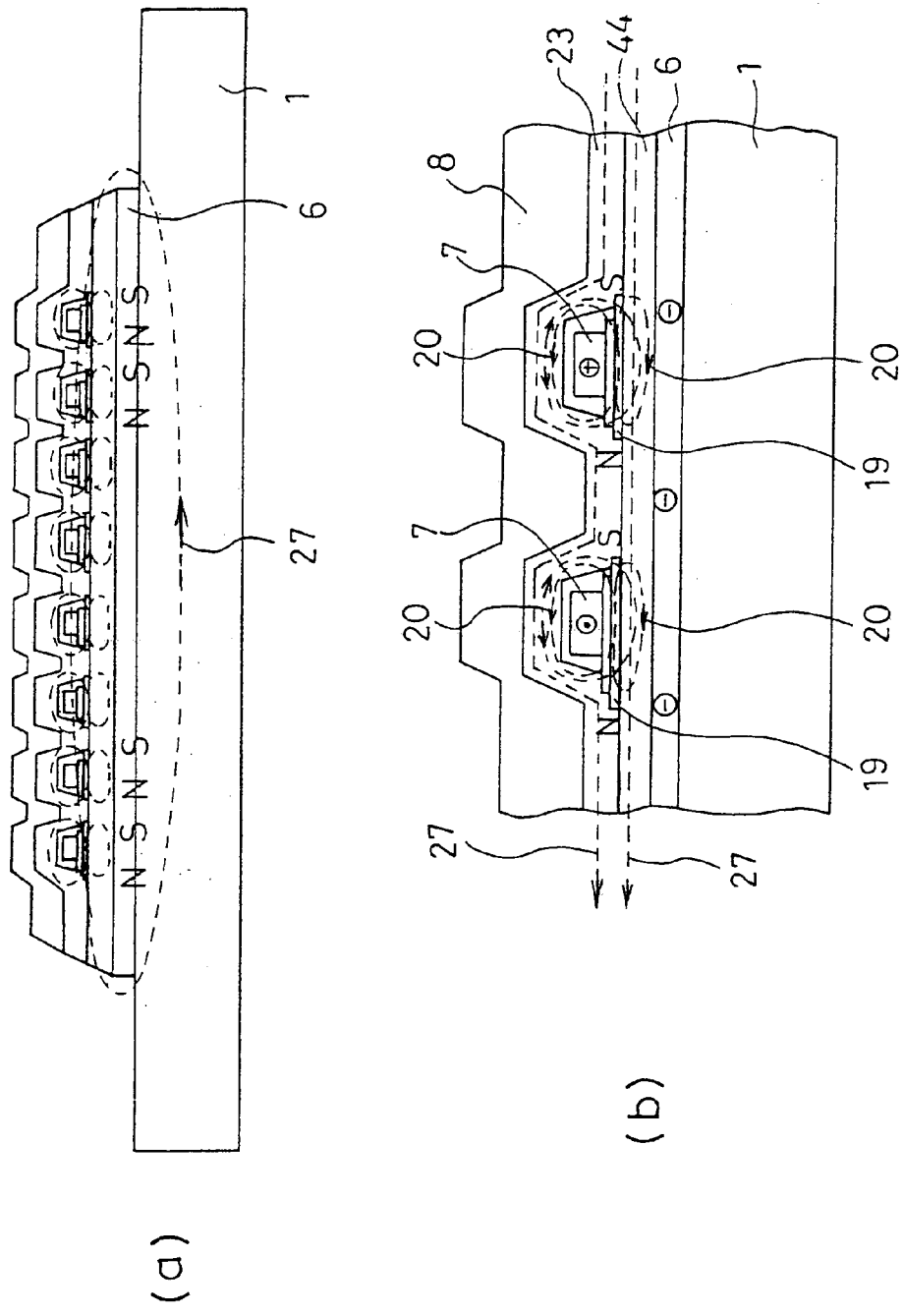

Part (a) of FIG. 25 is a cross-sectional view of the magnetic sensor of the seventh embodiment in the present invention.

Part (b) of FIG. 25 is an enlarged fragmentary view of the right end portion of part (a) of FIG. 25.

Figure 26:
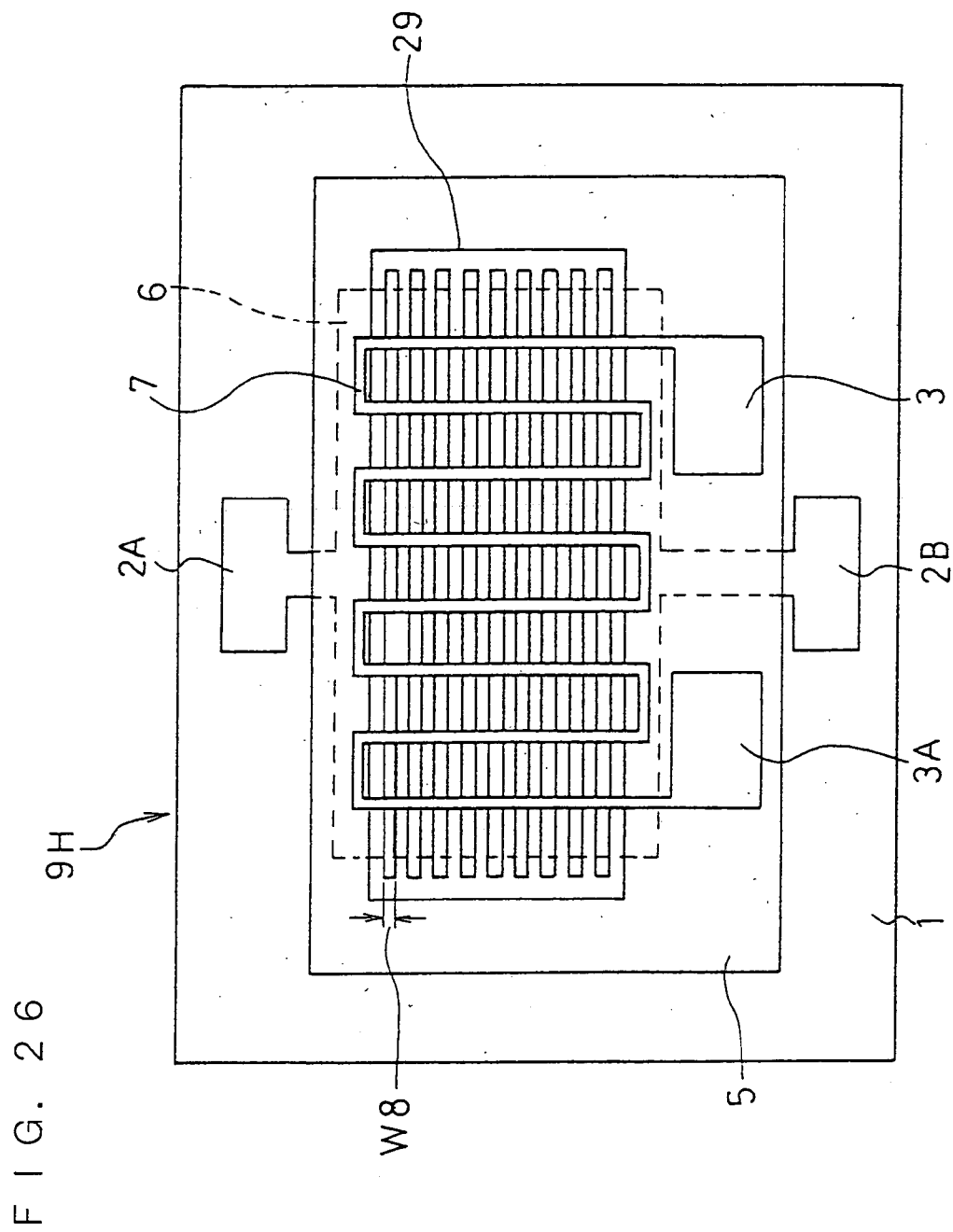

FIG. 26 is a plane view of the magnetic sensor of an eighth embodiment in the present invention.

Figure 27:
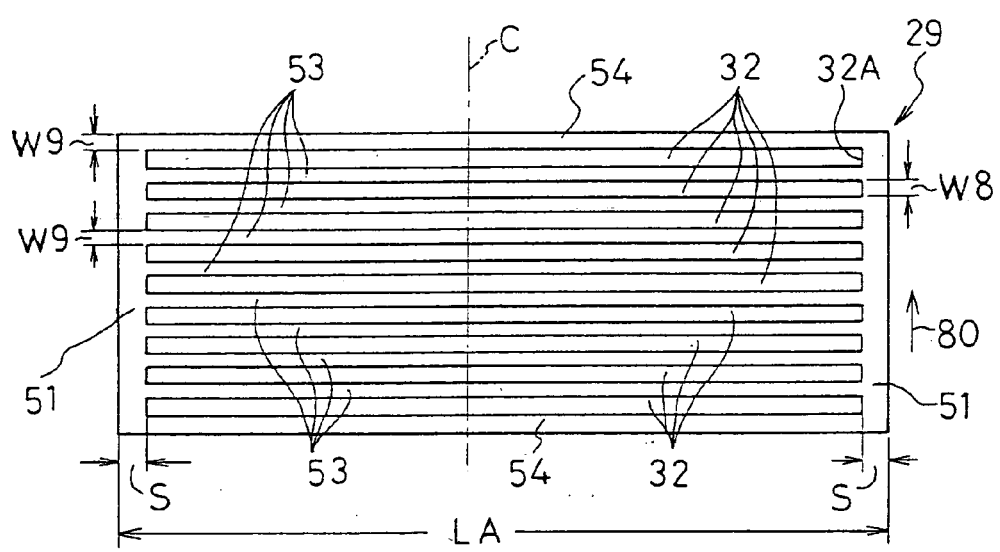

FIG. 27 is a plane view of the soft magnetic film in the magnetic sensor of the eighth embodiment in the present invention.

Figure 28:
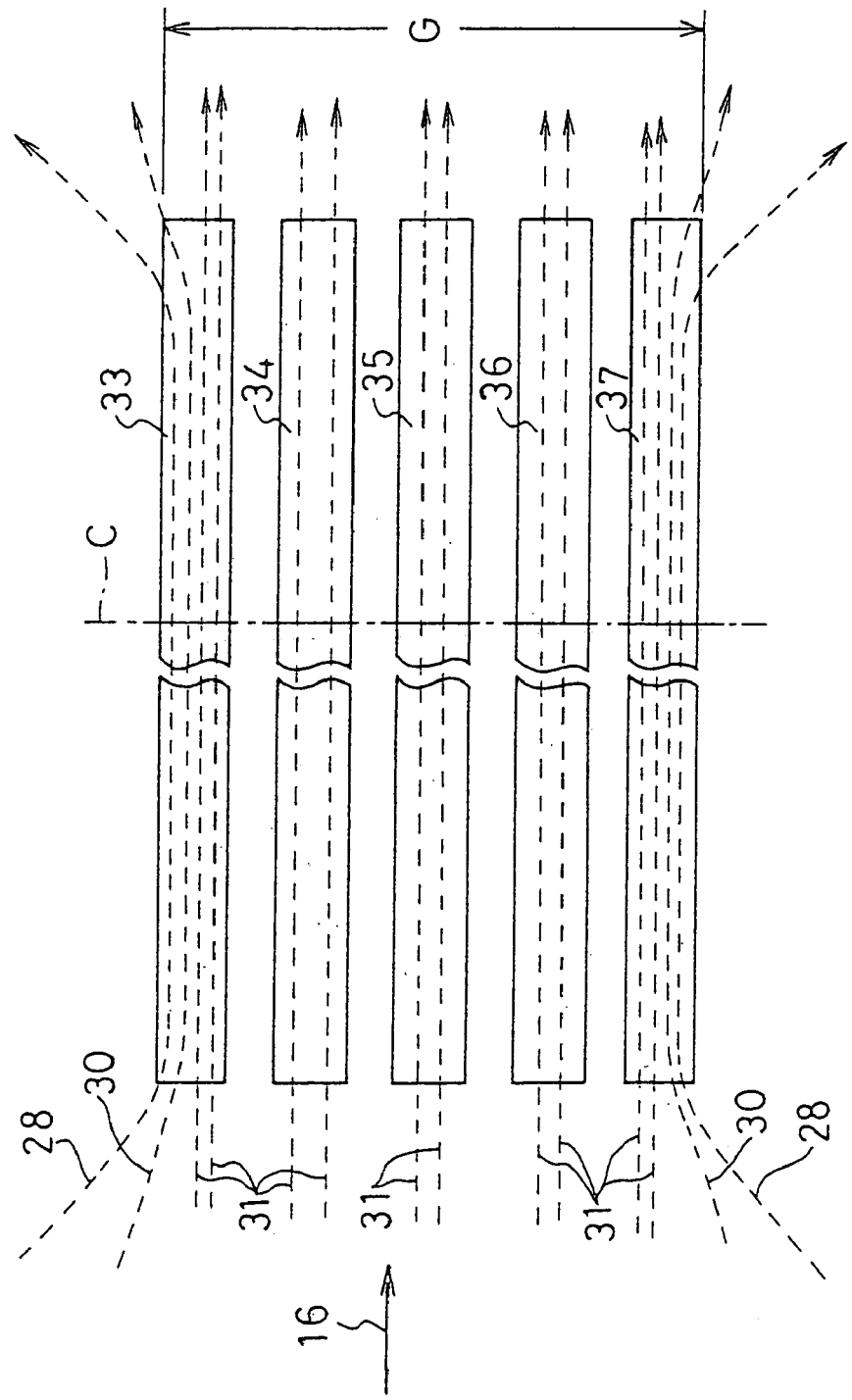

FIG. 28 is a plane view for describing a problem of the soft magnetic films of the above-mentioned second embodiment to seventh embodiment.

Figure 29:
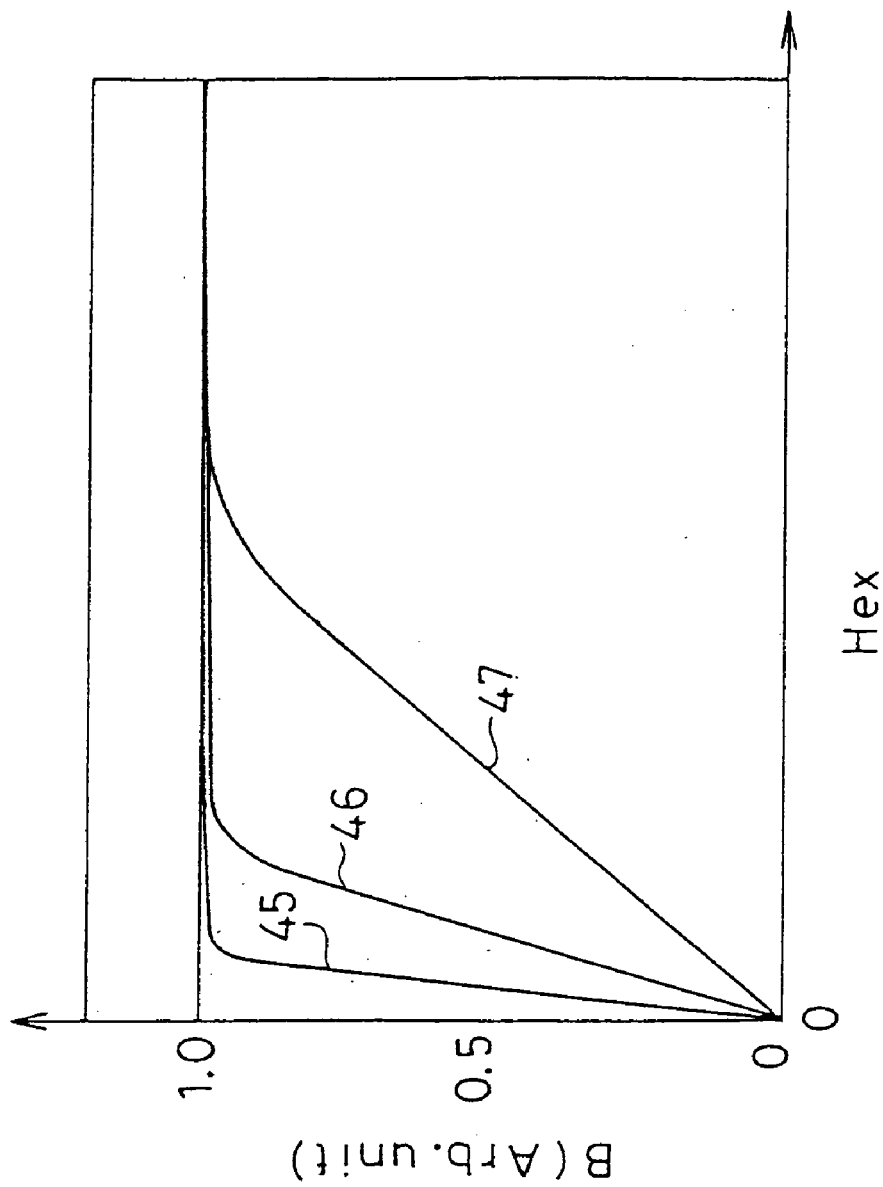

FIG. 29 is a graph showing a relation of the external magnetic field and the magnetic flux density of the soft magnetic film in FIG. 28.

Figure 30:
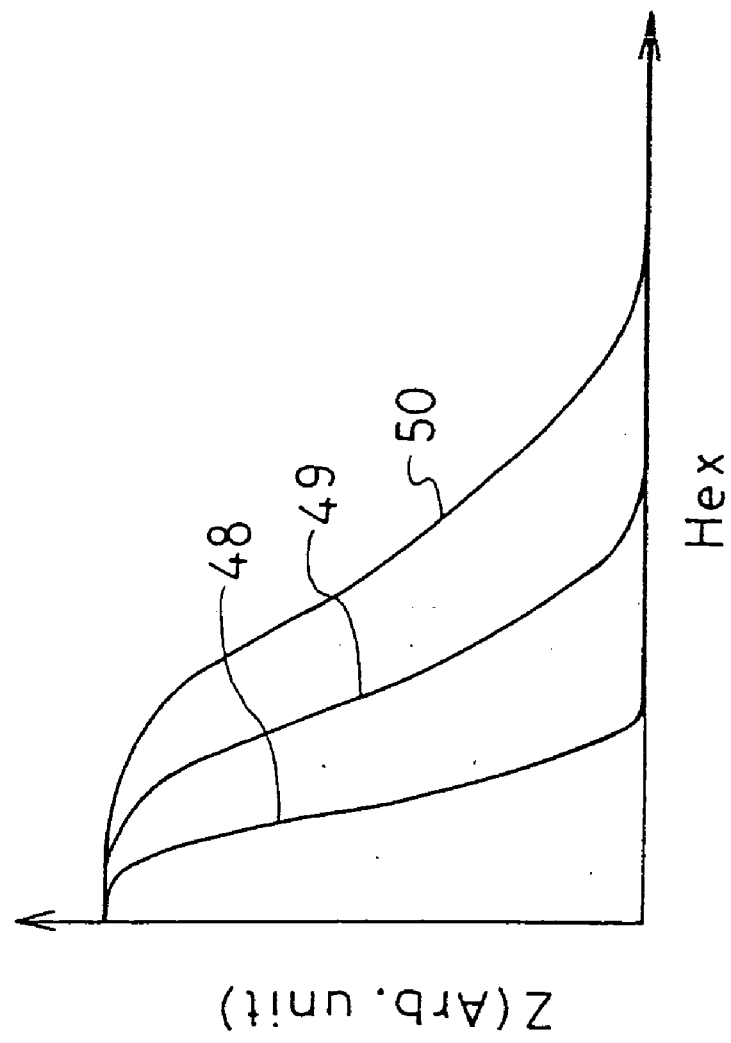

FIG. 30 is a graph showing a relation of the external magnetic field and the impedance in the soft magnetic film in FIG. 28.

Figure 31:
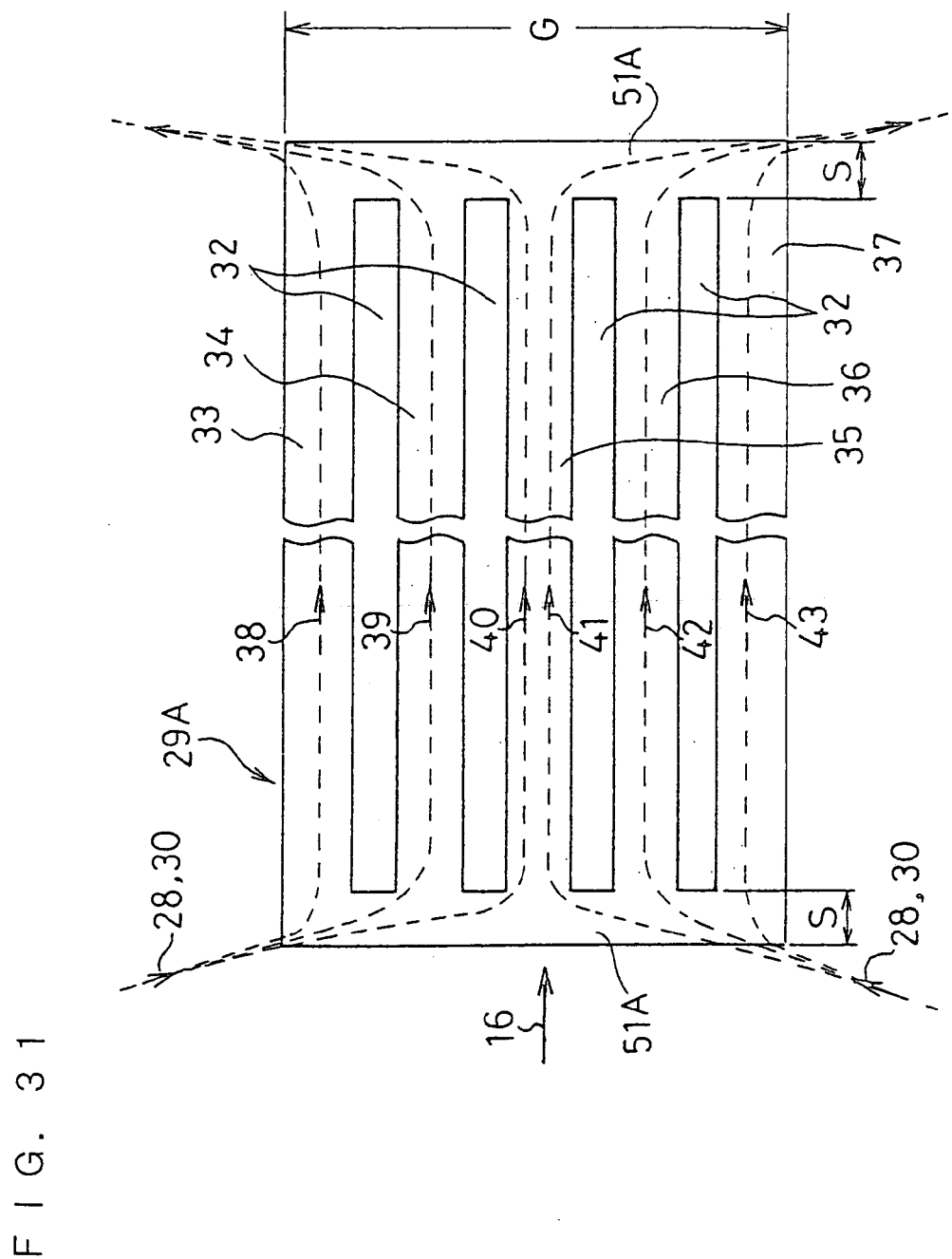

FIG. 31 is a plane view showing a magnetic flux in the soft magnetic film of the present embodiment.

Figure 32:
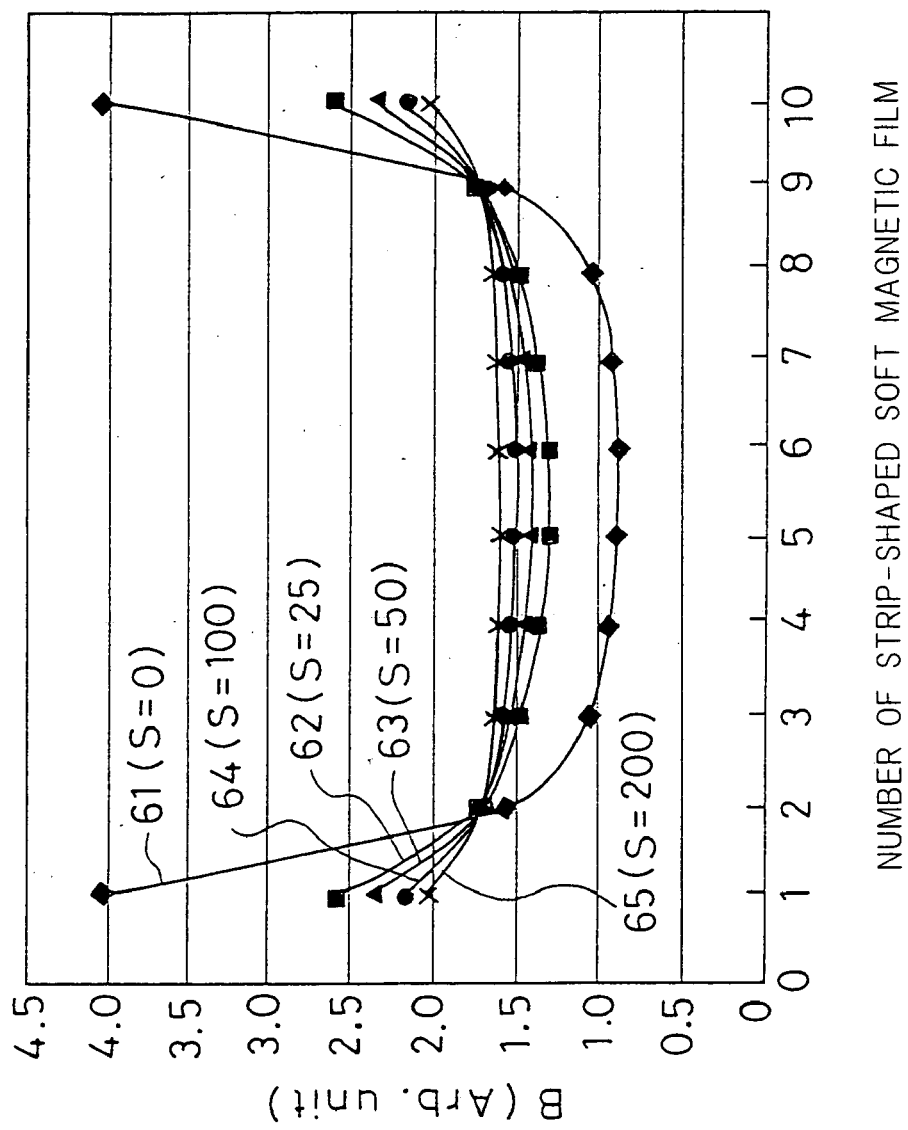

FIG. 32 is a graph showing the change of the magnetic flux density of the soft magnetic film in the present embodiment when a dimension S is changed.

Figure 33:
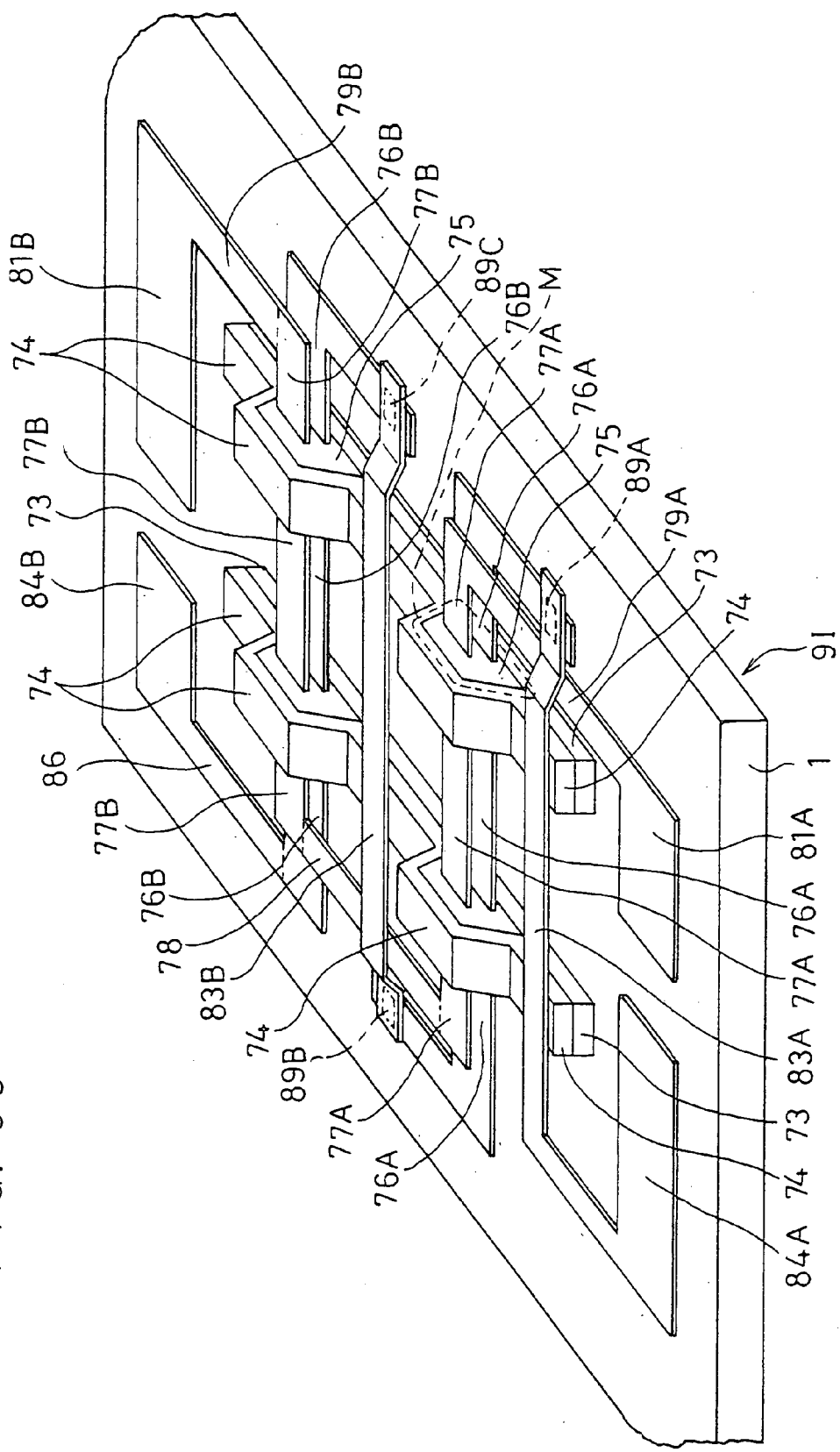

FIG. 33 is a perspective view of the magnetic sensor of a ninth embodiment in the present invention.

Figure 34:
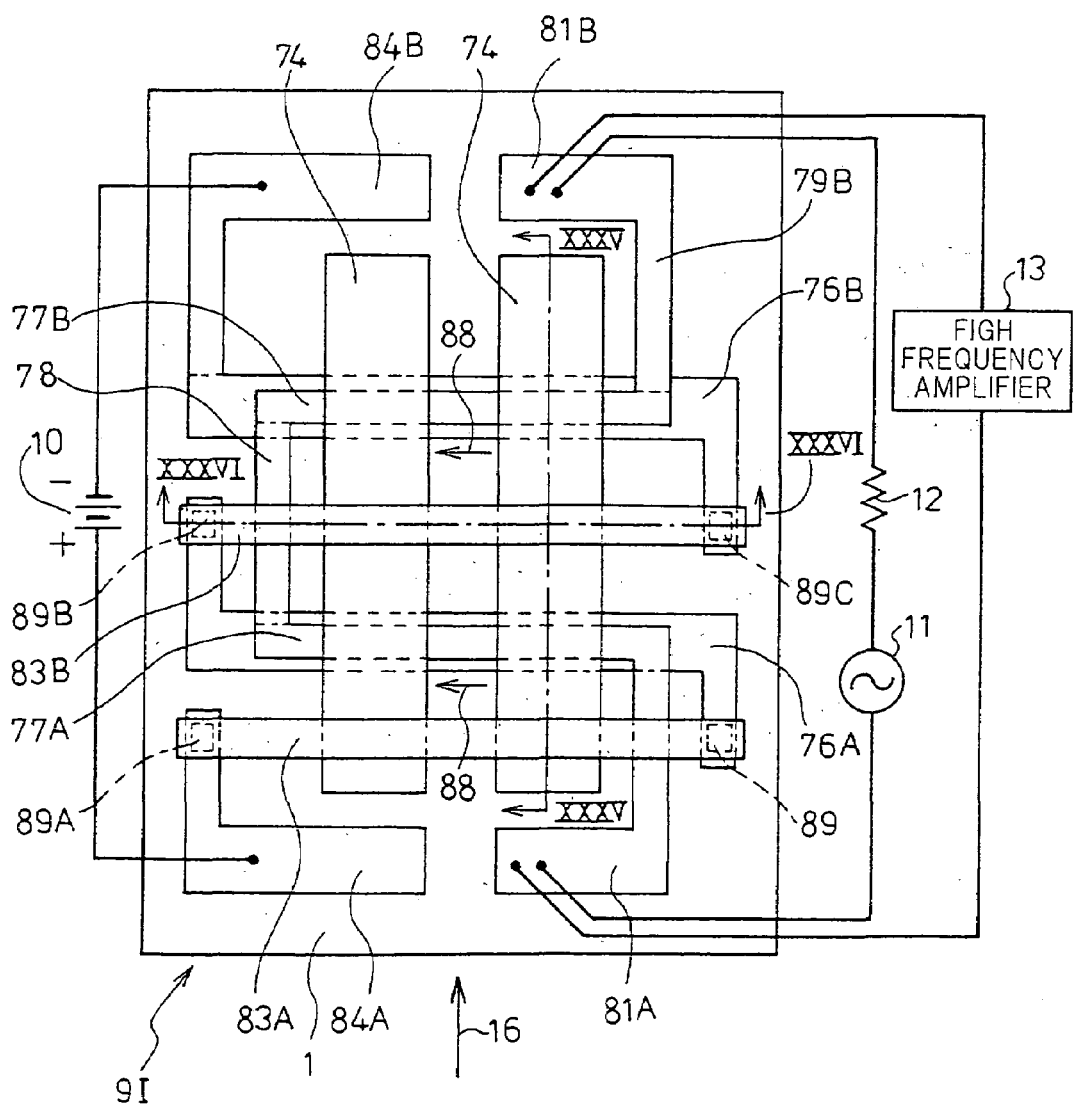

FIG. 34 is a plane view of the magnetic sensor of the ninth embodiment in the present invention.

Parts (a) to (d) of FIG. 35 are cross-sectional views taken along the line XXXV—XXXV in the longitudinal direction of the soft magnetic film, showing a fabricating process of the magnetic sensor of the ninth embodiment in the present invention.

Parts (a) to (d) of FIG. 36 are cross-sectional views taken along the line XXXVI—XXXVI in the perpendicular direction to the longitudinal direction of the soft magnetic film, showing a fabricating process of the magnetic sensor of the ninth embodiment in the present invention.

Figure 37:
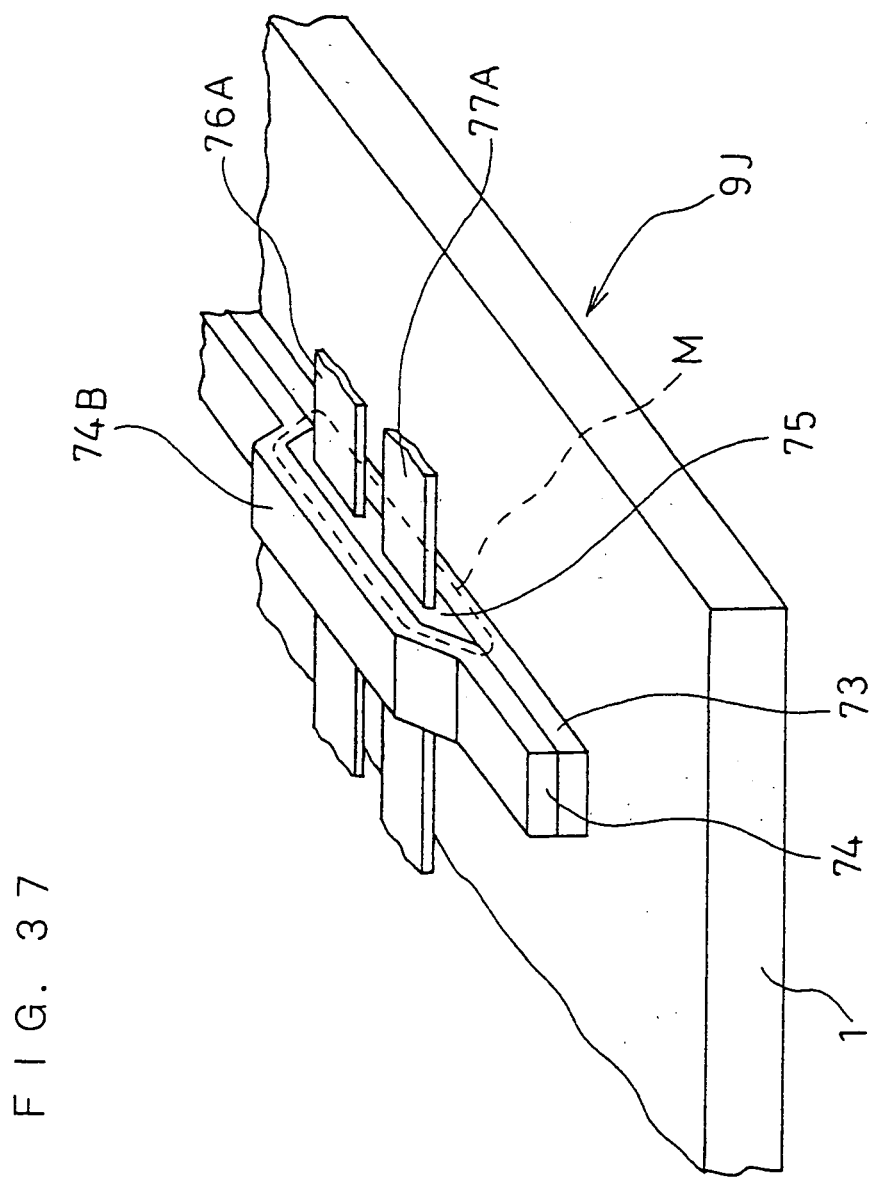

FIG. 37 is a partial perspective view of the magnetic sensor of a tenth embodiment in the present invention.

Figure 38:
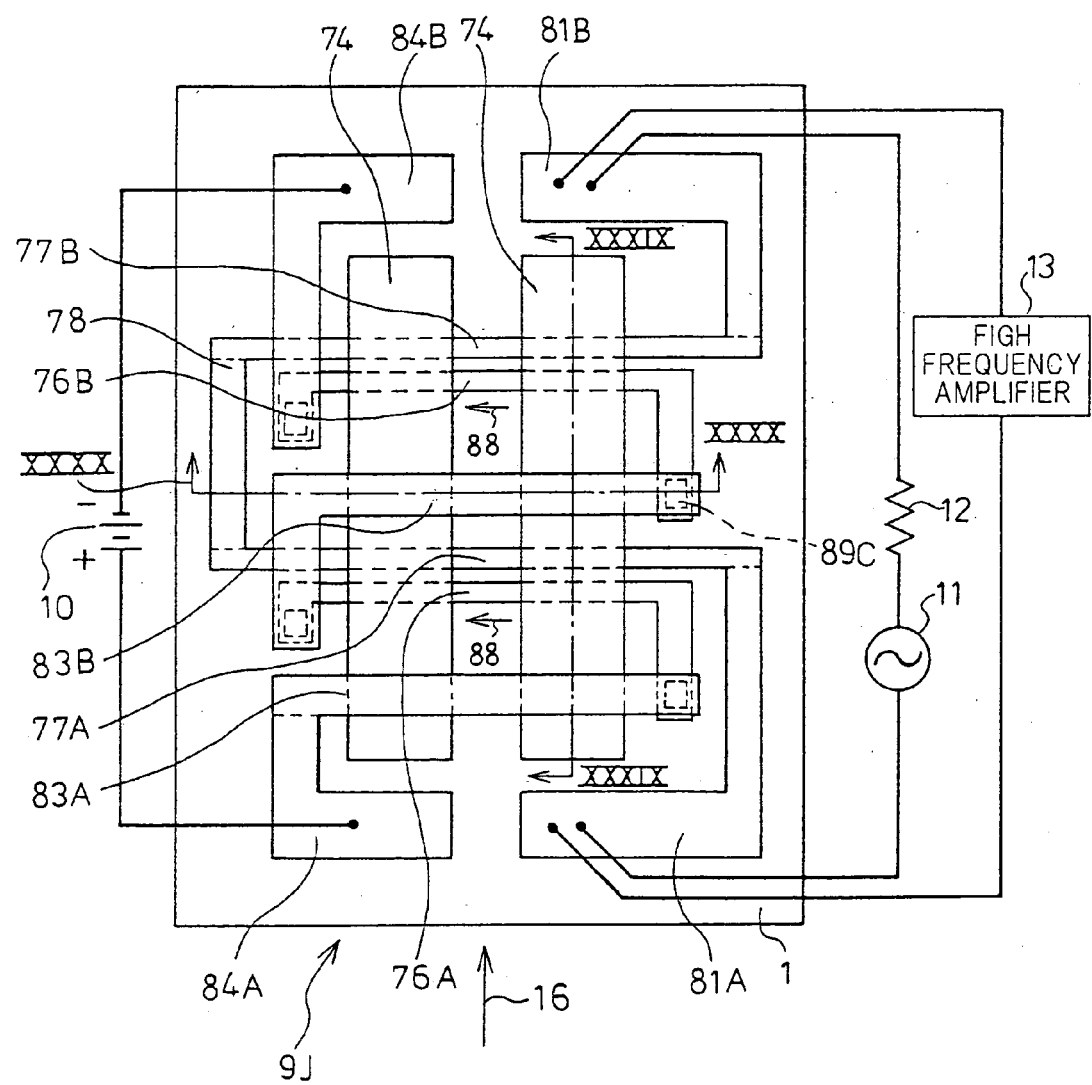

FIG. 38 is a plane view of the magnetic sensor of the tenth embodiment in the present invention.

Parts (a) to (d) of FIG. 39 are cross-sectional views taken along the line XXXIX—XXXIX in the longitudinal direction of the soft magnetic film, showing a fabricating process of the magnetic sensor of the tenth embodiment in the present invention.

Parts (a) to (d) of FIG. 40 are cross-sectional views taken along the line XXXX—XXXX in the perpendicular direction to the longitudinal direction of the soft magnetic film, showing a fabricating process of the magnetic sensor of the tenth embodiment in the present invention.

Parts (a) and (b) of FIG. 41 are cross-sectional views for describing the magnitude of a direct current bias magnetic field which depends on the positional relation of the soft magnetic film and a conductive nonmagnetic film producing a direct current bias magnetic field.

Part (a) of FIG. 42 is the perspective view of the magnetic sensing element utilizing a magnetic impedance effect in the prior art.

Part (b) of FIG. 42 is the partially enlarged view of the soft magnetic core 105, 106 of the magnetic sensing element in the prior art.

Figure 43:
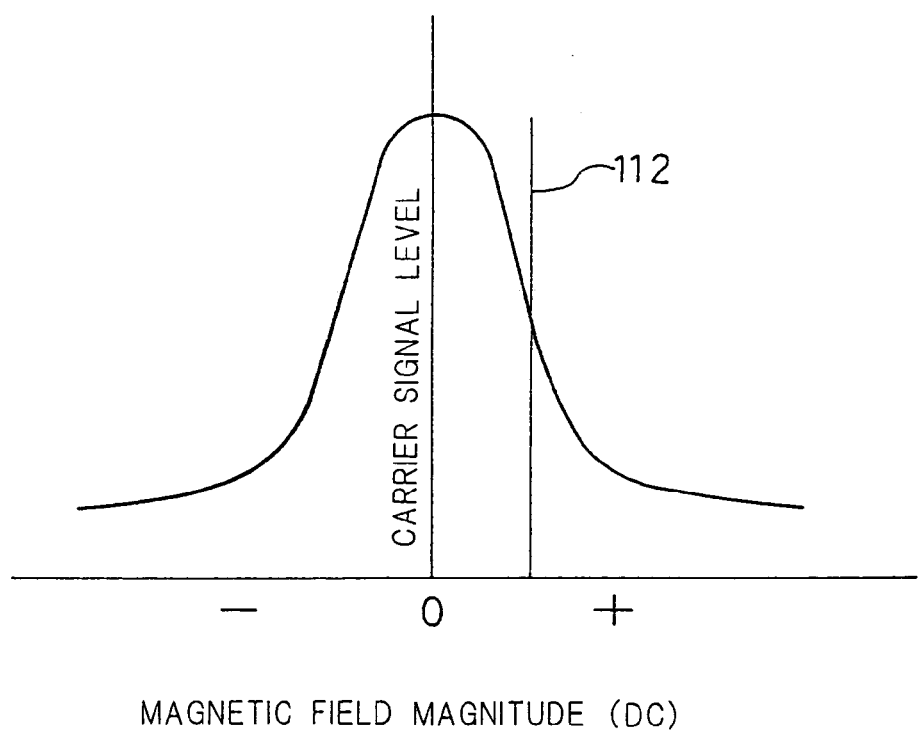

FIG. 43 is the graph showing a characteristic of the magnetic sensing element in the prior art.

BEST MODE FOR CARRYING OUT THE INVENTION

Hereinafter, preferred embodiments of the magnetic sensor in the present invention are described with reference to FIG. 1 to FIG. 41.

<<First Embodiment>>

Description is made as to a magnetic sensor 9 of a first embodiment in the present invention with reference to FIG. 1 to FIG. 7.

Figure 2:
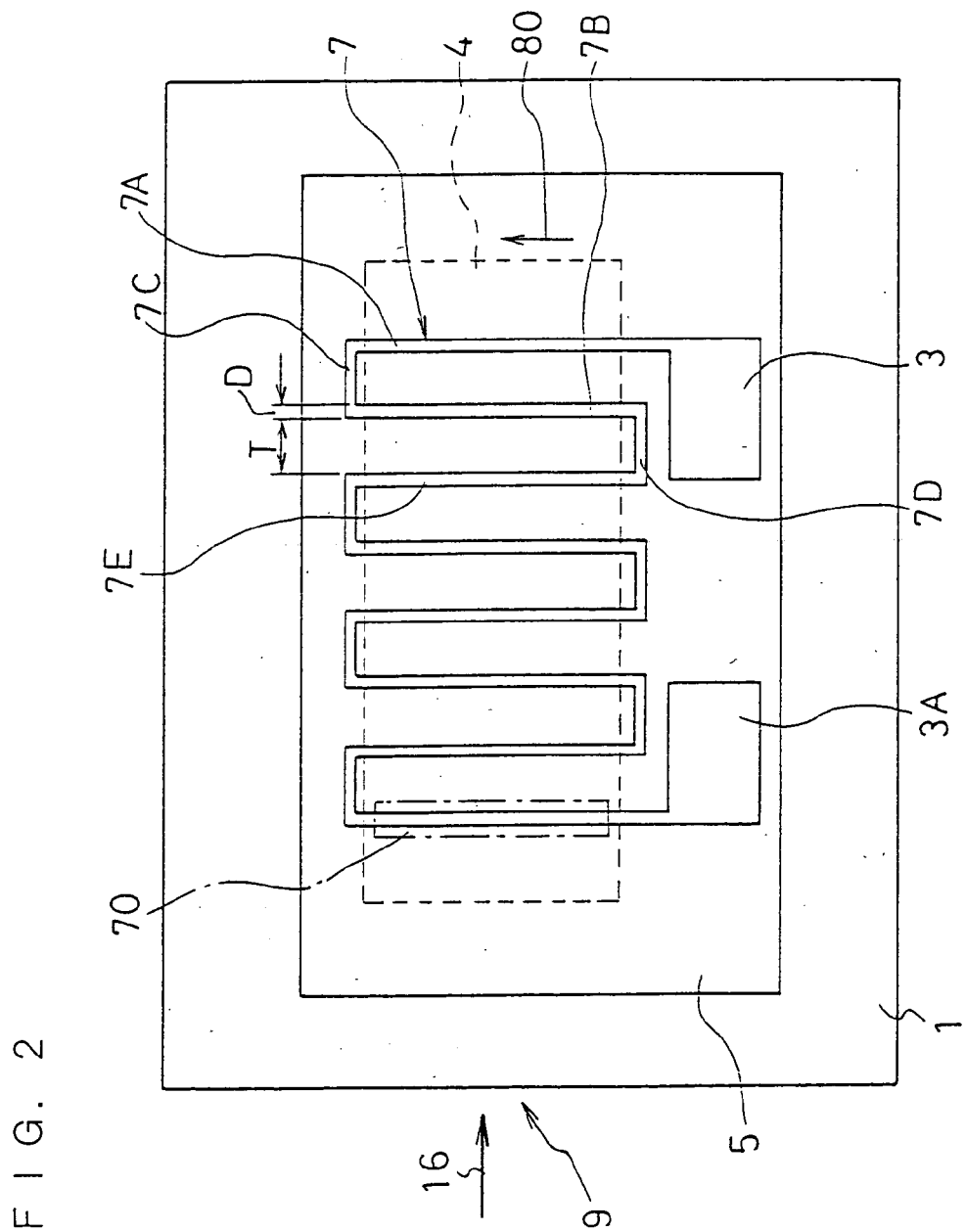
FIG. 2 is a plane view showing a state in which a conductive film 6 is removed from the magnetic sensor in FIG. 1.

FIG. 1 is a plane view of the magnetic sensor 9 of the first embodiment in the present invention. FIG. 2 shows a plane view in a situation in which a conductive film 6 of copper (Cu) for applying a direct current bias magnetic field in FIG. 1 is removed in order to facilitate the understanding of inside structure. In order to avoid complication of the figures and to facilitate understanding, in all plane views including FIG. 1 and FIG. 2, depressions and projections existing on the surfaces are omitted from illustration. Part (a) of FIG. 3 is a cross-sectional view taken along the line III—III in FIG. 1, and part (b) of FIG. 3 is an enlarged fragmentary cross-sectional view of part (a) of FIG. 3. In cross-sectional views, in order to avoid complication of figures, cross-sections are not hatched.

In FIG. 1, FIG. 2, part (a) of FIG. 3 and part (b) of FIG. 3, a soft magnetic film 4 of Fe—Ta—N of 1 µm thick is formed at a central region on a nonmagnetic substrate 1. For example, ceramic including NiO of an oxide of Nickel, $TiO_2$ of an oxide of Titan and MgO of an oxide of Magnesium (hereinafter is referred to as Ni—Ti—Mg) is suitable for the nonmagnetic substrate 1. The soft magnetic film 4 is formed so as to have the easy axis of magnetization in the direction of arrow 80 which is along with the film face. An insulation film 5 of $SiO_2$ of 0.1 µm thick is formed on the soft magnetic film 4. A conductive nonmagnetic film 7 of meander shape (zigzag shape) of 1 µm thick Cu having electrode terminals 3 and 3A at either end as shown in FIG. 2 is formed on the insulation film 5. The lengths of conductive nonmagnetic films 7A and 7B which are parts parallel to the direction of the arrow 80 in the conductive nonmagnetic film 7 of meander type are made longer than the lengths of conductive nonmagnetic films 7C and 7D which are parts perpendicular to the direction of the arrow 80. In FIG. 2, the lengths of the conductive nonmagnetic films 7A and 7B are made longer than the length of the soft magnetic film 4 in the direction of the arrow 80 so that the conductive nonmagnetic films 7C and 7D protrude outward from the soft magnetic film 4. In part (a) of FIG. 3, the conductive nonmagnetic film through which a current flows from front side to back side of the paper face is designated as 7A, and the conductive nonmagnetic film through which the current flows in the opposite direction thereof is designated as 7B.

Subsequently, a protection film 8 of $SiO_2$ of 10 µm thick is formed on the insulation film 5 including the conductive nonmagnetic film 7 as shown in part (a) of FIG. 3. A conductive film 6 having electrodes 2A and 2B at either end part as shown in FIG. 1 is formed on the protection film 8. The size of the conductive film 6 is about the same as the size of the soft magnetic film 4. A film of a stable metal such as gold (Au) of about 4 µm thick is formed on the electrodes 2A and 2B of the conductive film 6 and connection parts of the electrodes 2A, 2B and the conductive film 6 so as to provide a large current capacity. Incidentally, the above-mentioned electrodes 3 and 3A may be made thick in a similar manner.

The negative (output) end and the positive end of the direct current source 10 are connected to the electrodes 2A and 2B of the conductive film 6, respectively, and a direct current is caused to flow through the conductive film 6. A constant current high frequency source 11 including a high frequency oscillator of 10 MHz–20 MHz of frequency is connected to the electrode terminals 3 and 3A of the conductive nonmagnetic film 7 through a resistor 12, and a high frequency current of a constant current is caused to flow. Furthermore, respective input terminals of a high frequency amplifier 13 including an AM detector are connected to the electrode terminals 3 and 3A. As shown in part (a) of FIG. 3 and part (b) of FIG. 3, the direct current flows through the conductive film 6 perpendicularly to the paper face from its front side to the back side. In the right and left parts of the figure, the widths of the conductive film 6 are made approximately equal to the width of the soft magnetic film 4, and therefore, a direct current magnetic field shown by arrow 14 indicated by dotted line is produced around the conductive film 6. A magnetic flux passes from the right end to the left end of the soft magnetic film 4 due to the direct current magnetic field 14 as shown in expanded scale in part (b) of FIG. 3, and affects as a direct current bias magnetic field ($H_{bias}$) to the soft magnetic film 4.

A high frequency carrier current of a constant current supplied from the high frequency power source 11 flows through the conductive nonmagnetic film 7 of meander type. Part (b) of FIG. 3 shows an instant at which a current flows through the cross section 7A of the conductive nonmagnetic film 7 in the direction perpendicular to the paper face from front side to back side, and the current flows through the cross section 7B of the conductive nonmagnetic film 7 in the opposite direction thereof. Since this current is an alternating current at a high frequency of the above-mentioned 10 MHz–20 MHz, this current produces an alternating magnetic field alternately inverting the direction every half cycle of the alternating current in crock wise and counter crock wise as shown by respective arrows 15. The impedance of the conductive nonmagnetic film 7 with respect to the high frequency current is determined according to the alternating current magnetic field and the direct current bias magnetic field shown by the arrow 14.

As shown in FIG. 1 and FIG. 2, an external magnetic field Hex (hereinafter is referred to as external magnetic field Hex 16) which is in the direction shown by an arrow 16 and is an object to be measured is applied to the soft magnetic film 4 of the magnetic sensor 9 in the longitudinal direction. A permeability of the soft magnetic film 4 to which the direct current bias magnetic field is applied varies corresponding to the magnitude of this external magnetic field Hex 16. As a result, the impedance of the conductive nonmagnetic film 7 varies. Consequently, a high frequency voltage which is the product of the high frequency current and the impedance is generated across the electrode terminals 3 and 3A. The high frequency voltage is a signal of which the high frequency carrier signal is amplitude-modulated corresponding to the magnitude of the external magnetic field Hex 16. Detection signal of the external magnetic field Hex 16 is obtained by AM detection and amplification of the amplitude-modulated signal with a high frequency amplifier 13. The magnetic fields produced by the high frequency current flowing through the conductive nonmagnetic films 7A and 7B spread partly into other regions, but the major part is concentrated locally to the soft magnetic film 4 at respective lower regions as shown by the arrow 15 in part (b) of FIG. 3. Therefore, a high frequency magnetic field which is superimposed on the direct current bias magnetic field is produced in the regions of the soft magnetic film 4 opposing to the conductive nonmagnetic films 7A and 7B. There are a plurality of opposing regions of the soft magnetic film 4 and the conductive nonmagnetic film 7 (8 regions in FIG. 2), and therefore, the impedance due to mutual inductance between mutually opposing regions increases with the increase of number (n) of the opposing regions. The impedance can be adjusted by changing film width D and interval T between the neighboring conductive nonmagnetic films 7B and 7E.

In FIG. 2, when impedance arising in the conductive nonmagnetic film 7 at one opposing region 70 of the soft magnetic film 4 and the conductive nonmagnetic film 7 is provided as Z0, then in the case that the number (n) of the opposing regions is two as shown in part (b) of FIG. 3, when the direct current bias magnetic field is $H_{bias}$ as shown by FIG. 4, the impedance value is 2×Z0. FIG. 5 is a plane view showing a situation in which the rectangular-shaped soft magnetic film 4 of Fe—Ta—N of a width W is placed in the external magnetic field Hex 16 to be measured. As a result of investigation of demagnetization field produced in the soft magnetic film 4 of FIG. 5, it is found that the magnitude of the demagnetization field is changed depending on the shape of the soft magnetic film 4. FIG. 6 is a graph of measurement result of a relation between a magnetic flux density B (axis of ordinates) on a center line c–d of the soft magnetic film 4 and an external magnetic field Hex (axis of abscissas) by changing a dimensional ratio L/W of the soft magnetic film 4 shown in FIG. 5. A film of Fe—Ta—N which is 1 μm in thickness t and has the easy axis of magnetization in the direction of width W is used for the soft magnetic film 4. When the direction of the external magnetic field Hex is in coincident with the direction of the hard axis of magnetization perpendicular to the easy axis of magnetization of the soft magnetic film 4, rotation of magnetization is smoothly carried out and a high permeability is achieved. Therefore, as shown in FIG. 6, the larger the value of the dimensional ratio L/W becomes, the higher the magnetic flux density B becomes even in a weak external magnetic field Hex 16. This is considered to be the influence of demagnetization field which is produced depending on the shape of the soft magnetic film 4 as is well known in the electromagnetics. FIG. 7 is a graph of measurement of the relation of a magnetic flux density B on the centerline c–d of the soft magnetic film 4 and to the external magnetic field Hex to be measured by setting the dimensional ratio L/W to 1 and changing the thickness t of the soft magnetic film 4 which is a parameter. In the case of measuring geomagnetism about 0.3 Oe or below (24 A/m in SI unit system) in the magnitude as the external magnetic field Hex, it is preferable that the thickness of the soft magnetic film 4 is 1 μm and below, and the dimensional ration L/W is 5 or more when influence of the demagnetization field is considered. The magnitude of the demagnetization field become small with reduced thickness of the soft magnetic film 4 and with increased dimensional ratio L/w.

As shown in FIG. 7, the thinner the soft magnetic film 4 is, the higher the magnetic flux density B achieved is, even in a weak external magnetic field. According to FIG. 7, in the case that the value of the dimensional ratio L/W is set to 1, the thickness of the soft magnetic film 4 is preferably 0.2 μm and below. However, in the case that the thickness t of the soft magnetic film 4 is excessively thin, the impedance of the conductive nonmagnetic film 7 becomes small at a high frequency. Accordingly, as a result of conducting various experiments by the inventors, the above-mentioned dimensional ratio L/W is set to 10 or more, and the thickness t of the soft magnetic film 4 is set to 3 μm and below. By setting in this manner, it is found that the geomagnetism on the order of 0.3 Oe (24 A/m) can be detected with a high sensitivity. Consequently, a magnetic sensor having a high sensitivity is obtainable by setting the film thickness of the soft magnetic film 4 to 3 μm and below in the magnetic impedance element using a high frequency carrier signal of a relatively low frequency on the order of 10 MHz to 20 MHz. Since a low frequency carrier signal can be used, error due to the length of lead wires to the sensor or the change of shape thereof is reduced.

<<Second Embodiment>>

A magnetic sensor of the second embodiment in the present invention is described with reference to FIG. 8 to FIG. 12.

In the case that the frequency of the high frequency carrier signal applied to the magnetic sensor utilizing the magnetoimpedance effect is relatively low, in which carrier frequency is from 10 MHz to 20 MHz, the impedance of the conductive nonmagnetic film 7 of the above-mentioned magnetic sensor 9 in FIG. 1 is given principally by the product of the above-mentioned frequency and inductance of the conductive nonmagnetic film 7. Accordingly, in the present embodiment, the demagnetization field of the soft magnetic film 4 of the above-mentioned first embodiment is reduced, thereby to increase the inductance of the conductive nonmagnetic film 7, such that the impedance changes become large even with a weak magnetic field such as geomagnetism.

FIG. 8 is a plan view of a magnetic sensor of the second embodiment. Referring to the figure, a plurality of narrow strip-shaped soft magnetic films 44 of Fe—Ta—N, of which the dimensional ratio L/W is selected such a large value of 10 or more in order to reduce the demagnetization field, which has been explained in the first embodiment, are formed on a nonmagnetic substrate 1 of Ni—Ti—Mg. The plural strip-shaped soft magnetic films 44 which are parallel arranged correspond to the soft magnetic film 4 in the first embodiment. The soft magnetic films 44 have the easy axis of magnetization in a width direction (arrow 80) which is along with the film face. As shown in FIG. 9, a meander-shaped conductive nonmagnetic film 7 orthogonal to the soft magnetic films 44 is formed on the soft magnetic films 44 with an insulation film 5 therebetween. Referring to FIG. 9, the soft magnetic films 44 are placed under the insulation film 5, and the conductive nonmagnetic film 7 is placed on the insulation film 5. As shown in FIG. 8, a conductive film 6 of the same material and shape as that in FIG. 1 is formed on the conductive nonmagnetic film 7 and the insulation film 5, and thereby the magnetic sensor 9A is configured. FIG. 9 shows a plan view in the state with the conductive film 6 of FIG. 8 removed to facilitate an understanding of the configuration of the conductive nonmagnetic film 7. A cross-sectional view taken along the line III—III in FIG. 8 is substantially the same as part (a) of FIG. 3.

According to the magnetic sensor 9A of the present embodiment, the demagnetization field generated in the soft magnetic films 44 considerably decreases in comparison with that in the soft magnetic film 4 in FIG. 1. The number of opposing parts 70A, at which each of the soft magnetic films 44 faces the conductive nonmagnetic film 7, is increased by increasing the number of the soft magnetic films 44. As a result, there is the characteristic in that the impedance value becomes large in comparison with the configuration of FIG. 1 and a large impedance change is obtainable.

FIG. 10 is a plan view of a magnetic sensor 9B of a configuration in other example of the second embodiment. In this configuration, as shown by part (a) of FIG. 11, and part (b) of FIG. 11 which is an enlarged cross-sectional view of part (a) of FIG. 11, first, the conductive film 6 for applying a direct current bias magnetic field is formed on the nonmagnetic substrate 1 of Ni—Ti—Mg. The soft magnetic films 44 are formed on the conductive film 6 with a $SiO_2$ film 21 therebetween. The insulation film 5 is formed on the soft magnetic films 44 and the $SiO_2$ film 21. The meander-shaped conductive nonmagnetic film 7 is formed on the insulation-film 5. An insulation film 8 of $SiO_2$ of about 1 μm thick is formed on the insulation film 5 including the conductive nonmagnetic film 7 as a protection film. In the configuration of part (a) of FIG. 11, the forming of the conductive film 6 is easy in fabrication, and furthermore, the surface of the conductive film 6 is flat because the conductive film 6 is formed on a flat surface of the nonmagnetic substrate 1, and thus a sufficient insulation is maintained even if the insulation film 21 formed on the flat surface is made considerably thin. Consequently, the distance between the conductive film 6 and the soft magnetic films 44 is made small, and strong bias magnetic field generated by the conductive film 6 as shown by arrow 14 indicated by dotted line is applied to the soft magnetic films 44. As a result, a direct current flowing-through the conductive film 6 can be reduced compared with that of the configuration of FIG. 1. In other words, there is a feature that a power consumption of the direct current bias power source 10 can be reduced.

FIG. 12 is a graph showing a relation of the impedance Z of the conductive nonmagnetic film 7 and an external magnetic field Hex using the width W1 (FIG. 10) of the soft magnetic films 44 as parameter. Curves C1, C2 and C3 are graphs in the case that the width W1 is 10 μm, 100 μm and 400 μm, respectively. The impedance Z is shown by normalizing with an impedance value of the case that the external magnetic field Hex to be measured is zero. The thickness of the soft magnetic films 44 is 3 μm, and the length L thereof is 1 mm. The measurement is carried out by placing the magnetic sensor 9B in the external magnetic field. As a result, as shown in FIG. 12, it is found that the smaller the width W1 of the soft magnetic films 44 is, the larger an impedance change is even in a weak external magnetic field Hex to be measured. In the measurement of geomagnetism which is weak in the magnitude of the magnetic field, those of the curves C1 and C2 (width W1 is 10 μm or 100 μm) are adequate. That of the curve C3 is inferior in sensitivity, and was not suitable to detect the geomagnetism. By the above-mentioned result, it was found that a desirable width W1 of the soft magnetic films 44 is 100 μm and below, the dimensional ratio L/W1 is 10 or more. The film thickness and the film width of the conductive nonmagnetic film 7 of meander type are set to 1.0 μm and 10 μm, respectively. As a concrete example of the magnetic sensor in the second embodiment, it is desirable that a length K and a width T of the conductive nonmagnetic film 7 are 1 mm and 100 μm, respectively, and the width W1 of the soft magnetic films 44 is 40 μm, the length L thereof is 1 mm.

In the present embodiment, a plurality of soft magnetic films 44 of which the dimensional ratio L/W1 is 10 or more and the film thickness is 3 μm and below are opposed to the conductive nonmagnetic film 7 of meander type. Consequently, even in the case of the use of a relatively low carrier frequency of 10 MHz–20 MHz, the impedance change of the conductive nonmagnetic film 7 due to the external magnetic field can be greatly increased. As mentioned above, since a carrier signal of a low frequency can be used, errors due to the change of the length and the shape of electric wires to the sensor can be reduced.

<<Third Embodiment>>

A magnetic sensor 9C of the third embodiment in the present invention is described with reference to FIG. 13 to FIG. 15.

FIG. 13 is a plan view of the magnetic sensor 9C of the third embodiment in the present invention, and part (a) and part (b) of FIG. 14 are cross-sectional views taken along the line XIV—XIV in FIG. 13. In part (a) of FIG. 14 and part (b) of FIG. 14 of an enlarged fragmentary cross-sectional view, a film 18 including Cobalt (Co) and Platinum (Pt) (hereinafter is referred to as Co—Pt film) is formed on a nonmagnetic substrate 1 of Ni—Ti—Mg. The film 18 is magnetized so as to form the N and S poles in the right and left directions of the figure. Consequently, the Co—Pt film 18 becomes a permanent magnet film 18. Strip-shaped soft magnetic films 44 similar to those of the above-mentioned second embodiment are formed in approximately the same region as the permanent magnet film 18 on the permanent magnet film 18. Subsequently, an insulation film 5 is formed so as to cover the soft magnetic films 44 and the permanent magnet film 18. The conductive nonmagnetic film 7 of meander type is formed on the insulation film 5. An insulation film 8 of about 1 μm thick $SiO_2$ is formed on the conductive nonmagnetic film 7 as a film for protection, thereby the magnetic sensor 9C is configured.

In the magnetic sensor 9C of the present embodiment, as shown in part (b) of FIG. 14, a magnetic flux shown by an arrow 22 indicated by dotted line caused by the permanent magnet film 18 passes through the soft magnetic films 44, and a direct current bias magnetic field is applied to the soft magnetic films 44. Therefore, in the present embodiment, a direct current power source for generating the direct current bias magnetic field is Knot required. When a high frequency current is passed through the conductive nonmagnetic film 7, an alternating current magnetic field is generated as shown by an arrow 15 indicated by dotted line in part (b) of FIG. 14.

Part (a) of FIG. 15 and part (b) of FIG. 15 of a partially enlarged figure are cross-sectional views showing other example of magnetic sensor in the present embodiment. In the figure, the strip-shaped soft magnetic films 44 are formed on the nonmagnetic substrate 1 of Ni—Ti—Mg. Subsequently, the insulation film 5 is formed on the nonmagnetic substrate 1 including the soft magnetic films 44. The conductive nonmagnetic film 7 of meander type is formed on the insulation film 5, and further, a Co—Pt film 19 is formed on the conductive nonmagnetic film 7. The Co—Pt film 19 is magnetized in the longitudinal direction of the soft magnetic films 44 (in the right and left direction in part (b) of FIG. 15) as shown in an enlarged fragmentary sectional view of part (b) of FIG. 15, thereby to make the Co—Pt permanent magnet film 19 having the magnet poles of N and S in the width direction of Co—Pt film 19, namely in the longitudinal direction of the soft magnetic films 44. The direct current bias magnetic field is applied to the soft magnetic films 44 facing to the conductive nonmagnetic film 7 by the magnetic flux 20 from the permanent magnet film 19. In general, a soft magnetic body is decreased in permeability by being applied a direct current magnetic field. In the present embodiment, the direct current bias magnetic field is applied to only the parts of the soft magnetic films 44 facing to the permanent magnet film 19, and is not applied to other major parts. Therefore, the parts of the soft magnetic films 44 in which the permeability lowers are limited, and the soft magnetic films 44 are prevented from the lowering of permeability in all areas. In other words, the major parts of the soft magnetic films 44 maintain original permeability. Consequently, the density of magnetic-flux due to the external magnetic field Hex 16 and passing through the soft magnetic films 44 does not lower much, and an action which the magnetic flux due to the external magnetic field gives to the impedance change of the conductive nonmagnetic film 7 can be utilized to its maximum. Thereby a magnetic sensor having a high sensitivity is obtainable.

<<Fourth Embodiment>>

A magnetic sensor 9D of the fourth embodiment in the present invention is described with reference to FIG. 16.

Part (a) of FIG. 16 and part (b) of FIG. 16 are cross-sectional views of the magnetic sensor 9D of the fourth embodiment in the present invention. The plan view of the magnetic sensor 9D is similar to FIG. 8. FIG. 16 is a cross-sectional view showing the same cross section as the III—III cross section in FIG. 8. In the magnetic sensor 9D of the present embodiment, a conductive film 6 is formed on the protection film 8 of the magnetic sensor 9C shown in part (a) of FIG. 14, and other configuration is the same as the magnetic sensor 9C. In the magnetic sensor 9C, the direct current bias magnetic field is given by the magnetic field of the permanent magnet film 18, but it is difficult to apply an optimum direct current bias magnetic field because of variations in magnetic characteristics of the soft magnetic films 44 or variations of the magnetic force of the permanent, magnet film 18. In the magnetic sensor 9D of part (a) of FIG. 16, a weak direct current bias magnetic field shown by arrow 14 indicated by dotted line is generated by passing minute direct-current through the conductive film 6. The direct current bias magnetic field produced by the direct current is superimposed on the main direct current bias magnetic field produced by the permanent magnet film 18 shown by arrow 22 indicated by dotted line in part (b) of FIG. 16, thereby the magnitude of the direct current bias magnetic field by the permanent magnet film 18 can be finely adjusted. Since the direct current bias magnetic field can be increased or decreased by adjusting the current of the conductive film 6, an, optimum direct current bias magnetic field is easily produced. Consequently, the magnetic sensor having a high sensitivity is obtainable.

<<Fifth Embodiment>>

A magnetic sensor 9E of the fifth embodiment of the present invention is described with reference to FIG. 17 to FIG. 20. FIG. 17 is a plan view of the magnetic sensor of the present embodiment, and FIG. 18 is a plan view in which the conductive film 6 in FIG. 17 is removed and the configurations of the soft magnetic films 44 and the conductive nonmagnetic film 7 are made easier to understand. Part (a) of FIG. 19 is a XIX—XIX cross-sectional view of FIG. 17, and part (b) of FIG. 19 is an enlarged fragmentary cross-sectional view of part (a) of FIG. 19. Referring to FIG. 18 and part (a) of FIG. 19, a plurality of strip-shaped first soft magnetic films 44 are formed in a central region of the nonmagnetic substrate 1 of Ni—Ti—Mg, and the insulation film 5 is formed so as to cover thereon. The conductive nonmagnetic film 7 of meander type is formed on the insulation film 5, and an insulation film 24 of $SiO_2$ is formed on an entire face of the insulation film 5 including the conductive nonmagnetic film 7. Subsequently, a second soft magnetic film 23 of the same shape and the same material as those of the soft magnetic films 44 is formed on the insulation film 24 so as to be located directly above the each soft magnetic film 44. Furthermore, a protection film 8 is formed on an entire face of the insulation film 24 including the soft magnetic film 23, and a conductive film 6 is formed on the protection film 8.

According to the configuration of the present embodiment, since the conductive nonmagnetic film 7 is interposed between two soft magnetic films 23 and 44, a total thickness of the soft magnetic films becomes substantially twice. By this configuration, the magnetic flux due to the high frequency current flowing through the conductive nonmagnetic film 7 passes through the closed loop including the soft magnetic films 23 and 44 as shown by arrow 15 in part (b) of FIG. 19, therefore, the magnetic flux density becomes high.

In the magneto-impedance element, an absolute value of the magneto-impedance increases in proportional to the thickness of the soft magnetic film. On the other hand, when the thickness of the soft magnetic film increases, the sensitivity of the magnetic sensor lowers because of increase of the demagnetization field due to the external magnetic field. However, when the impedance is large, the detected output level which is the product of the impedance and the high frequency carrier current becomes large, and an SN ratio of the detected output becomes high. The magnetic sensor of the present embodiment is suitable for a use which is desirable to obtain a high detected output, even if a detection sensitivity is low.

In the magnetic sensor of the present embodiment, in order to minimize the demagnetization field and maximize the sensitivity, it is desirable that the respective film thicknesses of the soft magnetic films 23 and 44 are 1.5 μm and below, and a total thickness is 3 μm and below.

In part (a) of FIG. 19, when a direct current is passed through the conductive film 6, a magnetic flux of the direct current bias magnetic field shown by arrow 14 is generated. The magnetic fluxes of the direct current bias magnetic field pass through the soft magnetic films 23 and 44 as shown by respective arrows 25 and 26 indicated by dotted lines shown in part (b) of FIG. 19, and apply the direct current bias magnetic field.

Part (a) of FIG. 20 and part (b) of FIG. 20 are cross-sectional views showing structure in the case that the magnetic sensor of other example of the present embodiment is made by using the photolithography method. By using the photolithography method, the insulation films 5 and 24 in part (b) of FIG. 19 can be formed only the circumference of the conductive nonmagnetic film 7 as the insulation films 5A and 24A in part (b) of FIG. 20. By this structure, two soft magnetic films 23 and 44 contact with each other between adjacent conductive nonmagnetic films 7. Consequently, the magnetic flux of the high frequency magnetic field shown by arrow 15 indicated by dotted line generated in the circumference of the conductive nonmagnetic film 7 concentrates in the vicinity of the conductive nonmagnetic film 7, and a mutual action of which-the respective magnetic fields of the adjacent conductive nonmagnetic films 7 affect with each other decreases. By the decrease of the mutual action, the impedance value becomes large. Furthermore, since the interval T of the meander type conductive nonmagnetic film 7 can be reduced, the impedance value can be further increased. Consequently, the impedance change of the conductive nonmagnetic films 7 further increases when the external magnetic field Hex 16 is applied, and the detection sensitivity of the magnetic sensor becomes high.

<<Sixth Embodiment>>

A magnetic sensor 9F of the sixth embodiment in the present invention is described with reference to FIG. 21 to FIG. 23.

FIG. 21 is a plan view of the magnetic sensor 9F of the sixth embodiment in the present invention, and part (a) of FIG. 22 is a XXII—XXII cross-sectional view of FIG. 21. FIG. 21 shows a state in which the protection film 8 of the most upper layer is removed. Part (b) of FIG. 22 is an enlarged fragmentary cross-sectional view of part (a) of FIG. 22. In FIG. 21 and part (a) of FIG. 22, a plurality of strip-shaped first soft magnetic films 44 are formed on the nonmagnetic substrate 1 of Ni—Ti—Mg. A Co—Pt film 18 having width W4 smaller than a side to side width W3 of the soft magnetic films 44 in the, figure is formed on the nonmagnetic substrate 1 including the soft magnetic films 44. The conductive nonmagnetic film 7 of a meander type is formed on the Co—Pt film 18 with an insulation film 5A therebetween. After forming an insulation film 24A around the circumference of the meander-type conductive nonmagnetic film 7, other second soft magnetic films 23 of the same shape and the same material as the soft magnetic films 44 are formed on the surface including the insulation film 24A around the circumference of the conductive nonmagnetic film 7 and the above-mentioned Co—Pt film 18 so as to be located just above the soft magnetic films 44.

Furthermore, the protection film 8 is formed on the entire surface including the soft magnetic films 23. The Co—Pt film 18 is magnetized so that N and S poles are formed in the right and left directions in the figure, and thereby the Co—Pt film 18 is made to be the permanent magnet. The width W4 of the Co—Pt film 18 is made smaller than the width W3 of the soft magnetic films 23 and 44, thereby the soft magnetic films 23 and 44 come into contact with each other at their both ends. Consequently, the magnetic flux generated by the permanent magnet of Co—Pt film 18 passes through the soft magnetic films 23 and 44 as shown by arrows 22 indicated by dotted lines, and the direct current bias magnetic field is applied to both the soft magnetic films 23 and 44.

Part (a) of FIG. 23 is a cross-sectional view showing the same cross section as FIG. 22 showing other configuration example of the present embodiment, and part (b) of FIG. 23 is an enlarged fragmentary cross-sectional view of part (a) of FIG. 23.

In the configuration shown by part (a) of FIG. 23 and part (b) of FIG. 23, a Co—Pt film 19 having width W6 which is slightly wider than the width W5 of the conductive nonmagnetic film 7 is opposed to the conductive nonmagnetic film 7 with the insulation film 5A therebetween. The Co—Pt film 19 having such a shape can be formed by using the photolithography method. The Co—Pt film 19 is magnetized so as to form N and S poles in the right and left directions in the figure, and thereby forming a permanent magnet. As shown in part (b) of FIG. 23, the magnetic fluxes generated by the Co—Pt film 19 of the permanent magnet pass through the soft magnetic films 23 and 44 as shown by arrows 20 indicated by dotted lines, and a local direct current bias magnetic field is applied to the parts of both the soft magnetic films 23 and 44 in the vicinity of the conductive nonmagnetic film 7. If the direct current bias magnetic field is applied to the entire soft magnetic films 23 and 44, the permeabilities of the entire soft magnetic films 23 and 44 have tendencies to lower. According to the configuration shown in FIG. 23, since the direct current bias magnetic field is applied to the soft magnetic films 23 and 44 only in the vicinity of the conductive nonmagnetic film 7, the decrease in the permeability of the soft magnetic films 23 and 44 is limited at a local part and the overall reduction is prevented. As a result, the impedance change of the conductive nonmagnetic film 7 caused by the external magnetic field increases, and a high detection sensitivity is obtainable.

The magnetic field generated by the Co—Pt film 19 is restricted within the magnetic circuit of a closed loop by the soft magnetic films 23 and 44, and the magnetic flux leakage to the outside is reduced. Therefore, magnetic influence which is given to other components in the device provided with this magnetic sensor can be limited to a minimum.

According to the present embodiment, since the direct current magnetic bias is applied by the Co—Pt film 18 or 19 of permanent magnet, there is no need to have a direct current power source for applying the direct current magnetic bias by passing a direct current through the conductive film 6 as the above-mentioned first, second and fifth embodiments. From this point, power consumption is lower in the magnetic sensor of the present embodiment.

<<Seventh Embodiment>>

A magnetic sensor 9G of the seventh embodiment of the present invention is described with reference to FIG. 24 and FIG. 25.

FIG. 24 is a plan view of the magnetic sensor 9G of the seventh embodiment in the present invention. Part (a) of FIG. 25 is a XXV—XXV cross-sectional view of FIG. 24, and part (b) of FIG. 25 is an enlarged fragmentary cross-sectional view of part (a) of FIG. 25. In part (b) of FIG. 25, the conductive film 6 is formed on the nonmagnetic substrate 1 of Ni—Ti—Mg, and the magnetic films 44 and 23, the conductive nonmagnetic film 7, the Co—Pt film 19 and the protection film 8 which are the same as the respective components shown in part (b) of FIG. 23 of the above-mentioned sixth embodiment are formed on the conductive film 6. In the magnetic sensor 9G of the present embodiment, a main direct current bias magnetic field is given by the Co—Pt film 19 of permanent magnet. In the case that the magnitude of the direct current bias magnetic field caused by the Co—Pt film 19 is not an optimum value, the direct current bias magnetic field is finely adjusted by passing a direct current through the conductive film 6. The direct current flowing through the conductive film 6 is a minute current; the power consumption, therefore, is relatively low.

When the magnitude of the direct current bias magnetic field caused by the permanent magnet of the Co—Pt film 19 is larger than the optimum value, the direction of the direct current flowing through the conductive film 6 is given so as to cancel the magnetic field caused by the permanent magnet. On the contrary, when the magnitude of the direct current bias magnetic field caused by the permanent magnet is smaller than the optimum value, the direction of the direct current of the above-mentioned conductive film 6 is reversed so that the direct current bias magnetic field is added to the magnetic field of the permanent magnet. In this manner, by selecting the direction and the current value of the direct current of the conductive film 6, the optimum direct current bias magnetic field can be generated. Since the conductive film 6 is formed on a flat surface of the nonmagnetic substrate 1, the surface of the conductive film 6 also becomes flat. Therefore, there is no particular problem about the flatness of the respective components formed on the conductive film 6 in the subsequent process. Accordingly, the magnetic sensor with high sensitivity and capable of carrying out a stable measurement can be easily obtained.

<<Eighth Embodiment>>

A magnetic sensor 9H of the eighth embodiment in the present invention is described with reference to FIG. 26 to FIG. 32.

FIG. 26 is a plan view of the magnetic sensor 9H of the eighth embodiment in the present invention, and FIG. 27 is a plan view showing only a soft magnetic film 29 in FIG. 26. The soft magnetic film 29 has a plurality of parallel and narrow slits 32. Strip-shaped soft magnetic films 53 interposed between adjacent two slits 32 and strip-shaped soft magnetic films 54 at upper end and lower end are formed by providing a plurality of slits 32 on the plate-shaped soft magnetic film 29. The strip-shaped soft magnetic films 53 and 54 correspond to the soft magnetic films 23 or 44 in the above-mentioned second embodiment to seventh embodiment. The easy axis of magnetization of the soft magnetic film 29 is oriented to the direction shown by arrow 80 which is perpendicular to the longitudinal direction of the slit 32 and is along with the film face.

Problems of the soft magnetic films 23 and 44 which are provided on the magnetic sensor of the above-mentioned second embodiment to seventh embodiment are described below.

The inventors found that, when a plurality of strip-shaped soft magnetic films 44, 23 shown in FIG. 24 are placed in the external magnetic field, for example, the magnetic flux caused by the external magnetic field concentrates on outer soft magnetic films 44 shown by arrow 44A (hereinafter is referred to as soft magnetic film 44A), and the magnetic flux density of the soft magnetic films 44A becomes higher than the magnetic flux density of the inner soft magnetic films 44.

FIG. 28 shows an example of five strip-shaped soft magnetic films 33 to 37 which are parallel arranged for describing the concentration of the flux. Referring to the figure, when the soft magnetic films 33 to 37 are placed in the external magnetic field Hex 16, magnetic fluxes 31 in the range of a width G of the soft magnetic films 33 to 37 perpendicular to the direction of the external magnetic field Hex 16 straightly enter at the left ends the soft magnetic films 33 to 37, and go out from the right ends. Magnetic fluxes 28 and 30 which are out of the width G in the external magnetic field Hex 16 are attracted by the soft magnetic films 33 and 37 having a high-permeability, and enter the left ends of the soft magnetic films 33 and 37, and go out from the right ends. Therefore, the magnetic flux densities of the soft magnetic films 33 and 37 become larger than the magnetic flux densities of the soft magnetic films 34 to 36 by the external magnetic field Hex 16.

FIG. 29 is a graph showing the relation between the external magnetic field Hex 16 and a magnetic flux density B passing through the soft magnetic films 33 to 37. The magnetic flux density is a measurement value at a center part shown by a dash-dot line C of each of the soft magnetic films 33 to 37. In the figure, a curve 45 shows the magnetic flux density of the soft magnetic films 33 and 37. A curve 47 shows the magnetic flux density of the soft magnetic films 34 to 36. A curve 46 shows an average magnetic flux density of the soft magnetic films 33 to 37. In the change of the magnetic flux density in increase of the external magnetic field Hex from zero, the curve 45 rises more steeply than the curve 47 does. Consequently, as shown in FIG. 28, it is proved that the magnetic fluxes 28 and 30 enter the soft magnetic films 33 and 37. FIG. 30 is a graph showing the characteristics of impedance of the soft magnetic film having a magnetic flux density characteristic shown by the curves 45, 46 and 47 in FIG. 29. In FIG. 30, a curve 48 shows the change of impedance Z of the conductive nonmagnetic film 7 due to the magnetic flux passing through the outer soft magnetic films 33 and 37 in FIG. 28. A curve 49 shows the change of impedance Z of the conductive nonmagnetic film 7 due to the magnetic flux passing through the inner soft magnetic films 34 to 36. A curve 50 shows the change of impedance Z of the conductive nonmagnetic film 7 due to the magnetic flux averaging the magnetic flux densities of the soft magnetic films 33 to 37. As is realized from FIG. 30, concerning the soft magnetic film which is a main element of the magnetic sensor, as shown in FIG. 29, even if the magnetic flux densities of the outer soft magnetic films 33 and 37 are high, when the magnetic flux densities of a lot of inner soft magnetic films 34 to 36 are low, improvement of the characteristics of the magnetic sensor is not realized. In order to improve the characteristics of the magnetic sensor, it is desirable that the curve 46 showing the average magnetic flux density in FIG. 29 is steep. For this purposes, it is required to uniform the magnetic flux densities of all of the soft magnetic films 33 to 37 shown in FIG. 28.

FIG. 31 is a plan view of a soft magnetic film 29A of which the soft magnetic films 33 to 37 shown in FIG. 28 are connected by soft magnetic films 51A at right and left ends. By providing the soft magnetic films 51A at both end parts, the magnetic fluxes 28 and 30 which are out of the range of the width G enter each the soft magnetic films 33 to 37 through the soft magnetic films 51A. The inventors found that the magnetic flux densities of each of the soft magnetic films 33 to 37 become relatively uniform as a result of the above.

Concerning the soft magnetic film 29 shown in FIG. 27 which is provided in the magnetic sensor of the present embodiment, measurement is carried out as to the densities of the magnetic fluxes passing through the strip-shaped soft magnetic films 53 and 54 due to the external magnetic field Hex. A side-to side length LA of the soft magnetic film 29 is 1 mm. The width W8 of the slit 32 is 10 µm, and the widths W9 of the strip-shaped soft magnetic films 53 and 54 are 40 µm. In the case that a distance S from the right and left ends of the soft magnetic film 29 to the ends of the slit 32 is set to 25 µm, 50 µm, 100 µm and 200 µm, the densities of the magnetic fluxes passing through each of the strip-shaped soft magnetic films 53 and 54 are measured at the center part shown by a dash-dot line C, and the result is shown in FIG. 32. In FIG. 32, the ordinate designates magnetic flux density B. The abscissa designates the number of strip-shaped soft magnetic films 53 and 54 allotted in the order from the lower one to the upper one. Numeral "1" shows the lowest strip-shaped soft magnetic film 54. Numeral "2" shows the second strip-shaped soft magnetic film 53 from the bottom. Numeral "10" shows the uppermost strip-shaped soft magnetic film 54. Hereafter, the strip-shaped soft magnetic films from the numeral "1" to "10" are called as the strip-shaped soft magnetic films of number 1 to number 10, respectively.

In FIG. 32, a curve 61 shows a magnetic flux density distribution when S is zero, in other words, the soft magnetic films 51 are not disposed at the ends. According to the curve 61, the magnetic flux densities of the strip-shaped soft magnetic films 54 of number 1 and number 10 are extremely large such as 4.0, and the magnetic flux densities of the strip-shaped soft magnetic films 53 from number 3 to number 8 are low such as about 1.0. A curve 62 shows a magnetic flux density distribution when S is 25 µm. In this case, the magnetic flux densities of the strip-shaped soft magnetic films 54 of number 1 and number 10 lower to 2.5, and the magnetic flux densities of the strip-shaped soft magnetic films 53 of number 3 to number 8 rise to about 1.4. A curve 64 shows a measurement result similar to the above when S is 100 µm, and the magnetic flux densities of the strip-shaped soft magnetic films 54 of number 1 and number 10 further lower, on the other hand, the magnetic flux densities of the strip-shaped soft magnetic films 55 of number 3 to number 8 further rise. By the above-mentioned measurement result, it is found that the magnetic flux density distribution of the soft magnetic films 53 and 54 can be made fairly uniform by setting S from 100 to 200 µm.

According to the present embodiment, the densities of the magnetic flux passing through the strip-shaped soft magnetic films 53 and 54 due to the external magnetic field Hex can be made approximately uniform. As a result, the impedance change, of the conductive nonmagnetic film 7 with respect to the external magnetic field Hex becomes large, and the detection sensitivity of magnetism is improved. The sensitivity of the magnetic sensor in each embodiment can be further improved by using the soft magnetic film 29 of the structure shown in FIG. 27 instead of the soft magnetic films 23 and 44 in the above-mentioned second to seventh embodiments.

In each embodiment mentioned above, the material of the nonmagnetic substrate 1 is preferably a ceramic of the group of Ni—Ti—Mg, but a material of group of nonmagnetic ferrite such as NiZn, a nonmagnetic material such as glass or various ceramic may be used.

The material of the soft magnetic films 4, 44 and 29 is preferably FeTaN, but an alloy such as NiFe, FeCo and FeN may be used. The soft magnetic film is preferably soft magnetic material having a high permeability such as an amorphous alloy (an alloy including Co as a main component, for example, CoNbZr, CoTaZr, CoSiB, an alloy including Fe as a main component such as a FeSiB) or a nannocrystal alloy (such as FeTaN including Fe as a main component) and an alloy of the group of NiFe. The material of the insulation film 5 is preferably $SiO_2$, but inorganic material such as alumina, glass, or organic insulation film such as polyimide resin may be used. NiZn ferrite magnetic film may be used for the insulation film 21 instead of $SiO_2$ in the second embodiment. For the material of a permanent magnet, a film of Co—Pt is suitable, but permanent magnet materials such as the group of ferrite, the group of Nb, and the group of Co may be used. For the material of the conductive nonmagnetic film, copper is suitable, but conductive metals such as Au, Ag and Cr may be used. The permanent magnet for applying the direct current bias magnetic field is not limited to be placed at the positions shown in the above-mentioned embodiments, but it may be placed at any position at which the direct current magnetic field can be applied to the soft magnetic film. For the material of the protection layer 8, $SiO_2$ is suitable, but alumina or some other inorganic materials or ceramics may be used. The thickness of the protection layer was 1 µm, but it is desirable that its thickness is made thin to about 0.1 µm in order to reduce power consumption of the direct current power source for applying the direct current magnetic bias.

<<Ninth Embodiment>>

A magnetic sensor 9I of the ninth embodiment in the present invention is described with reference to FIG. 33 and FIG. 34. FIG. 33 is a perspective view of the magnetic sensor 9I of the ninth embodiment, and FIG. 34 is a plan view thereof. As shown in FIG. 33 and FIG. 34, a first soft magnetic film 73 of a strip-shaped film which is preferably Fe—Ta—N is formed on the face of a nonmagnetic substrate 1 which is preferably Ni—Ti—Mg. In FIG. 33, two soft magnetic films 73 are provided in parallel with predetermined intervals, but the number of the soft magnetic film 73 is not limited to two, and may be set to an arbitrary number.

An insulation layer 75 of $SiO_2$ is provided on a part of the soft magnetic film 73. In FIG. 33, two insulation layers 75 are provided on one soft magnetic film 73, the number of the insulation layer 75 is not limited to two, and may be set to an arbitrary number. In the figure, a conductive film 76A and a conductive nonmagnetic film 77A which are separated from each other in upper and lower directions are provided so as to pass through an insulation layer 75 of front side. Preferably, the conductive nonmagnetic films 76A and 77A are made of copper (Cu). Moreover, a conductive film 76B and a conductive nonmagnetic film 77B which are separated from each other are provided so as to pass through an insulation layer 75 of back side. A second soft magnetic film 74 which is preferably a film of Fe—Ta—N is provided on the insulation layer 75 and the soft magnetic film 73 having no insulation film thereon. A closed magnetic path M is formed with the soft magnetic films 73 and 74. In the case that the soft magnetic films 73 and 74 have a magnetic anisotropy, it is preferable that the respective easy axes of magnetization are in the direction perpendicular to the longitudinal direction of the soft magnetic films 73 and 74 and along with the film face. The left ends of the conductive nonmagnetic films 77A and 77B in the figure are connected with each other by a connection conductor 78. The right end of the conductive nonmagnetic film 77A is connected to a terminal 81A through a connection conductor 79A. The right end of the conductive nonmagnetic film 77B is connected to a terminal 81B through a connection conductor 79B. With this configuration, the conductive nonmagnetic films 77A and 77B of meander type are formed.

The right end of the conductive film 76A is connected to a terminal 84A through a connection conductor 83A. The left end of the conductive film 76A is connected to the right end of the conductive film 76B through the connection conductor 83B. The left end of the conductive film 76B is connected to a terminal 84B through a connection conductor 86. In the above-mentioned configuration, the conductive films 76A and 76B, as well as the conductive nonmagnetic films 77A and 77B are included in the closed magnetic path which are formed of the soft magnetic film 73 and the soft magnetic film 74, and the connection conductors 83A and 83B are outside of the closed magnetic path.

In FIG. 33, the conductive nonmagnetic films 76A, 76B, 77A, 77B and the connection conductors 83A and 83B appear to float above the nonmagnetic substrate 1, but in the actual configuration, insulation layers omitted in drawing are provided between each of the conductive nonmagnetic films and each of the connection conductors.

Operation of the magnetic sensor 9I of the present embodiment is described below. As shown in FIG. 34, a direct current power source 10 is connected across the terminals 84A and 84B, and a direct current is passed through the conductive nonmagnetic films 76A and 76B in the direction shown by arrow 88. By this direct current, a direct current bias magnetic field is applied to the soft magnetic films 73 and 74. A high frequency power source 11 of a constant current is connected across the terminals 81A and 81B through a resistor 12, and a high frequency current of 10 MHz for example is passed. A high frequency amplifier 13 is also connected across the terminals 81A and 81B.

When the magnetic sensor 9I of the present embodiment is placed in the external magnetic field Hex 16 of such as geomagnetism, the impedances of the conductive nonmagnetic films 77A and 77B vary due to the magneto-impedance effect. The variation of the high frequency voltage generated across the terminals 81A and 81B due to this impedance variation is detected by amplifying and detecting by the high-frequency amplifier 13, thereby an extremely small external magnetic field Hex 16 of the order of 0.3 Oe (24 A/m) can be detected.

In the magnetic sensor 9I of the present embodiment, since the conductive films 76A and 76B for applying the direct current bias magnetic field are provided in the closed magnetic path M which are formed by the soft magnetic films 73 and 74, a sufficiently large direct current bias magnetic field can be generated by passing a relatively small direct current. Although it is required to pass a direct current of 30 mA or more through the conductive film 6 in the magnetic sensors 9–9H in the above-mentioned embodiments, a sufficient direct current bias magnetic field can be obtained by passing a current of 10–20 mA through the conductive nonmagnetic films 76A and 76B in the magnetic sensor 9I of the present embodiment.

In order to prove this matter, inventors performed an experiment which is described below with reference to FIG. 41.

Part (a) and part (b) of FIG. 41 are cross-sectional views of a magnetic sensor which is made for the experiment. In part (a) of FIG. 41, a conductive body 98 is formed between soft magnetic-bodies 96 and 97 at a center part with an insulation film therebetween. A direct current is passed through the conductive body 98 in the direction perpendicular to the paper face as shown by a dot in a circle and a cross in a circle, and a magnetic field is generated, and a magnetic flux density is measured at a position A1 of the lower yoke 96. In part (b) of FIG. 41, conductive bodies 99A and 99B are placed at center upper and lower parts of the magnetic sensor having the same configuration as that of part (a) of FIG. 41. A direct current is passed-through the conductive bodies 99A and 99B in the directions which are perpendicular to the paper face and are inverse with each other. The direct current is not passed through the conductive body 98. In a manner similar to part (a) of FIG. 41, a magnetic flux density at a position A2 of the lower yoke 96 in part (b) of FIG. 41 is measured. When the same value of direct current is passed through the conductive body 98 in part (a) of FIG. 41 and the conductive bodies 99A and 99B in part (b) of FIG. 41, the magnetic flux density at the position A1 in part (a) of FIG. 41 is about 80 times the magnetic flux density at the position A2 in part (b) of FIG. 41.

From the above-mentioned experimental result, in the case that the conductive body 93 which passes the direct current is placed in the closed magnetic path which is formed by the lower yoke 96 and the upper yoke 97 as shown in part (a) of FIG. 41, a large direct current bias magnetic field can be obtained by a smaller direct current in comparison with the case that the conductive bodies 99A and 99B are placed outside of the closed magnetic path as shown in part (b) of FIG. 41.

The fabrication method of the magnetic sensor 9I of the ninth embodiment is described with reference to FIG. 35 and FIG. 36. Part (d) of FIG. 35 is a cross-sectional view taken along the line XXXV—XXXV in FIG. 34, and part (a)-part (c) are cross-sectional views in each process to part (d) of the same-figure. Part (d) of FIG. 36 is a cross-sectional view taken along the line XXXVI—XXXVI in FIG. 34, and part (a)-part (c) are cross-sectional views in each process to part (d) of the same figure. Part (a) through part (d) of FIG. 36 are cross-sectional views in the same processes as the processes which are shown in part (a) through part (d) of FIG. 35, respectively. In other words, part (a) of FIG. 35 and part (a) of FIG. 36 are cross-sectional views at different places in the same process, and part (b)-part (d) of FIG. 35 and part (b)-part (d) of FIG. 36 are made likewise. In FIG. 35 and FIG. 36, in order to enhance ease of understanding of the figures, hatchings are applied only a part of cross sections.

In part (a) of FIG. 35, a strip-shaped first soft magnetic film 73 of 1.0 μm thick is formed on an upper face of the nonmagnetic substrate 1 of a ceramic of the group of Ni—Ti—Mg by sputtering of Fe—Ta—N, and subsequently is formed in a pattern having a predetermined shape. The first soft magnetic film 73 may be formed on the surface of the substrate 1 with an insulation material therebetween. Subsequently, an insulation film 91 is formed on an entire face of the substrate 1 including the soft magnetic film 73 by sputtering of $SiO_2$ (Low temperature magnetron sputtering is preferable.) or vapor deposition.

The cross section taken along the line XXXVI—XXXVI after completion of the process in part (a) of FIG. 35 is shown in part (a) of FIG. 36. As shown in part (a) of FIG. 36, two soft magnetic films 73 are provided in parallel to each other on the face of the substrate 1 and are covered with the insulation film 91.

In part (b) of FIG. 35, conductive films 76A and 76B of 1.0 μm thick are formed by sputtering of copper (Cu) on the insulation film 91, and subsequently are formed in a pattern having a predetermined shape. After an insulation film 92 is formed on an entire face of the substrate 1 including the conductive films 76A and 76B, conductive nonmagnetic films 77A and 77B are formed respectively on the positions overlapping the above-mentioned conductive films 76A and 76B on the insulation film 92.

In this process, as shown in part (b) of FIG. 36, connection parts 89B and 89C are formed on the insulation film 91, and a connection conductor 78 is formed on the insulation film 92. Where, the conductive films 76A and 76B and the connection parts 89B and 89C may be formed in the same process with the same material. Furthermore, the conductive nonmagnetic films 77A and 77B and the connection conductor 78 may be formed in the same process with the same material.

In part (c) of FIG. 35, an insulation film 93 is formed on the conductive nonmagnetic films 77A and 77B. Subsequently, the insulation films 91 and 92 placed on the soft magnetic film 73 are removed so that the insulation films 91 and 92 placed on the conductive nonmagnetic films 77A and 77B and adjacent thereto remain. Then, a second soft magnetic film 74 is formed on the soft magnetic film 73 including the insulation film 93.

A cross-section taken along the line XXXVI—XXXVI after completion of this process is shown in part (c) of FIG. 36. As shown in part (c) of FIG. 36, the first soft magnetic film 73 contacts the second soft magnetic film 74. In part (d) of FIG. 35, an insulation film 94 is formed on an entire face including the second soft magnetic film 74. Subsequently, as shown in part (d) of FIG. 36, the insulation films 92, 93, 94 placed on the connection parts 89B and 89C are removed by etching and through holes are formed, and the connection parts 89B and 89C are exposed. Then, connection conductor 83B connected to the connection parts 89B and 89C at the respective ends is formed on the insulation film 94. The connection parts 89B and 89C are electrically connected by the connection conductor 83B. A connection part 89 between the conductive film 76A and the connection conductor 83A and a connection part 89A between the connection conductor 83A and the terminal 84A are connected in a similar manner mentioned above.

<<Tenth Embodiment>>

A magnetic sensor 9J of the tenth embodiment of the present invention is described with reference to FIG. 37 and FIG. 38. FIG. 37 is a perspective view of a relevant part of the magnetic sensor 9J of the tenth embodiment. FIG. 38 is a plan view of the magnetic sensor 9J of the present embodiment.

Referring to FIG. 37, in the magnetic sensor 9J of the present embodiment, the conductive film 76A and the conductive nonmagnetic film 77A which penetrate through the insulation film 75 provided between the soft magnetic films 73 and 74 are placed substantially on the same plane so as to be separated from each other. In a similar manner, the conductive film 76B and the conductive nonmagnetic film 77B are placed substantially on the same plane so as to penetrate through the insulation layer 75. The remaining configurations are the same as those of the magnetic sensor 9I of the above-mentioned ninth embodiment. As shown in FIG. 36, the method of connecting the direct current source 10, the high frequency source 11 and the high frequency amplifier 13 which are connected during operation of the magnetic sensor 9J is similar to the case of the magnetic sensor 9I and the operation is also similar.

According to the present embodiment, since the conductive film 76A, the conductive nonmagnetic film 77A are provided substantially on the same plane in the insulation layer 75, the height of a top part 74B of the soft magnetic film 74 from the face of the substrate 1 becomes lower than the magnetic sensor 9I of the above-mentioned ninth embodiment. Furthermore, apart from the magnetic sensor 9I of the ninth embodiment wherein the conductive film 76A and the conductive nonmagnetic film 77A must be formed in layers through separate processes, in the case of magnetic sensor 9J of the tenth embodiment, the conductive film 76A and the conductive nonmagnetic film 77A can be formed in one same process and with the same material, such as the nonconductive nonmagnetic film. Therefore, the fabrication process becomes simple, and the fabrication cost is also reduced. Furthermore, in the case that the conductive film 76A and the conductive nonmagnetic film 77A are layered as the magnetic sensor 9I of the ninth embodiment, there is a possibility that a shortcircuiting may occur due to dust or the like entering between them in the fabrication processes; however, in the magnetic sensor 9J of the tenth embodiment, the fear of the shortcircuiting is greatly reduced. As a result, a yield rate in the fabrication is improved, and yields are improved.

Fabrication method of the magnetic sensor 9J of the tenth embodiment is described with reference to FIG. 39 and FIG. 40. Part (d) of FIG. 39 is a cross-sectional view taken along the line XXXIX—XXXIX in FIG. 38, and part (b) through part (d) are cross-sectional views in the respective processes. Part (d) of FIG. 40 is a cross-sectional view taken along the line XXXX—XXXX in FIG. 38, and part (b) through part (d) are cross-sectional views in the respective processes. Parts (a) through (d) of FIG. 40 are cross-sectional views in the same processes as the respective processes shown by parts (a) through (d) of FIG. 39. In other words, part (a) of FIG. 39 and part (a) of FIG. 40 are cross-sectional views at different parts in the same process, and parts (b) through (d) of FIG. 39 and parts (b) through (d) of FIG. 40 are shown in a similar manner. In FIG. 39 and FIG. 40, cross sections are only partially hatched for making the figures easy to see.

In part (a) of FIG. 39, the soft magnetic film 73 of 1.0 μm thick which forms a lower yoke is formed on the face-of the nonmagnetic substrate 1 such as a ceramic of Ni—Ti—Mg group by a sputtering of Fe—Ta—N, and then carried out a pattern formation into a predetermined shape. Subsequently, the insulation film 91 is formed on an entire face of the substrate 1 including the soft magnetic film 73 by a sputtering of $SiO_2$. The cross section taken along the line XXXX—XXXX after the completion of this process is shown in part (a) of FIG. 40.

In part (b) of FIG. 39, conductive nonmagnetic films 76A, 77A, 76B and 77B are formed by a-sputtering of Cu on the insulation film 91, and then carried out a pattern formation into a predetermined shape. Moreover, as shown in part (b) of FIG. 40, connection conductors 78 and 89C are formed on the insulation film 91. The conductive nonmagnetic films 76A, 77A, 76B, 77B and the connection conductors 78, 89C may be formed in the same process with the same material, and on the entire face of the substrate 1 including these, the insulation film 92 of $SiO_2$ is formed. A cross section taken along the line XXXX—XXXX after the completion of this process is shown in part (b) of FIG. 40.

In part (c) of FIG. 39, the insulation films 91 and 92 on the soft magnetic film 73 are removed except for the vicinity of the conductive nonmagnetic films 76A, 77A, 76B and 77B, and the soft magnetic film 73 is exposed. A soft magnetic film 74 is formed on the insulation film 92 remaining on the conductive nonmagnetic films 76A, 77A, 76B and 77B and on the exposed soft magnetic film 73 by a sputtering of Fe—Ta—N, and then a pattern of a predetermined shape is formed. The cross section taken along the XXXX—XXXX line after the completion of this process is shown in part (c) of FIG. 40.

In part (d) of FIG. 39, the insulation film 93 of $SiO_2$ is formed on an entire face including the soft magnetic film 74 on the substrate 1. Subsequently, the insulation film 92 on the connection conductor 89C is removed and through holes are formed. The connection conductors 83A and 83B are formed on the insulation film 93. By this process, as shown in part (d) of FIG. 40, the conductive nonmagnetic film 76B and the connection conductor 83B are electrically connected at the connection part 89C. Connections at the connection parts 83C, 83D and 84D are carried out by the same process as the connection part 89C. The magnetic sensor 9J of the present embodiment is fabricated by the above-mentioned processes.

In the above-mentioned ninth and tenth embodiments, a ceramic (Ni—Ti—Mg) containing nickel oxide NiO, titanium oxide $TiO_2$ and magnesium oxide MgO, a ceramic (Ti—Ca) containing titanium oxide and calcium oxide CaO, and a ceramic (AlTiC) containing aluminum oxide $Al_2O_3$ and titanium carbide TiC, glass, silicon or the like can be used for the nonmagnetic substrate 1. The roughness of the surface of the nonmagnetic substrate is preferably Ra5 nm or below in order to keep a large coercive force Hc.

The soft magnetic films 73, 74 are preferably a soft magnetic material having a high permeability such as an amorphous alloy (an alloy containing Co as a main component, for example CoNbZr, CoTaZr, CoSiB, or an alloy containing Fe as a main component, for example FeSiB or the like), or a nanno-crystal alloy (FeTaN or the like containing Fe as a main component) and such as an alloy of the group of NiFe.

It is preferable to achieve 1000 or more of permeability at 10–20 MHz of frequency.

The insulation films 91–94 are preferred to be an oxide such as $SiO_2$, $Al_2O_3$, or an organic insulation film such as a polyimide resin.

Gold (Au), silver (Ag), copper (Cu) or the like are usable for the conductive nonmagnetic films and the connection wires. It is preferable to form a thin film of 30 nm–100 nm thick of Cr, Ta or Ti to improve adherence between the film of Au, Ag, Cu or the like and the insulation film.

Industrial Applicability

As described in detail in the above-mentioned embodiments, in the magnetic sensors of the present invention, a soft magnetic film having an easy axis of magnetization in a predetermined direction is opposed to a zigzag conductive nonmagnetic film of meander type with an insulation film therebetween, and moreover, a conductive film is provided on the conductive nonmagnetic film with an insulation film therebetween. A high frequency current is passed through the conductive nonmagnetic film of meander type, and a direct current bias magnetic field is applied. When an external magnetic field is applied to the magnetic sensor, a conductor having a long path of the conductive nonmagnetic film of meander type parallel to the easy axis of magnetization receives a magnetic action of the soft magnetic film, and even in the case that a high frequency current of a relatively low frequency is passed, an impedance greatly changes. The external magnetic field can be detected with a high sensitivity by detecting the impedance change.

The invention claimed is:

1. A magnetic sensor comprising:
    a first strip-shaped soft magnetic film formed on a nonmagnetic substrate;
    an insulation layer formed on a part of said first strip-shaped soft magnetic film;
    a second strip-shaped soft magnetic film for forming a closed magnetic path together with said first strip-shaped soft magnetic film, said second strip-shaped soft magnetic film being formed on said insulation layer and said first strip-shaped soft magnetic film;
    a conductive film formed to pass through the closed magnetic path so as to be electrically insulated from said first and second strip-shaped soft magnetic films;
    a conductive nonmagnetic film formed to pass through the closed magnetic path so as to be electrically insulated from said first and second strip-shaped soft magnetic films and said conductive film;
    a direct current power source for applying a direct current to said conductive film so as to apply a direct current bias magnetic field to the closed magnetic path; and
    a high frequency power source for applying a high frequency current to said conductive nonmagnetic film.

2. A magnetic sensor in accordance with claim 1, further comprising at least one second insulation layer formed between said first and second strip-shaped soft magnetic films,
    wherein said conductive film is formed to pass through a second closed magnetic path formed around said second insulation layer by said first and second strip-shaped soft magnetic films, so that said conductive film is electrically insulated from said first and second strip-shaped soft magnetic films, and so that a second direct current bias magnetic field is applied to the second closed magnetic path by the direct current in a direction parallel to the direct current bias magnetic field applied to the closed magnetic path.

3. A magnetic sensor in accordance with claim 2, wherein said conductive nonmagnetic film is formed to pass through the second closed magnetic path, so that said conductive nonmagnetic film is electrically insulated from said first and second strip-shaped soft magnetic films and said conductive film, and so that a longitudinal direction of said conductive nonmagnetic film passing through the closed magnetic path is opposite to that of said conductive nonmagnetic film passing through the second closed magnetic path.

4. A magnetic sensor in accordance with claim 1, wherein said conductive film and said conductive nonmagnetic film are formed so as to be parallel to said nonmagnetic substrate, respectively.

5. A magnetic sensor in accordance with claim 1, further comprising:
    a third strip-shaped soft magnetic film formed on said nonmagnetic substrate so that a longitudinal direction of said third strip-shaped soft magnetic film is parallel to that of said first strip-shaped soft magnetic film;
    a third insulation layer formed on a part of said third strip-shaped soft magnetic film; and
    a fourth strip-shaped soft magnetic film for forming a third closed magnetic path together with said third strip-shaped soft magnetic film, said fourth strip-shaped soft magnetic film being formed on said third insulation layer and said third strip-shaped soft magnetic film, wherein said conductive film is formed to pass through the third closed magnetic path formed around said third insulation layer by said third and fourth strip-shaped soft magnetic films, so that said conductive film is electrically insulated from said third and fourth strip-shaped soft magnetic films, and so that a third direct current bias magnetic field is applied to the third closed magnetic path by the direct current in a direction parallel to the direct current bias magnetic field applied to the closed magnetic path, and wherein said conductive nonmagnetic film is formed to pass through the third closed magnetic path, so that said conductive nonmagnetic film is electrically insulated from said third and fourth strip-shaped soft magnetic films and said conductive film, and so that a longitudinal direction of said conductive nonmagnetic film passing through the closed magnetic path is parallel to that of said conductive nonmagnetic film passing through the third closed magnetic path.

6. A magnetic sensor in accordance with claim 1, further comprising a high frequency amplifier for detecting and amplifying a voltage across both ends of said conductive nonmagnetic film to output a detected signal.

* * * * *